(12) United States Patent
Myers et al.

(10) Patent No.: US 8,320,430 B2
(45) Date of Patent: *Nov. 27, 2012

(54) HANDOVER PROCESSING IN MULTIPLE ACCESS POINT DEPLOYMENT SYSTEM

(75) Inventors: Theodore J. Myers, La Jolla, CA (US); Kenneth C. Sinsuan, San Diego, CA (US); Daniel Thomas Werner, San Diego, CA (US)

(73) Assignee: On-Ramp Wireless, Inc., San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/354,846

(22) Filed: Jan. 20, 2012

(65) Prior Publication Data

US 2012/0113858 A1    May 10, 2012

Related U.S. Application Data

(63) Continuation of application No. 12/770,630, filed on Apr. 29, 2010, which is a continuation-in-part of application No. 12/189,619, filed on Aug. 11, 2008, now Pat. No. 7,782,926.

(60) Provisional application No. 61/037,522, filed on Mar. 18, 2008.

(51) Int. Cl.
*H04B 1/707* (2011.01)
(52) U.S. Cl. ........................................ 375/150
(58) Field of Classification Search .................. 375/130, 375/140, 147, 150, 295
See application file for complete search history.

(56) References Cited

U.S. PATENT DOCUMENTS

| | | |
|---|---|---|
| 5,161,153 A | 11/1992 | Westmore |
| 5,235,612 A | 8/1993 | Stilwell et al. |
| 5,297,162 A | 3/1994 | Lee et al. |
| 5,353,300 A | 10/1994 | Lee et al. |
| 5,392,287 A | 2/1995 | Tiedemann et al. |
| 5,404,375 A | 4/1995 | Kroeger et al. |
| 5,442,627 A | 8/1995 | Viterbi et al. |
| 5,537,397 A | 7/1996 | Abramson |
| 5,596,330 A | 1/1997 | Yokev et al. |
| 5,604,732 A | 2/1997 | Kim et al. |
| 5,649,296 A | 7/1997 | MacLellan et al. |
| 5,691,974 A | 11/1997 | Zehavi et al. |

(Continued)

FOREIGN PATENT DOCUMENTS

CN    2847709    12/2006

(Continued)

OTHER PUBLICATIONS

Andrew Richardson, WCDMA Design Handbook, pp. 268 & 277(Cambridge University Press 2005), retrieved from URLs: http://bit.ly/buMIW0; http://bit.ly/9QcaED.

(Continued)

*Primary Examiner* — Kevin M Burd
(74) *Attorney, Agent, or Firm* — Foley & Lardner LLP

(57) ABSTRACT

This disclosure relates to method, device and system for determining transmit power in a communication system. A node receives an access point interference signal from an access point. The access point interference signal is measured by the access point based in part on an inference from an external system. The node determines a transmit power based in part on the access point interference signal. The node then transmits an uplink signal at the transmit power.

20 Claims, 39 Drawing Sheets

U.S. PATENT DOCUMENTS

| | | |
|---|---|---|
| 5,745,485 A | 4/1998 | Abramson |
| 5,822,359 A | 10/1998 | Bruckert et al. |
| 5,835,489 A | 11/1998 | Moriya et al. |
| 5,894,473 A | 4/1999 | Dent |
| 5,940,771 A | 8/1999 | Gollnick et al. |
| 5,944,842 A | 8/1999 | Propp et al. |
| 5,960,028 A | 9/1999 | Okamoto et al. |
| 5,978,413 A | 11/1999 | Bender |
| 5,983,113 A | 11/1999 | Asanuma |
| 5,991,279 A | 11/1999 | Haugli et al. |
| 6,011,974 A | 1/2000 | Cedervall et al. |
| 6,016,312 A | 1/2000 | Storm et al. |
| 6,052,582 A | 4/2000 | Blasing et al. |
| 6,069,915 A | 5/2000 | Hulbert |
| 6,091,759 A | 7/2000 | Rotstein et al. |
| 6,108,364 A | 8/2000 | Weaver, Jr. et al. |
| 6,115,411 A | 9/2000 | Van Driest |
| 6,148,020 A | 11/2000 | Emi |
| 6,160,798 A | 12/2000 | Reed et al. |
| 6,212,398 B1 | 4/2001 | Roberts et al. |
| 6,226,282 B1 | 5/2001 | Chung |
| 6,236,860 B1 | 5/2001 | Hagting et al. |
| 6,259,927 B1 | 7/2001 | Butovitsch et al. |
| 6,437,743 B1 | 8/2002 | Mintz et al. |
| 6,459,402 B1 | 10/2002 | Tsunehara et al. |
| 6,480,522 B1 | 11/2002 | Hoole et al. |
| 6,493,376 B1 | 12/2002 | Harms et al. |
| 6,493,541 B1 | 12/2002 | Gunnarsson et al. |
| 6,507,574 B1 | 1/2003 | Kitade et al. |
| 6,522,639 B1 | 2/2003 | Kitade et al. |
| 6,567,938 B2 | 5/2003 | Wan |
| 6,587,672 B1 | 7/2003 | Chuah et al. |
| 6,587,697 B2 | 7/2003 | Terry et al. |
| 6,590,886 B1 | 7/2003 | Easton et al. |
| 6,597,675 B1 | 7/2003 | Esmailzadeh et al. |
| 6,615,382 B1 | 9/2003 | Kang et al. |
| 6,625,197 B1 | 9/2003 | Lundby et al. |
| 6,628,667 B1 | 9/2003 | Murai et al. |
| 6,628,675 B1 | 9/2003 | Neufeld |
| 6,643,275 B1 | 11/2003 | Gustafsson et al. |
| 6,647,077 B1 | 11/2003 | Shan et al. |
| 6,674,765 B1 | 1/2004 | Chuah et al. |
| 6,690,739 B1 | 2/2004 | Mui |
| 6,697,415 B1 | 2/2004 | Mahany |
| 6,701,132 B1 | 3/2004 | Fukuzawa et al. |
| 6,704,547 B2 | 3/2004 | Kuwahara et al. |
| 6,711,219 B2 | 3/2004 | Thomas et al. |
| 6,744,766 B2 | 6/2004 | Alapuranen |
| 6,748,224 B1 | 6/2004 | Chen et al. |
| 6,751,451 B2 | 6/2004 | Rainish et al. |
| 6,760,772 B2 | 7/2004 | Zou et al. |
| 6,765,953 B1 | 7/2004 | Harms et al. |
| 6,771,631 B1 | 8/2004 | Lappetelainen |
| 6,771,984 B1 | 8/2004 | Hiramatsu et al. |
| 6,795,488 B1 | 9/2004 | Iwakiri |
| 6,810,078 B2 | 10/2004 | Bradley |
| 6,813,478 B2 | 11/2004 | Glazko et al. |
| 6,836,666 B2 | 12/2004 | Gopalakrishnan et al. |
| 6,850,499 B2 | 2/2005 | Wheatley et al. |
| 6,851,086 B2 | 2/2005 | Szymanski |
| 6,882,682 B1 | 4/2005 | Tanaka |
| 6,889,055 B1 | 5/2005 | Neufeld |
| 6,900,753 B2 | 5/2005 | Tsunehara et al. |
| 6,956,840 B1 | 10/2005 | Proctor, Jr. |
| 6,970,518 B2 | 11/2005 | Kuffner et al. |
| 6,996,415 B2 | 2/2006 | Lee et al. |
| 6,999,501 B1 | 2/2006 | Sawyer |
| 7,020,180 B2 | 3/2006 | Challa et al. |
| 7,032,276 B1 | 4/2006 | Olson |
| 7,039,410 B2 | 5/2006 | Jovanovic |
| 7,046,717 B2 | 5/2006 | Kanterakis et al. |
| 7,047,029 B1 | 5/2006 | Godwin et al. |
| 7,062,287 B2 | 6/2006 | Nakamura et al. |
| 7,085,246 B1 | 8/2006 | LaRosa et al. |
| 7,113,496 B2 | 9/2006 | Koo et al. |
| 7,126,937 B2 | 10/2006 | Crosbie et al. |
| 7,133,380 B1 | 11/2006 | Winters et al. |
| 7,136,363 B2 | 11/2006 | Kangas |
| 7,149,238 B2 | 12/2006 | Agee et al. |
| 7,155,658 B2 | 12/2006 | Huffman et al. |
| 7,164,890 B2 | 1/2007 | Eriksson et al. |
| 7,171,230 B2 | 1/2007 | Anderson |
| 7,177,648 B2 | 2/2007 | Attar et al. |
| 7,190,681 B1 | 3/2007 | Wu |
| 7,190,684 B2 | 3/2007 | Cao et al. |
| 7,197,692 B2 | 3/2007 | Sutivong et al. |
| 7,206,797 B2 | 4/2007 | Gressel et al. |
| 7,209,517 B2 | 4/2007 | Sindhushayana et al. |
| 7,218,641 B2 | 5/2007 | Kuffner et al. |
| 7,221,699 B1 | 5/2007 | Lindskog |
| 7,239,867 B2 | 7/2007 | Kotzin et al. |
| 7,280,581 B2 | 10/2007 | Khan |
| 7,280,587 B2 | 10/2007 | Motoyoshi et al. |
| 7,292,874 B2 | 11/2007 | Cave et al. |
| 7,302,276 B2 | 11/2007 | Bernhardsson et al. |
| 7,308,285 B2 | 12/2007 | Nelson et al. |
| 7,319,684 B2 | 1/2008 | Tamaki et al. |
| 7,321,601 B2 | 1/2008 | Rogerson et al. |
| 7,359,727 B2 | 4/2008 | Tsien et al. |
| 7,386,026 B1 | 6/2008 | Gold |
| 7,397,824 B2 | 7/2008 | Okubo |
| 7,415,262 B2 | 8/2008 | Liu et al. |
| 7,430,178 B2 | 9/2008 | Kim |
| 7,433,384 B2 | 10/2008 | Smee et al. |
| 7,447,694 B2 | 11/2008 | Mitchell |
| 7,453,961 B1 | 11/2008 | Li et al. |
| 7,477,694 B2 * | 1/2009 | Sanderford et al. .......... 375/261 |
| 7,496,804 B2 | 2/2009 | Juncker |
| 7,515,563 B2 | 4/2009 | Ponnekanti |
| 7,515,580 B2 | 4/2009 | Wheatley et al. |
| 7,526,013 B1 | 4/2009 | Myers |
| 7,535,822 B2 | 5/2009 | Geile et al. |
| 7,558,226 B2 | 7/2009 | Anderson et al. |
| 7,586,891 B1 | 9/2009 | Masciulli |
| 7,586,975 B2 | 9/2009 | Ryu et al. |
| 7,587,211 B2 | 9/2009 | Zeng et al. |
| 7,593,383 B1 | 9/2009 | Myers |
| 7,593,449 B2 | 9/2009 | Shattil |
| 7,593,452 B1 | 9/2009 | Myers |
| 7,594,154 B2 | 9/2009 | Vedantham et al. |
| 7,607,351 B2 | 10/2009 | Allison et al. |
| 7,613,462 B2 | 11/2009 | Willenegger et al. |
| 7,616,604 B2 | 11/2009 | Abdelhamid et al. |
| 7,626,996 B2 | 12/2009 | Currivan et al. |
| 7,627,347 B2 | 12/2009 | Codreanu et al. |
| 7,633,995 B1 | 12/2009 | Giallorenzi et al. |
| 7,653,357 B2 | 1/2010 | Matsuo et al. |
| 7,673,192 B2 | 3/2010 | Currivan et al. |
| 7,675,892 B2 | 3/2010 | Min |
| 7,676,735 B2 | 3/2010 | Luby et al. |
| 7,680,092 B2 | 3/2010 | VanLaningham et al. |
| 7,693,213 B2 | 4/2010 | Sindhushayana et al. |
| 7,702,290 B1 | 4/2010 | Myers |
| 7,730,380 B2 | 6/2010 | Kim |
| 7,733,945 B2 | 6/2010 | Myers et al. |
| 7,734,264 B2 | 6/2010 | Rao et al. |
| 7,734,946 B2 | 6/2010 | Kobayashi |
| 7,742,428 B1 | 6/2010 | Schlesener et al. |
| 7,751,843 B2 | 7/2010 | Butala |
| 7,782,926 B2 | 8/2010 | Myers |
| 7,782,985 B2 | 8/2010 | Wang |
| 7,787,513 B2 | 8/2010 | Siwiak et al. |
| 7,940,735 B2 | 5/2011 | Kozisek et al. |
| 8,036,178 B2 * | 10/2011 | Myers et al. .................. 370/331 |
| 2001/0046220 A1 | 11/2001 | Koo et al. |
| 2002/0021683 A1 | 2/2002 | Holtzman et al. |
| 2002/0101835 A1 | 8/2002 | Gerakoulis |
| 2002/0129315 A1 | 9/2002 | Onvural et al. |
| 2002/0159409 A1 | 10/2002 | Wolfe et al. |
| 2002/0170013 A1 | 11/2002 | Bolourchi et al. |
| 2003/0008664 A1 | 1/2003 | Stein et al. |
| 2003/0026219 A1 | 2/2003 | Moon et al. |
| 2003/0031196 A1 | 2/2003 | Nishimura |
| 2003/0054813 A1 | 3/2003 | Riley et al. |
| 2003/0076812 A1 | 4/2003 | Benedittis |
| 2003/0181217 A1 | 9/2003 | Haas et al. |
| 2003/0210735 A1 | 11/2003 | Ahn et al. |

| | | |
|---|---|---|
| 2003/0214928 A1 | 11/2003 | Chuah |
| 2004/0085920 A1 | 5/2004 | Sezgin et al. |
| 2004/0086027 A1 | 5/2004 | Shattil |
| 2004/0213184 A1 | 10/2004 | Hu et al. |
| 2004/0229640 A1 | 11/2004 | Wang et al. |
| 2004/0264554 A1 | 12/2004 | Harms et al. |
| 2005/0025111 A1 | 2/2005 | Soma |
| 2005/0058151 A1 | 3/2005 | Yeh |
| 2005/0058153 A1 | 3/2005 | Santhoff et al. |
| 2005/0070295 A1 | 3/2005 | Horanieh |
| 2005/0090277 A1 | 4/2005 | Islam et al. |
| 2005/0102600 A1 | 5/2005 | Anandakumar |
| 2005/0108617 A1 | 5/2005 | Lappin, Jr. |
| 2005/0124374 A1 | 6/2005 | Riley et al. |
| 2005/0135253 A1 | 6/2005 | Cai et al. |
| 2005/0143073 A1 | 6/2005 | Lee et al. |
| 2005/0152480 A1 | 7/2005 | Chang et al. |
| 2005/0157692 A1 | 7/2005 | Gerakoulis |
| 2005/0160347 A1 | 7/2005 | Kim et al. |
| 2005/0169205 A1 | 8/2005 | Grilli et al. |
| 2005/0195769 A1 | 9/2005 | Kaewell et al. |
| 2005/0207383 A1 | 9/2005 | Carsello et al. |
| 2005/0208961 A1 | 9/2005 | Willenegger |
| 2005/0232189 A1 | 10/2005 | Loushine |
| 2005/0249164 A1 | 11/2005 | Kwak et al. |
| 2005/0254467 A1 | 11/2005 | Li et al. |
| 2005/0276249 A1 | 12/2005 | Damnjanovic et al. |
| 2006/0039343 A1 | 2/2006 | Anderson et al. |
| 2006/0045195 A1 | 3/2006 | Ok et al. |
| 2006/0046789 A1 | 3/2006 | Huh et al. |
| 2006/0072538 A1 | 4/2006 | Raith |
| 2006/0072614 A1 | 4/2006 | Ogiso et al. |
| 2006/0109806 A1 | 5/2006 | Kwak et al. |
| 2006/0128414 A1 | 6/2006 | Shida et al. |
| 2006/0168496 A1 | 7/2006 | Steele et al. |
| 2006/0215559 A1* | 9/2006 | Mese et al. .................. 370/232 |
| 2006/0242323 A1 | 10/2006 | Sanderford et al. |
| 2006/0276134 A1 | 12/2006 | Marinier et al. |
| 2006/0285604 A1 | 12/2006 | Walton et al. |
| 2006/0286961 A1 | 12/2006 | Levitan |
| 2006/0286995 A1* | 12/2006 | Onggosanusi et al. ....... 455/522 |
| 2007/0030862 A1 | 2/2007 | Michels |
| 2007/0042784 A1 | 2/2007 | Anderson |
| 2007/0060057 A1 | 3/2007 | Matsuo et al. |
| 2007/0064740 A1 | 3/2007 | Waxman |
| 2007/0066320 A1 | 3/2007 | Padovani et al. |
| 2007/0076664 A1 | 4/2007 | An et al. |
| 2007/0076682 A1 | 4/2007 | Kim et al. |
| 2007/0082620 A1 | 4/2007 | Zhang et al. |
| 2007/0092018 A1 | 4/2007 | Fonseka et al. |
| 2007/0117515 A1 | 5/2007 | Sinibaldi et al. |
| 2007/0130495 A1 | 6/2007 | Yoon et al. |
| 2007/0133605 A1 | 6/2007 | Herrmann |
| 2007/0147337 A1 | 6/2007 | Bosch et al. |
| 2007/0183370 A1 | 8/2007 | Wallace et al. |
| 2007/0189047 A1 | 8/2007 | Lee et al. |
| 2007/0195866 A1 | 8/2007 | Seibert et al. |
| 2007/0211786 A1 | 9/2007 | Shattil |
| 2007/0214399 A1 | 9/2007 | Lim et al. |
| 2007/0234171 A1 | 10/2007 | Maiuzzo et al. |
| 2007/0258508 A1 | 11/2007 | Werb et al. |
| 2007/0274267 A1 | 11/2007 | Tiedemann, Jr. et al. |
| 2007/0276987 A1 | 11/2007 | Luo et al. |
| 2007/0277082 A1 | 11/2007 | Matsumoto |
| 2008/0002565 A1 | 1/2008 | Spencer |
| 2008/0004377 A1 | 1/2008 | Axelsson et al. |
| 2008/0022184 A1 | 1/2008 | Jeong et al. |
| 2008/0032625 A1 | 2/2008 | Cheung et al. |
| 2008/0036589 A1 | 2/2008 | Werb et al. |
| 2008/0037431 A1 | 2/2008 | Werb et al. |
| 2008/0037454 A1 | 2/2008 | Werb et al. |
| 2008/0037569 A1 | 2/2008 | Werb et al. |
| 2008/0040509 A1 | 2/2008 | Werb et al. |
| 2008/0043777 A1 | 2/2008 | Yun et al. |
| 2008/0052609 A1 | 2/2008 | Peng et al. |
| 2008/0062951 A1 | 3/2008 | Kanterakis et al. |
| 2008/0075035 A1 | 3/2008 | Eichenberger |
| 2008/0075216 A1 | 3/2008 | Li et al. |
| 2008/0117955 A1* | 5/2008 | Stafford .................. 375/149 |
| 2008/0130534 A1 | 6/2008 | Tomioka |
| 2008/0153483 A1 | 6/2008 | Abu-Amara |
| 2008/0161033 A1 | 7/2008 | Borran et al. |
| 2008/0182511 A1 | 7/2008 | Adkins et al. |
| 2008/0188265 A1 | 8/2008 | Carter et al. |
| 2008/0192661 A1 | 8/2008 | Hamamoto et al. |
| 2008/0192738 A1 | 8/2008 | Florencio et al. |
| 2008/0207251 A1 | 8/2008 | Anderson |
| 2008/0212654 A1 | 9/2008 | Nilsson et al. |
| 2008/0232330 A1 | 9/2008 | Lee et al. |
| 2008/0267126 A1 | 10/2008 | Vujcic et al. |
| 2008/0267287 A1 | 10/2008 | Hannuksela |
| 2008/0282137 A1 | 11/2008 | You et al. |
| 2009/0031035 A1 | 1/2009 | Dharmaraju et al. |
| 2009/0077444 A1 | 3/2009 | Qi et al. |
| 2009/0089638 A1 | 4/2009 | Heise et al. |
| 2009/0092055 A1 | 4/2009 | Balasubramanian et al. |
| 2009/0113267 A1 | 4/2009 | Harrison et al. |
| 2009/0122782 A1 | 5/2009 | Horn et al. |
| 2009/0135754 A1 | 5/2009 | Yavuz et al. |
| 2009/0137241 A1 | 5/2009 | Yavuz et al. |
| 2009/0147873 A1 | 6/2009 | Li et al. |
| 2009/0149140 A1 | 6/2009 | Borran et al. |
| 2009/0163238 A1 | 6/2009 | Rao et al. |
| 2009/0238201 A1 | 9/2009 | Myers |
| 2009/0238210 A1 | 9/2009 | Myers et al. |
| 2009/0238248 A1 | 9/2009 | Myers et al. |
| 2009/0249155 A1 | 10/2009 | Mayrench et al. |
| 2009/0274164 A1 | 11/2009 | Myers |
| 2009/0276686 A1 | 11/2009 | Liu et al. |
| 2009/0280812 A1 | 11/2009 | Cheng et al. |
| 2009/0292403 A1 | 11/2009 | Howell et al. |
| 2009/0327835 A1 | 12/2009 | Oteri et al. |
| 2010/0014487 A1* | 1/2010 | Attar et al. .................. 370/335 |
| 2010/0017689 A1 | 1/2010 | Choi et al. |
| 2010/0034216 A1 | 2/2010 | Pickering et al. |
| 2010/0086087 A1 | 4/2010 | Pekonen et al. |
| 2010/0111070 A1 | 5/2010 | Hsu |
| 2010/0113077 A1 | 5/2010 | Lee et al. |
| 2010/0162035 A1 | 6/2010 | Rancurel et al. |
| 2010/0167777 A1 | 7/2010 | Raghothaman et al. |
| 2010/0167778 A1 | 7/2010 | Raghothaman et al. |
| 2010/0215080 A1 | 8/2010 | Hamaguchi et al. |
| 2010/0329311 A1 | 12/2010 | Hannan et al. |
| 2011/0134965 A1 | 6/2011 | Myers et al. |
| 2011/0215736 A1 | 9/2011 | Horbst et al. |
| 2011/0216692 A1 | 9/2011 | Lundsgaard et al. |
| 2012/0011413 A1 | 1/2012 | Liu et al. |

FOREIGN PATENT DOCUMENTS

| | | |
|---|---|---|
| CN | 101260976 | 9/2008 |
| EP | 2 197 124 | 6/2010 |
| FR | 2771054 | 5/1999 |
| GB | 2 379 358 | 3/2003 |
| GB | 2 462 063 | 1/2010 |
| JP | 10-303801 | 11/1998 |
| JP | 2003-116162 | 4/2003 |
| JP | 2004-023350 | 1/2004 |
| JP | 2008-054014 | 3/2008 |
| JP | 2009-276890 | 11/2009 |
| KR | 10200331124 | 4/2003 |
| KR | 100691367 | 2/2007 |
| KR | 20080088774 | 10/2008 |
| WO | WO-97/02663 | 1/1997 |
| WO | WO-00/38361 | 6/2000 |
| WO | WO-01/08322 | 2/2001 |
| WO | WO-01/67786 | 9/2001 |
| WO | WO-01/98618 | 12/2001 |
| WO | WO-02/09320 | 1/2002 |
| WO | WO-02/11304 | 2/2002 |
| WO | WO-2005/102214 | 11/2005 |
| WO | WO-2006/031073 | 3/2006 |
| WO | WO 2006/107047 | 10/2006 |
| WO | WO-2006/126960 | 11/2006 |
| WO | WO-2010/006909 | 1/2010 |

OTHER PUBLICATIONS

Aronsohn, "Digital RF-Communication between Mobile Platforms in the Presence of Interference" Chalmers University of Technology, Jun. 2004.Retrieved on Aug. 17, 2010 from the internet at: htttp://citeseerx.ist.psu.edu/viewdoc/download?doi=10.1.1.63.9851&rep=rep1&type=pdf; (67 pgs.).

Bayer et al., "Improving the Performance of the Distributed Scheduler in IEEE 802. 16 Mesh Networks." In IEEE vehicular technology conference (VTC 2007-Spring) [online], 2007, p. 1-5, [retrieved on Dec. 3, 2008]. Retrieved from the Internet: <URL: http://www.staff.city.ac.uk/~veselin/publications/Bayer_VTC07.pdf>. Citation available at <URL: http://portal.acm.org/citation.cfm?id=1413939.1413942&coll=GUIDE&dl=GUIDE>(see item 25).

Buzzi et al., "Joint Receiver and Transmitter Optimization for Energy-Efficient CDMA Communications," To Appear in IEEE JSAC—Special Issue on Multiuser Detection for Advanced Communication Systems and Networks, Presented at 2007 European Wireless Conference and at 2007 IEEE International Symposium on Information Theory, [Retrieved on Feb. 25, 2009], Retrieved from the Internet <URL: http://arxiv.org/PS_cache/arxiv/pdf/0712/0712.1339v1.pdf>, 2007.

Cao et al., "Modelling and Performance Analysis of the Distributed Scheduler in IEEE 802. 16 Mesh Mode." In: MobiHoc'05 [online], May 25-27, 2005, p. 78-89, [retrieved on Dec. 3, 2008]. Retrieved from the Internet: <URL: http://lion.cs.uiuc.edu/group_seminar_slides/p78-cao.pdf.>.

Clancy, T. Charles; "Dynamic Spread Spectrum Access in Cognitive Radio Networks"; Retrieved from the internet on Oct. 15, 2010 from: http://citeseerx.ist.psu.edu/viewdoc/download?doi=10.1.1.135.724&rep=rep1&type=pdf (116 pgs.).

Dafalla, et al.; "Performance Study of Power Control Radio Resource Management Over WLANs"; Journal of Computer Science (2008); vol. 4, No. 3, pp. 239-244.

Final Office Action for U.S. Appl. No. 12/345,374 dated Nov. 10, 2009.

Final Office Action received for U.S. Appl. No. 12/189,609 dated Sep. 4, 2009.

Final Office Action received on U.S. Appl. No. 12/189,609 dated Jul. 22, 2009.

Final Office Action; In re U.S. Appl. No. 12/751,724; Dated: Jul. 13, 2011; Applicant: Theodore J. Myers, (12 pgs.).

Final Office Action; In re: U.S. Appl. No. 12/751,724; Dated: Jul. 13, 2011; Applicant: Theodore J. Myers; (12 pgs.).

Final Office Action; In re: U.S. Appl. No. 13/035,459; Dated: Nov. 23, 2011; Applicant: Theodore J. Myers, et al. (13 pgs.).

First Examination Report; In re New Zealand Patent Application No. 588465; Issued: Mar. 2, 2012; Applicant: On-Ramp Wireless, Inc.; (2 pgs.).

Fumo et al., "Satellites & solid state electronics test concrete pressure water pipelines,"(2000), Retrieved from the internet at: http://www.pipepressure.com/pdfs/SPIE%20NDE%20Conf%202000%20-%20Acoustic%20Tesing.pdf, 10 pages.

Haardt et al., "The TD-CDMA Based UTRA TDD Mode," IEEE Journal on Selected Areas in Communications, vol. 18, No. 8, Aug. 2000, p. 1375-1385.

Hamalainen, Jyri, "Cellular Network Planning and Optimization Part VI: WCDMA Basics" [Retrieved on Jan. 27, 2009], Retrieved from the Internet <URL: http://www.comlab.hut.fi/studies/3275/Cellular_network_planning_and_optimization_part6.pdf.

Hasu. "Radio Resource Management in Wireless Communication: Beamforming, Transmission Power Control, and Rate Allocation." Helsinki University of Technology, Jun. 2007. Retrieved on Aug. 5, 2010 from the Internet at http://citeseerx.ist.psu.edu/viewdoc/download?doi=10.1.1.96.3380&rep=rep1&type=pdf; (110 pgs.).

Hermanns, "Secure and Robust Tactical Communications Based on Code-Hopping CDMA (CH-CDMA)" Apr. 2008, Retrieved from the internet at: http://ftp.rta.nato.int/public/PubFullText/RTO/MP/RTO-MP-IST-083/MP-IST-083-16.pdf, (14 pgs.).

Hermanns, "Secure and Robust Tactical Communications Based on Code-Hopping CDMA (CH-CDMA)" Apr. 2008, Retrieved from the internet at: http://ftp.rta.nato.int/public/PubFullText/RTO/MP/RTO-MP-IST-083/MP-IST-083-16.pdf, 14 pages.

Hund et al. "Overview of MAC layer Enhancements for IEEE 802.15.4a." Retrieved on Jul. 26, 2010 from the Internet at http://www.johanneshund.de/files/Hund2009.pdf. Publication year of 2009 inferred from the URL; (7 pgs.).

International Search Report and Written Opinion for PCT/US/2009/036766 mailed Oct. 28, 2009.

International Search Report and Written Opinion for PCT/US2009/036743 dated Oct. 28, 2009.

International Search Report and Written Opinion received for PCT/US2010/035419 dated Dec. 23, 2010.

International Search Report and Written Opinion; In re: PCT International Patent Application No. PCT/US2011/030357; Dated: Oct. 31, 2011; Applicant: On-Ramp Wireless, Inc.; (8 pgs.).

International Search Report and Written Opinion; In re: PCT International Patent Application No. PCT/US2011/034128; Mailed: Nov. 25, 2011; Applicant: On-Ramp Wireless, Inc., (8 pgs.).

Jeong et al.,"CDMA/TDD System for Wireless Multimedia Services with Traffic Unbalance Between Uplink and Downlink," IEEE Journal on Selected Areas in Communications, vol. 17, No. 5, May 1999, pp. 939-946.

Lee et al., "CDMA Systems Engineering Handbook," Artech House, 1998, pp. 335-423.

Luby et al. "Efficient Erasure Correcting Codes." In: IEEE Transactions on Information Theory, vol. 47, No. 2, Feb. 2001, pp. 569-584. Retrieved on Jul. 26, 2010 from the Internet at http://www.ldpccodes.com/papers/eraseIT.pdf.

Manchiraju, "Evaluation of pseudorandom sequences used in third generation spread spectrum systems," 2003, Retrieved from the internet at: http://etd.ohiolink.edu/etd/send-pdf.cgi/Manchiraju%20Dinakar.pdf?acc_num=ohiou1081801327, 100 pages.

Meerkerk, "Experimental propagation analysis in a CDMA 1X macro cell," 2005. Retreieved from the internet at: http://lib-ir.lib.sfu.ca/retrieve/2426/etd2025.pdf, 71 pages.

Mischa Schwartz, Mobile Wireless Communications, pp. 327 (Cambridge University Press 2005), retrieved from URL: http://bit.ly/9BYDhy.

Monks et al., "Transmission power control for multiple access wireless packet networks," Proceedings 25th Annual IEEE Conference on Local Computer Networks, Nov. 2000, 10 pages.

Non-final Office Action received for U.S. Appl. No. 12/189,619 dated Apr. 2, 2009.

Non-final Office Action received for U.S. Appl. No. 12/276,971 dated Apr. 13, 2010.

Non-final Office Action received for U.S. Appl. No. 12/472,642 dated Dec. 3, 2009.

Non-final Office Action received for U.S. Appl. No. 12/483,722 dated Jan. 11, 2010.

Non-final Office Action received on U.S. Appl. No. 12/345,374 dated Feb. 17, 2010.

Non-final Office Action received on U.S. Appl. No. 12/345,374 dated Sep. 4, 2009.

Non-Final Office Action U.S. Appl. No. 12/816,783; Dated Apr. 6, 2011, (10 pgs.).

Non-Final Office Action, dated Jun. 3, 2011; U.S. Appl. No. 13/032,393, filed Feb. 22, 2011, (13 pgs.).

Non-Final Office Action, Dated: Apr. 8, 2011, U.S. Appl. No. 12/751,724, (7 pgs.).

Non-Final Office Action; In re: U.S. Appl. No. 13/232,426; Dated: Mar. 16, 2012; Filed: Sep. 14, 2011; Applicant: Robert W. Boesel, et al.; (091721-0129) (13 pgs.).

Non-Final Office Action; in re: U.S. Appl. No. 13/035,459; Dated: Oct. 17, 2011; Applicant: Theodore Myers, (12 pgs.).

Non-Final Office Action; In re: U.S. Appl. No. 13/035,459; Dated: Jul. 26, 2011; Applicant: Theodore J. Myers, (11 pgs.).

Non-Final Office Action; In re: U.S. Appl. No. 13/232,426; Dated: Jan. 26, 2012; Applicant: Robert W. Boesel, et al.; (7 pgs.).

Non-Final Office Action; in re: U.S. Appl. No. 13/355,864; Dated: Apr. 3, 2012; Applicant: Theodore J. Myers, et al.; (8 pgs.).

Non-Final Office Action; In re: U.S. Appl. No. 13/366,848; Dated: Apr. 30, 2012; Filed: Feb. 6, 2012; Applicant: Theodore J. Myers, et al.; (10 pgs.).
Notice of Allowance for U.S. Appl. No. 12/276,971 dated Jul. 30, 2010.
Notice of Allowance received for U.S. Appl. No. 12/189,609 on dated Mar. 23, 2010.
Notice of Allowance received for U.S. Appl. No. 12/189,619 dated Jun. 26, 2009.
Notice of Allowance received for U.S. Appl. No. 12/345,374 on dated Mar. 31, 2010.
Notice of Allowance received on U.S. Appl. No. 12/189,533 dated Jun. 3, 2009.
Notice of Allowance received on U.S. Appl. No. 12/472,642 dated Jan. 26, 2010.
Notice of Allowance received on U.S. Appl. No. 12/483,722 dated Feb. 18, 2010.
Notice of Allowance; in re: U.S. Appl. No. 12/816,783; mailed: Jun. 29, 2011; Applicant: Theodore J. Myers; (6 pgs.).
Notice of Allowance; in re: U.S. Appl. No. 13/027,654; mailed: Jun. 13, 2011; Applicant: Theodore J. Myers; (10 pgs.).
Notice of Allowance; In re: U.S. Appl. No. 13/032,393; Dated: Jul. 27, 2011; Applicant: Theodore J. Myers; (10 pgs.).
Notice of Allowance; In re: U.S. Appl. No. 13/116,767; Dated: Oct. 28, 2011; Applicant: Theodore Myers, et al. (10 pgs.).
Notice of Allowance; In re: U.S. Appl. No. 12/816,783; Dated: May 20, 2011; Applicant: Theodore J. Myers; (5 pgs.).
Notice of Allowance; In re: U.S. Appl. No. 13/232,426; Dated: Jun. 14, 2012; Applicant: Robert W. Boesel, et al.; (9 pgs.).
Qiao et al. "IEEE 802.11h: Technology and Application." Published in IT Professional, vol. 8, No. 2, Mar./Apr. 2006. Retrieved on Aug. 5, 2010 from the Internet at http://www.mwnl.snu.ac.kr/~schoi/publication/Journals/06-ITPro.pdf. Citation available as reference [1] of http://kom.aau.dk/~ff/documents/pimrc2008.pdf; (5 pgs.).
Subramanian et al. "Disruption-tolerant link-level mechanisms for extreme wireless network environments." In: Proceedings of the 2nd International Conference on Communication System Software and Middleware (COMSWARE 2007), Jan. 7-12, 2007. Retrieved on Jul. 26, 2010 from The Internet at http://citeseerx.ist.psu.edu/viewdoc/download?doi=10.1.1.143.4028&rep=rep1&type=pdf; (8 pgs.).
Sunay et al., "Mobile Location Tracking in DS CDMA Networks Using Forward Link Time Difference of Arrival and Its Application to Zone-Based Billing." In: Global Telecommunications Conference, 1999 GLOBECOM '99 [online], vol. 1a, p. 143-147, [retrieved on Nov. 20, 2008]. Retrieved from the Internet: <URL: http://portal.ku.edu.tr/~osunay/papers/GCOM99-geolocation.pdf>. Citation on the Internet: <URL: http://ieeexplore.ieee.org/xpl/freeabs_all.jsp?arnumber=831624>.
Supplementary European Search Report; European Patent Application No. 09721805.1; Applicant: On-Ramp Wireless, Inc.; Mailed: Jun. 20, 2011, (6 pgs.).
Supplementary European Search Report; in re: European Patent Application No. 09723436.3; Applicant: On-Ramp Wireless, Inc.; Mailed: Jun. 29, 2011 (8 pgs.).
Wadekar et al. "Adaptive transmission power control and coding for wireless sensor networks." Published in IET Conference on Wireless, Mobile and Sensor Networks 2007 (CCWMSN07), vol. 2007, issue CP533, Dec. 12-14, 2007. pp. 1063-1066. Retrieved on Aug. 5, 2010 from the Internet at http://scitation.aip.org/getabs/servlet/GetabsServlet?prog=normal&id=IEECPS0020070CP533001063000001&idtype=cvips&gifs=yes&ref=no.
Wang et al., "Error Statistics of Closed-Loop Power Control in Multirate DS-CDMA Cellular Systems," IEEE Xplore, [Retreived on Feb. 23, 2009], Retrieved from the Internet <URL: http://ieeexplore.ieee.org/Xplore/login.jsp?url=/iel5/7793/21424/00993355.pdf?arnumber=993355>, 2002.

Weisstein, Eric W. "Cyclic Redundancy Check." From MathWorld—A Wolfram Web Resource. http://mathworld.wolfram.com/CyclicRedundancyCheck.html, accessed May 5, 2011, 1 page.
Wha Sook Jeon, Dong Geun Jeong, Comparison of Time Slot Allocation Strategies for CDMA/TDD Systems, IEEE Journal on Selected Areas in Communications, vol. 18, No. 7, Jul. 2000, p. 1271-1278.
Woo, G., et al., "Beyond the Bits: Cooperative Packet Recovery Using Physical Layer Information" Proceedings of the 13th annual ACM international conference on Mobile computing and networking, Sep. 14, 2007, Retrieved from the internet at: http://portal.acm.org/citation.cfm?id=1287853.1287871, (12 pgs.).
Xu, Liang, "Dynamic Fair Scheduling with QoS Constraints in Multimedia Wideband CDMA Cellular Networks," IEEE Transactions on Wireless Communications, vol. 3, No. 1; [Retrieved on Feb. 25, 2009], Retrieved from the Internet <URL: http://ieeexplore.ieee.org/Xplore/login.jsp?url=/iel5/7693/28152/01259400.pdf?arnumber=1259400, Jan. 2004.
Yang et al, "Software-Defined-Radio-Assisted Adaptive Broadband Frequency Hopping Multicarrier DS-CDM," IEEE Communications Magazine, [Retrieved on Feb. 25, 2009], Retrieved from the Internet <URL: http://ieeexplore.ieee.org/Xplore/login.jsp?url=ielx5/35/21325/00989783.pdf?arnumber=989783>, Mar. 2002.
Yi et al. "CORA: Collaborative Opportunistic Recovery Algorithm for loss controlled, delay bounded ad hoc multicast." In: Computer Communications, vol. 31, issue 15, Sep. 25, 2008, (27 pgs.)Retrieved on Jul. 26, 2010 from the Internet at http://www.sciencedirect.com/science?_ob=ArticleURL&_udi=B6TYP-4SXYG00-3&_user=10&_coverDate=09%2F25%2F2008&_rdoc=1&_fmt=high&_orig=search&_sort=d&_docanchor=&view=c&_searchStrId=1412544378&_rerunOrigin=scholar.google&_acct=C000050221&_version=1&_urlVersion=0.
Yuan, S., et al., "Digital Watermarking-Based Authentication Techniques for Real-Time Multimedia Communication" Dec. 9, 2005, Retrieved from the internet at: http://deposit.ddb.de/cgi-bin/dokserv?idn=980187419&dok_var=d1&dok_ext=pdf&filename=980187419.pdf, (109 pgs.).
Zhao et al., "Joint Rate and Power Adaption for Radio Resource Management in Uplink Wideband Code Division Multiple Access Systems," Institution of Engineering and Techonology (IET) Communications, vol. 2, No. 4, pp. 562-572, [Retrieved on Feb. 25, 2009], Retrieved from the Internet <URL: http://ieeexplore.ieee.org/Xplore/login.jsp?url=?iel5/4105970/4493358.pdf?arnumber=4493358>, Jan. 2007.
Zhao, Y., "Mobile Phone Location Determination and Its Impact on Intelligent Transportation Systems." In: IEEE Transactions on Intelligent Transportation Systems [online], vol. 1, No. 1, Mar. 2000, p. 55-64, [retrieved on Nov. 20, 2008]. Retrieved from the Internet: <URL: http://www.ss.fpp.edu/~fdimc/laboratorijsk_vaje/Inteligentni_transportni_sistemi/Literature_za_sirjenje_obzorja/ITS_mobile_phone_location_determination.pdf>.
Chen, Chuan Chong, et al.; "Multiple Delay Capture Probability and Performance of DS-SS Slotted Aloha Packet Radio System"; Communications ICC 2005. 2005 IEEE International Conference on Seoul, Korea; May 16, 2005, pp. 895-900, vol. 2. (6 pgs.).
Examination Report; In re: European Patent Application Serial No. 09721805.1-2411; Dated: Jul. 17, 2012; Applicant: On-Ramp Wireless, Inc.; (5 pgs.).
Examination Report; In re: European Patent Application Serial No. 09723436.3-2411; Dated: Jul. 11, 2012; Applicant: On-Ramp Wireless, Inc.; (6 pgs.).
Glisic Savo, et al.; "Spread Spectrum CDMA Systems for Wireless Communications"; Artech House (1997); pp. 354-365, section 8.4.3 (12 pgs.).
Non-Final Office Action on U.S. Appl. No. 13/458,451, mailed Aug. 3, 2012.

* cited by examiner

HANDOVER PROCESSING IN MULTIPLE ACCESS POINT DEPLOYMENT SYSTEM

CROSS-REFERENCE TO RELATED PATENT APPLICATIONS

The present application is a continuation of U.S. application Ser. No. 12/770,630, filed Apr. 29, 2010, which is a continuation in part of U.S. application Ser. No. 12/189,619, filed Aug. 11, 2008 (now U.S. Pat. No. 7,782,926), which claims priority to U.S. Provisional Appl. No. 61/037,522, filed Mar. 18, 2008, the entire disclosures of which are incorporated herein by reference.

FIELD OF ART

Embodiments of the present application relate to the field of communications. More specifically, representative embodiments relate to methods and systems for performing forward error correction in a media access control system of a random phase multiple access (RPMA) communication interface.

SUMMARY

This disclosure is directed to a method, device and system for efficiently compensating for information not received, also known as erasures, in a communication system.

An illustrative method of compensating for information not received in a communication system is disclosed. An encoded signal is created from a source signal using a forward error correction technique. A first predetermined part of the encoded signal is transmitted at a transmitter. A second predetermined part of the encoded signal is transmitted. The transmission of the second predetermined part of the encoded signal is terminated after a determination of successful decoding of the encoded signal by a receiver.

In alternative embodiments of the method, the determination of successful decoding of the encoded signal is based in part on receiving an acknowledgement of a successful decoding of the encoded signal. In a further alternative embodiment of the method, the acknowledgement is received during scheduled transmission.

In alternative embodiments of the method, the determination of successful decoding of the encoded signal is based in part on receiving a negative acknowledgement of a successful decoding of the encoded signal wherein the negative acknowledgement indicates the receiver did not decode the encoded signal. In a further alternative embodiment of the method, the determination of successful decoding of the encoded signal is based in part on a result of a second scheduled transmission.

In alternative embodiments of the method, the determination of successful decoding of the encoded signal is based in part on a result of receiving a device identification on a stop list.

In another alternative embodiment of the method, the first predetermined part of the encoded signal is determined as a result of a noise characteristic of a system. In another alternative embodiment of the method, the first predetermined part of the encoded signal is determined as a result of a successfully completed prior transmission. In another alternative embodiment of the method, the forward error correction technique comprises a Reed Solomon encoding technique.

In a further alternative embodiment of the method, the acknowledgement is received at a time wherein the time is determined in part from a slot start time and a random timing offset, and further wherein the acknowledgement is received from a first node while at least a portion of a second signal is received from a second node. In a further alternative embodiment of the method, the first predetermined part of the encoded signal and a cyclic redundancy check is transmitted.

An illustrative access point capable of compensating for information not received in a communication system is disclosed. An illustrative access point includes a processor and a transmitter operatively coupled to the processor. The transmitter is configured to transmit a first predetermined part of an encoded signal wherein the encoded signal is encoded from a source signal using a forward error correction technique. The transmitter also is configured to transmit a second predetermined part of the encoded signal. The transmitter also is configured to terminate transmission of the second predetermined part of the encoded signal after a determination of successful decoding of the encoded signal by a receiver.

In an alternative embodiment of the access point, the determination of successful decoding of the encoded signal is based in part on receiving an acknowledgement of a successful decoding of the encoded signal. In a further alternative embodiment of the access point, the acknowledgement is received during scheduled transmission.

In an alternative embodiment of the access point, the determination of successful decoding of the encoded signal is based in part on receiving a negative acknowledgement of decoding of the encoded signal wherein the negative acknowledgement indicates the receiver did not decode the encoded signal.

In an alternative embodiment of the access point, the determination of successful decoding of the encoded signal is based in part on a result of receiving a device identification on a stop list. In an alternative embodiment of the access point, the first predetermined part of the encoded signal is determined as a result of a noise characteristic of a system. In an alternative embodiment of the access point, the first predetermined part of the encoded signal is determined as a result of a successfully completed prior transmission.

An illustrative system capable of correcting communication errors is disclosed. The system includes a node which includes a receiver configured to decode an encoded signal wherein the encoded signal is encoded from a source signal using a forward error correction technique. The system also includes an access point which includes a processor and a transmitter operatively coupled to the processor. The transmitter is configured to transmit a first predetermined part of the encoded signal. The transmitter is also configured to transmit a second predetermined part of the encoded signal. The transmitter is also configured to terminate transmission of the second predetermined part of the encoded signal after a determination of successful decoding of the encoded signal by the receiver.

In an alternative embodiment of the system, the access point further includes an access point receiver and the node further include a node transmitter. In the alternative embodiment of the system the determination of successful decoding of the encoded signal is based in part on receiving at the access point receiver an acknowledgement of decoding of the encoded signal transmitted by the node transmitter.

In an alternative embodiment of the system, the first predetermined part of the encoded signal is determined as a result of a noise characteristic of the system.

These and other features, aspects, and advantages of the system are better understood with references to the following description and appended claims.

DETAILED DESCRIPTION

Figure 33:
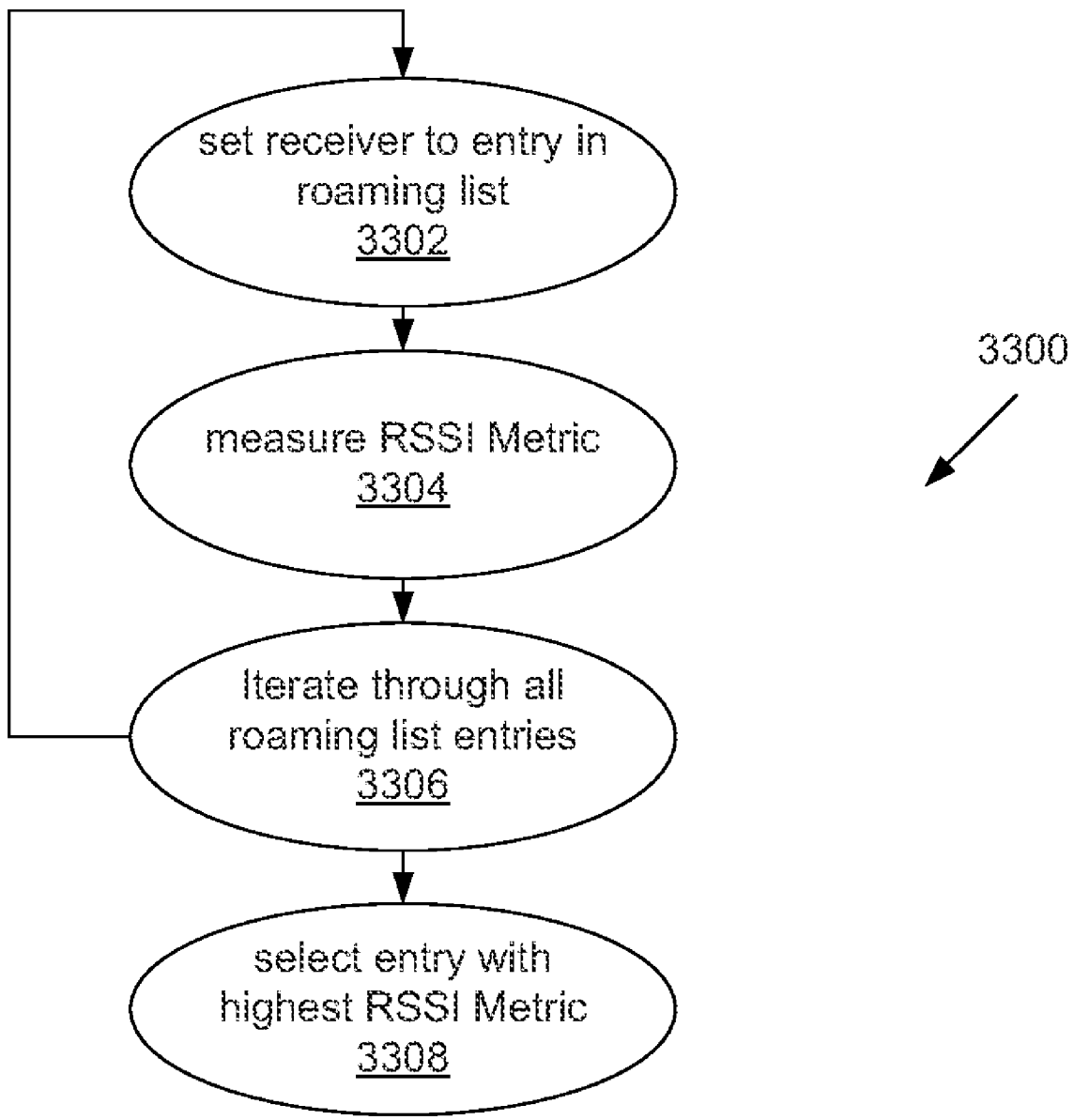
FIG. 33 is a flow diagram illustrating operations that allow a node to scan each parameter set in a roaming list.
Figure 34:
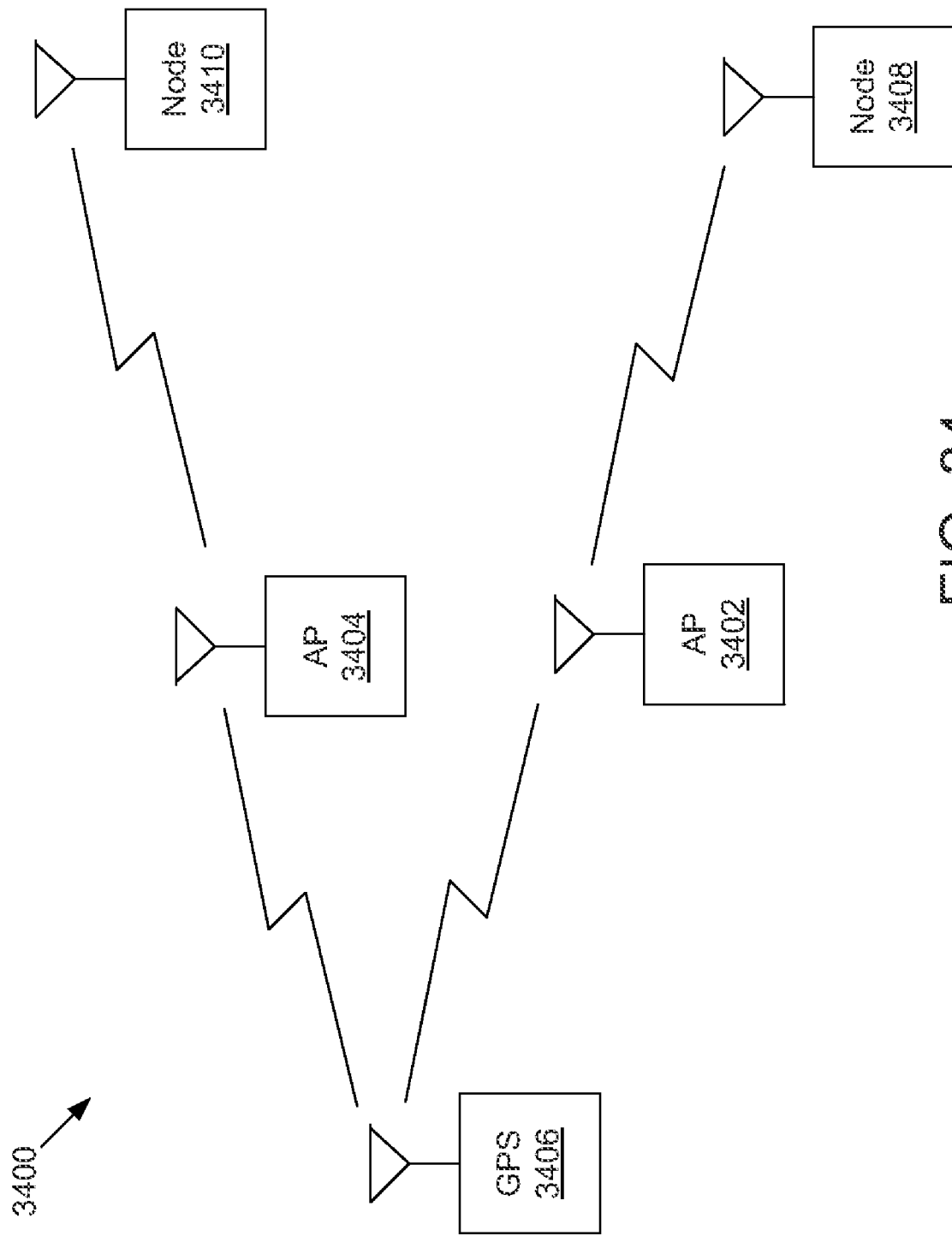
FIG. 34 is a diagram depicting a system with access points which are synchronized by an outside time source and are in communication with multiple nodes.
Figure 35:
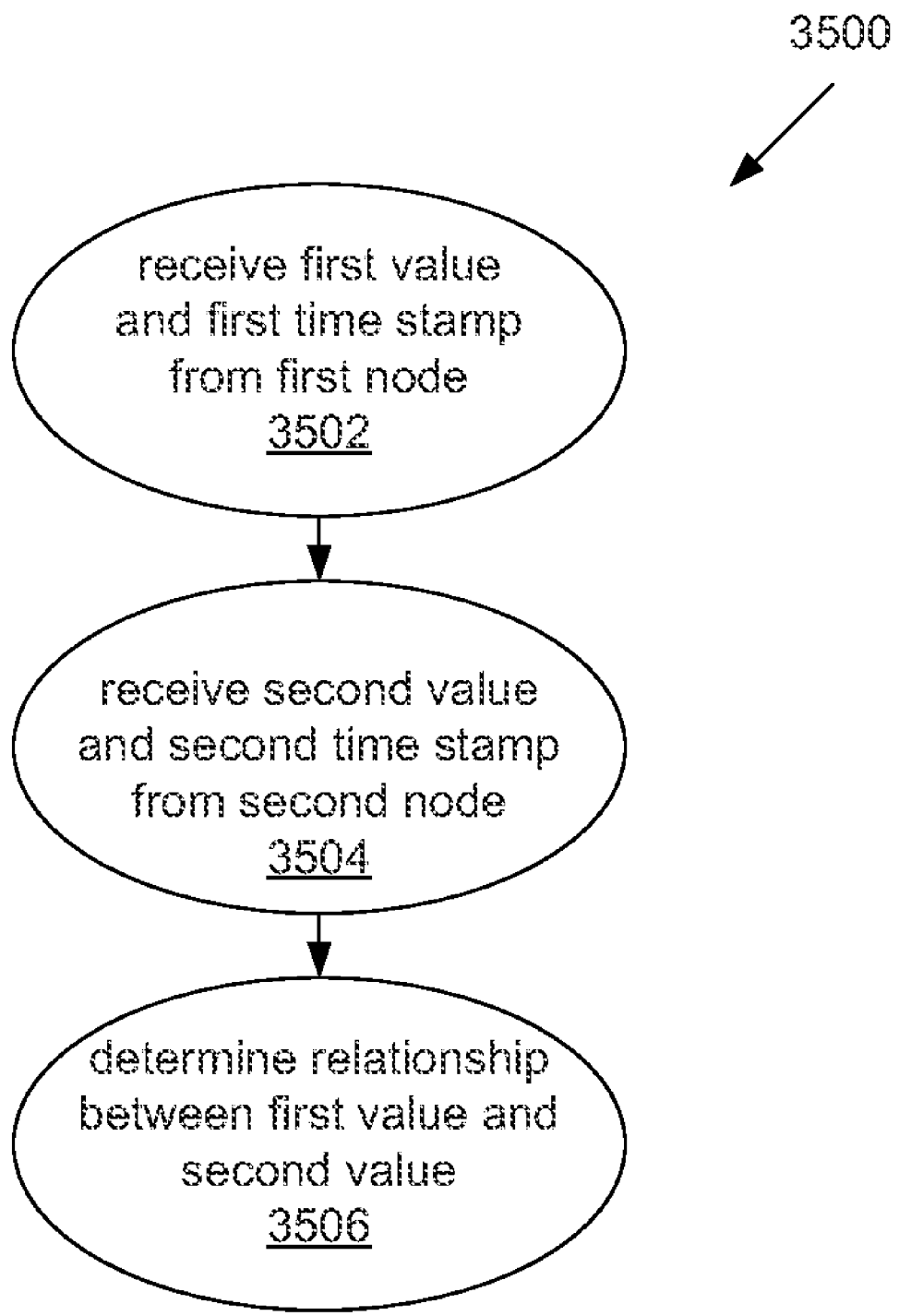
FIG. 35 is a flow diagram illustrating operations that allow a system to determine a relationship between two timed events.
Figure 36:
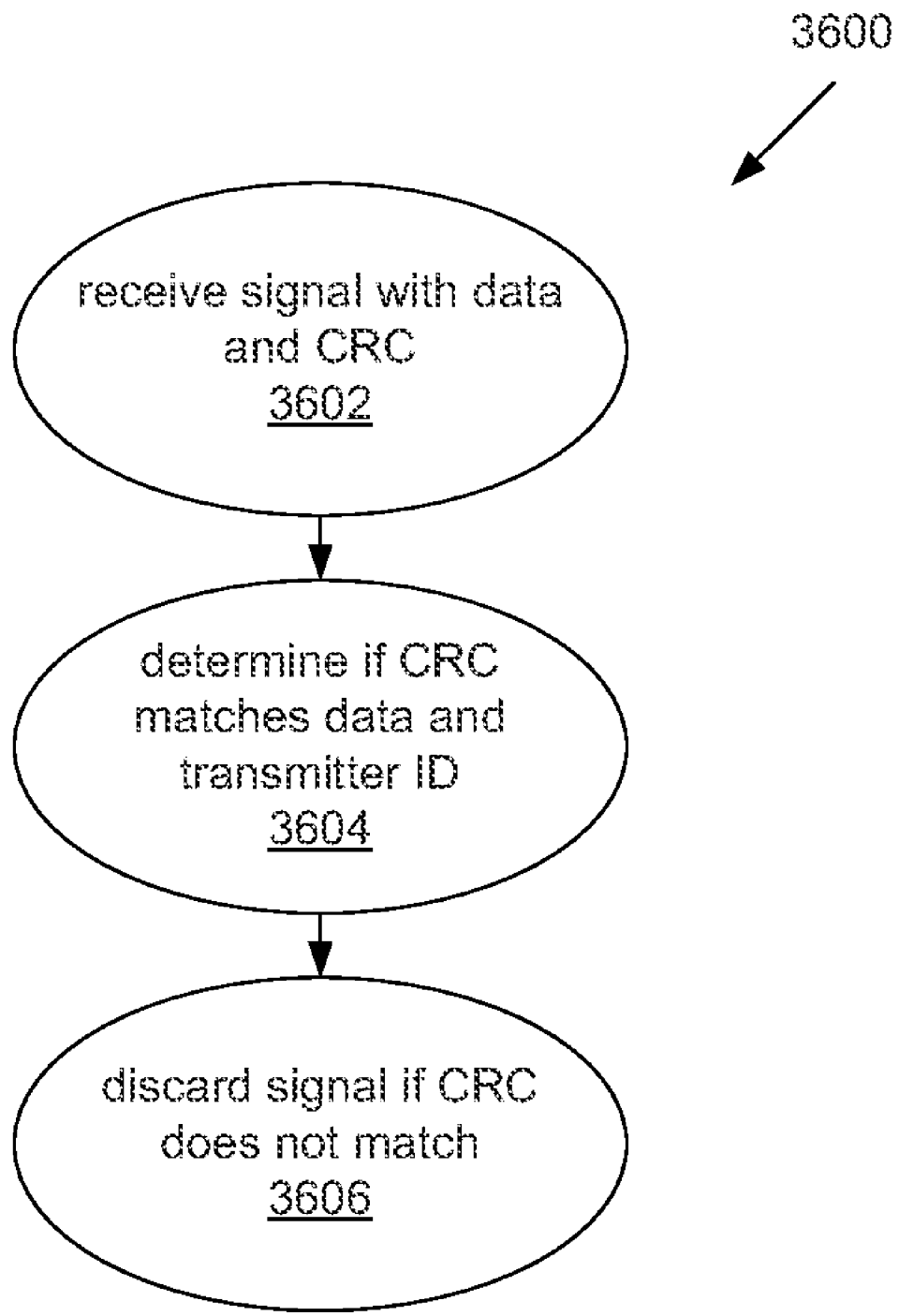
FIG. 36 is a flow diagram illustrating operations that allow a system to determine if a signal was transmitted by a particular transmitter.
Figure 37:
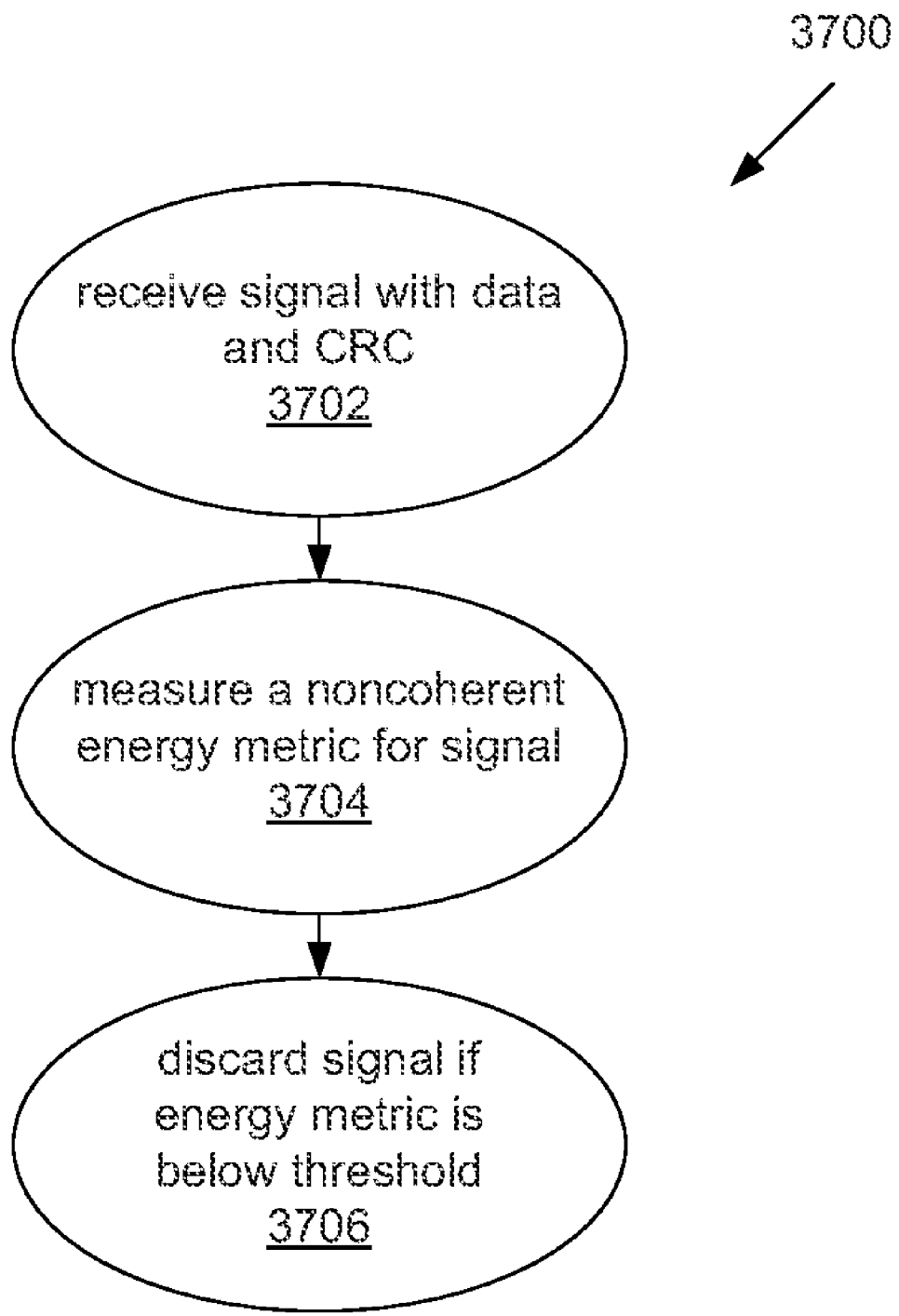
FIG. 37 is a flow diagram illustrating operations that allow an access point to determine if a signal was transmitted by a node.
Figure 38:
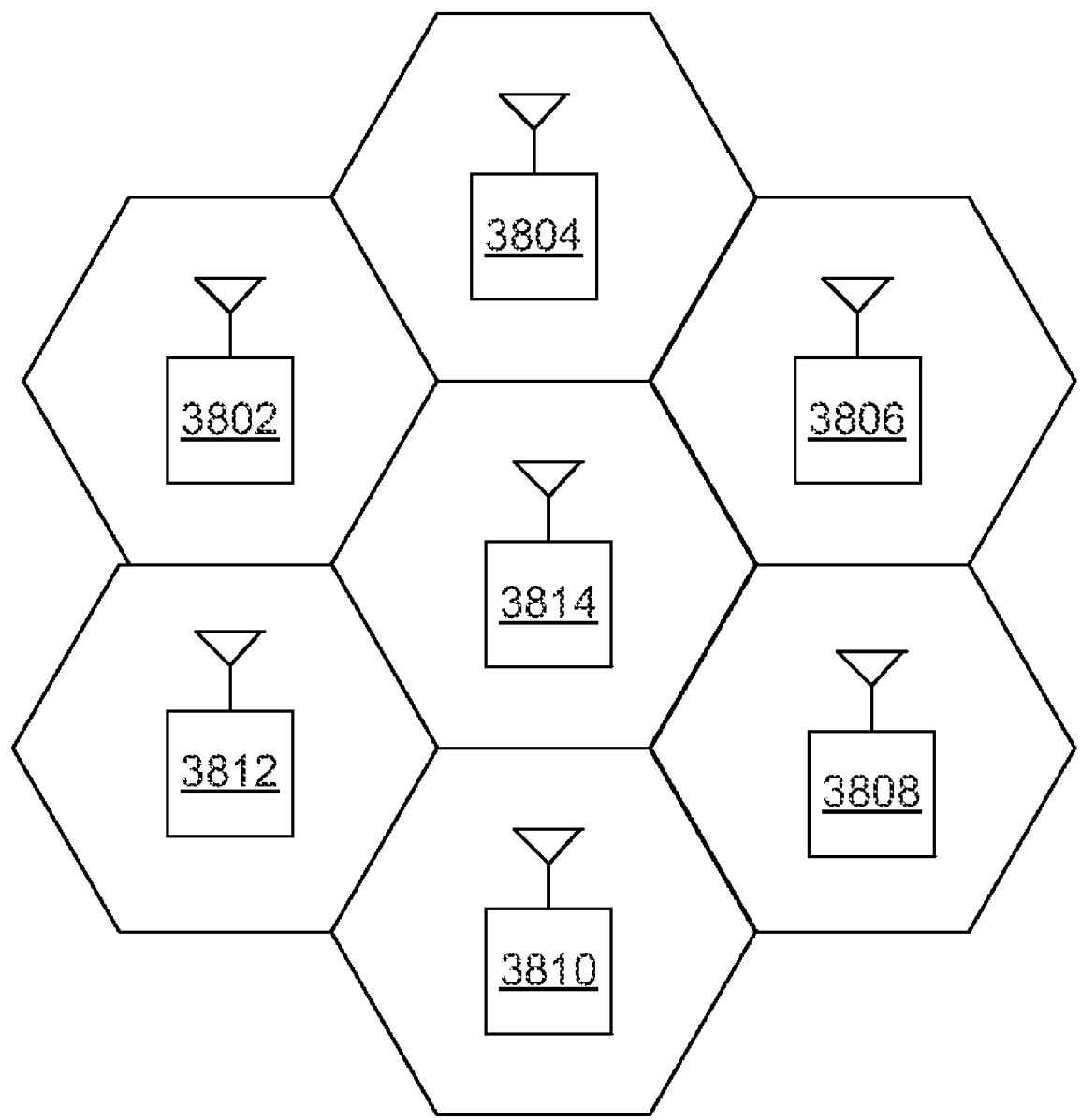
FIG. 38 is a diagram depicting a multiple frequency/multiple gold code system topology with access points.

Illustrative embodiments are presented within a framework of a Random Phase Multiple Access (RPMA) communication system. A representative RPMA system is described in U.S. Pat. No. 7,782,926 which is incorporated herein by reference. Other communication systems such as frequency division multiple access, time division multiple access or code division multiple access may also implement the ideas presented. FIGS. 1-20 described below are directed to an illustrative RPMA system. FIGS. 21-24 are directed to example methods of using forward error correction for efficient fault tolerant communications. FIGS. 25-29 are directed to example techniques for signal measurement that improve usage of the RPMA system in real world applications. FIGS. 30-33 are directed to usage of the RPMA system where multiple access points are present. FIG. 34 is directed to some advantages obtained with a distributed remote time source. FIGS. 35-37 are directed at improvements in error detection that enable robust system operation in the presence of noise and interfering signals. FIG. 38 is directed to an example of a unique RPMA system configuration technique.

Figure 1:
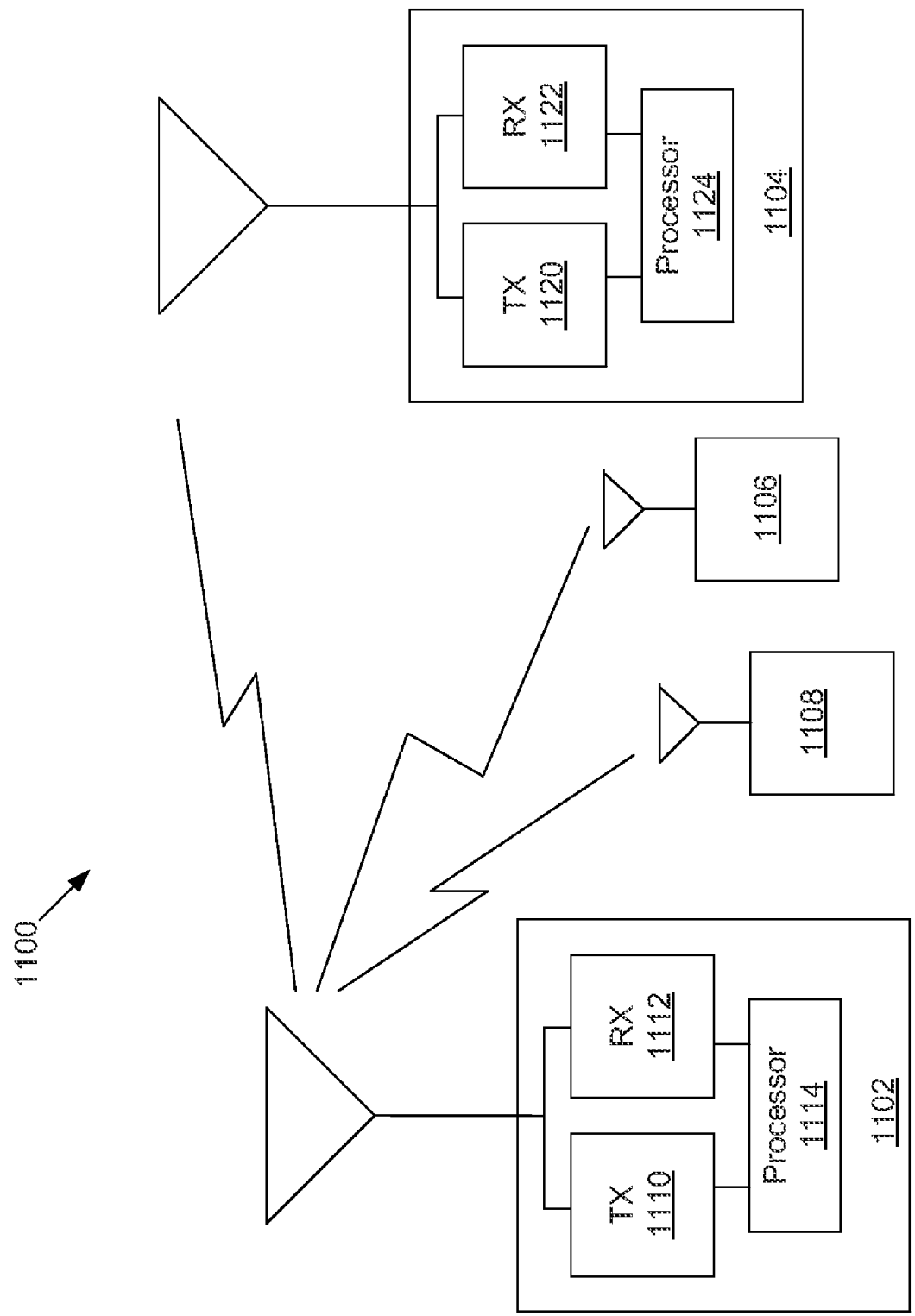
FIG. 1 is an illustration of a simplified network map having an access point and nodes.

FIG. 1 is an illustration of a simplified network map 1100 having an access point 1102 and nodes 1104, 1106, and 1108. Access point 1102 contains a transmitter 1110 and a receiver 1112, both operatively coupled to a processor 1114. Node 1104 contains a transmitter 1120 and a receiver 1122, both operatively coupled to a processor 1124. Nodes 1106 and 1108 contain similar elements, however they are not drawn for simplicity. Access point 1102 communicates with nodes 1104, 1106, and 1108 via a spread spectrum communication system. Access point 1102 transmits such that any node within range may determine timing and receive a signal from access point 1102. Nodes 1104, 1106, and 1108 may transmit to access point 1102 such that transmitted signals overlap each other and that node transmitters operate simultaneously. Signals from nodes 1104, 1106, and 1108 can be received and demodulated by access point 1102 because the signals are quasi-orthogonal to each other. As used herein, a node or tag can refer to any communications device configured to receive signals from and/or send signals to an access point. An access point can refer to any communications device configured to simultaneously communicate with a plurality of nodes or tags. In a representative embodiment, nodes can be mobile, low power devices which run off of a battery or other stored power source, and an access point can be located in a central location and receive power from a power source such as a wall outlet or generator. Alternatively, nodes may plug into an outlet and/or the access point may run off of a battery or other stored power source.

In a communication system, during a transmission, a signal occupies a frequency domain. In direct sequence spread spectrum systems, a signal may be spread in the frequency domain by a pseudo-noise (PN) signal. The spreading of the signal introduces process gain which enhances a signal to noise ratio of the signal in relation to a spreading width, or number of bits used to spread the signal. One effect of this improved signal-to-noise ratio is that a spread signal is resilient to introduced interference, such as by other signals, that may be broadcast in a common bandwidth as the spread signal. This effect depends on an ability of the receiver to correlate the spread signal with a PN code used to spread the signal. Only the signal that was spread with a particular PN code, and synchronized to a despreader (at a correct timing offset), receives process gain. All other signals receive little or no gain and serve as minimal interference. An ability to have multiple signals in the same bandwidth depends in part on cross-correlation properties of the particular PN codes used in transmission.

In a technique where fully orthogonal codes are used, there is no correlation between the fully orthogonal codes, but this technique forces a receiver to know exactly which code a transmitter is using and to be exactly time aligned with the transmitter. With PN codes, which are not fully orthogonal but may be considered quasi-orthogonal, there is some correlation. So long as correlation between transmitted signals remains low, the signal-to-noise ratio of a received signal can remain high. In systems where different PN codes are used, a receiver must still know exactly which code a transmitter is using and the receiver must still be exactly time aligned with the transmitter. In a random phase multiple access (RPMA) system a random time element can be introduced to offset a PN code in time or to offset a time of the transmission, even though an identical PN code may be used by separate transmitters. A random time offset makes multiple spread signals that are received simultaneously quasi-orthogonal to each other. In reception, only a signal that is despread using a time offset that a transmitter used to spread the signal receives process gain.

Figure 2:
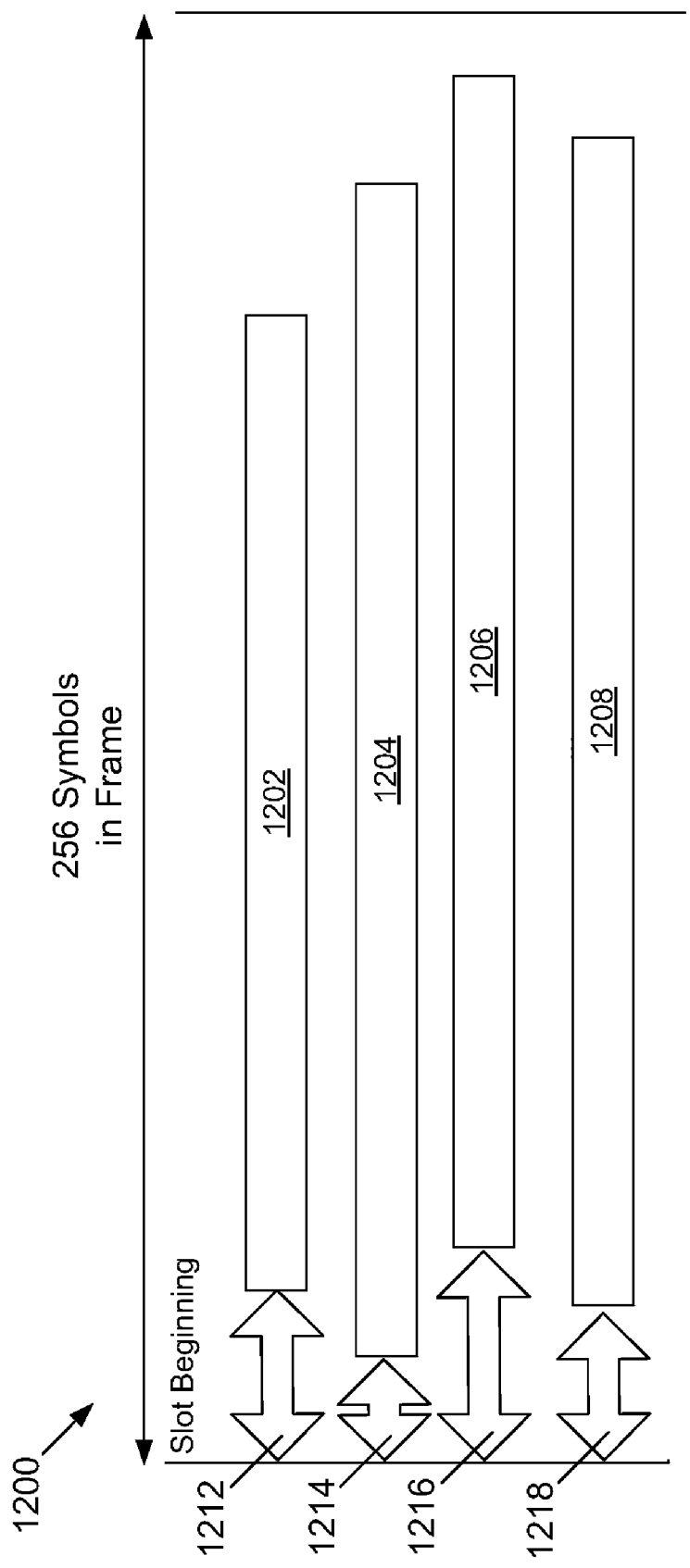
FIG. 2 is a diagram illustrating one uplink slot with illustrative transmissions.

FIG. 2 is a diagram illustrating one uplink slot 1200 having transmissions 1202, 1204, 1206, and 1208. Transmissions 1202, 1204, 1206, and 1208, which may all originate from separate nodes, all begin at random offsets 1212, 1214, 1216, and 1218 from a beginning of the uplink slot. Transmissions 1202, 1204, 1206, and 1208 overlap in time such that, at certain points in time, transmitters are operating simultaneously. However, all signals may be resolved by a single receiver, because the transmissions are quasi-orthogonal to each other. The beginning and end points of the transmissions are staggered, due to a random time offset from the beginning of the slot. A retransmission protocol may be used to correct errors, since nodes may occasionally pick a random time offset already chosen by another node. In this diagram, a frame size of 256 symbols is shown, but other sizes may be used. Examples of other frame sizes include 100 symbols, 128 symbols, and 512 symbols. The frame size may be held constant for all transmissions, though the frame transmission time may vary. A fast slot is a portion of uplink or downlink transmission spectrum that may be used to transmit a portion of a spread frame. A total number of fast slots, and consequently a time used to transmit the frame, depends on a variable spreading factor used to spread the frames.

In an RPMA system, a received power observed by an access point may be important to control in order to avoid desensing the access point to other received signals. One method of controlling power is to use an open loop power control. In open loop power control, a node adjusts its power output based on received characteristics of a transmission from the access point. The node may continuously measure power received from the access point in recent fast slots. When the measured power goes down, the node compensates for a likely power loss at the access point's receiver by increasing the node's output power. Similarly, when the power received goes up, the node decreases its own power output on an assumption that symmetrical characteristics of a transmission medium leads to a power increase at the access point. This compensation can help to avoid the node desensing other nodes at the access point and can help transmissions from the node to continue to be received even in changing signal propagation circumstances. Where a time between transmission by the access point and transmission by the node is long, open loop control may be less useful. The power received as observed by the access point may be controlled in an open loop method by making a time between transmission by the access point and transmission by the node short.

Figure 3:
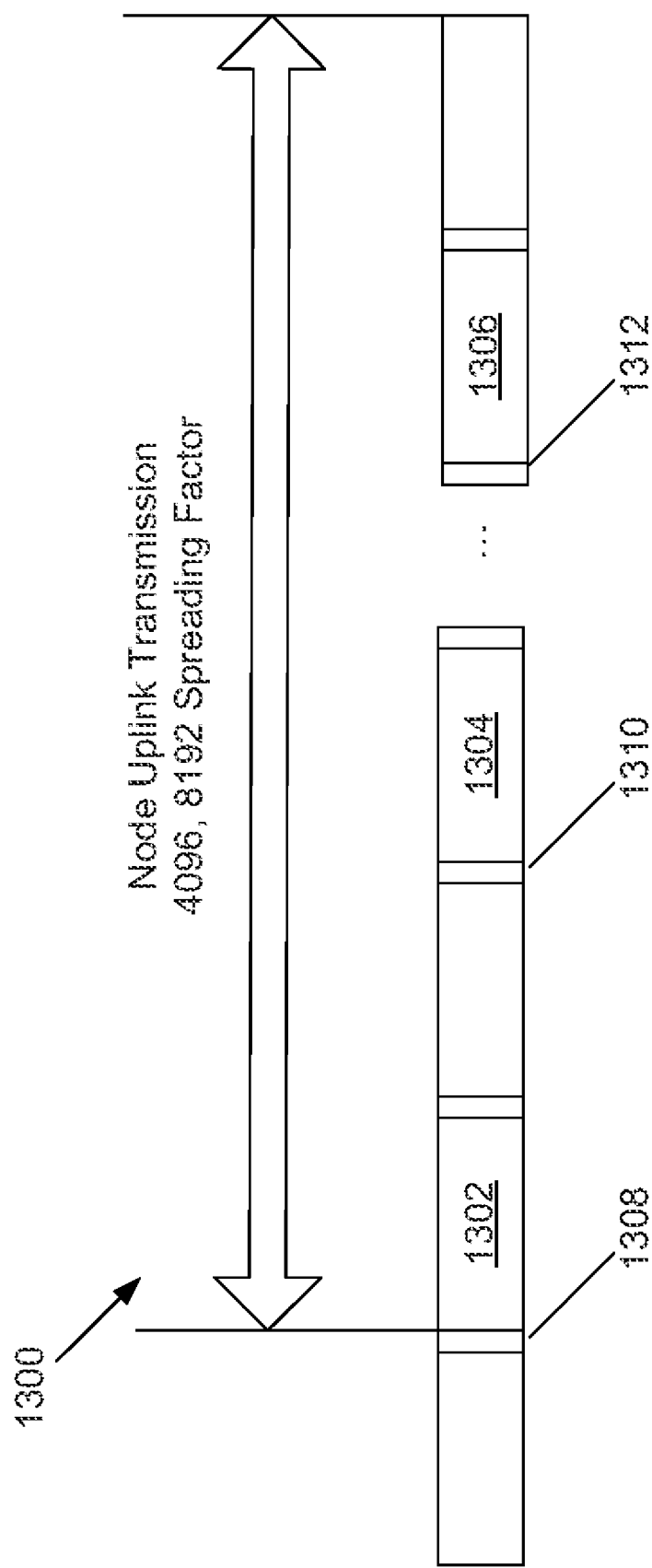
FIG. 3 is a diagram depicting a frame of an uplink communication in an illustrative example including uplink fast slots and multipath and RPMA slip delay blocks when a high spreading factor is used.

FIG. 3 is a diagram depicting a frame 1300 of an uplink communication in an illustrative example including uplink slots 1302, 1304 and 1306 and multipath and RPMA slip delay blocks 1308, 1310, and 1312 when a high spreading factor is used. The multipath and RPMA slip delay blocks 1308, 1310, and 1312, also called delay blocks, are periods of time that a transmitter may insert a random time offset into transmissions. Transmissions are delayed by the random time offset such that a time of transmission is dependent on the random time offset. In this representative embodiment, each delay block is the same size, though other sizes are possible. A transmitter may choose identical random time offsets across all delay blocks. When the same random time offset is chosen, a receiver's despread array, described below, can remain synchronized across each of the slots.

The diagram in FIG. 3 is from a viewpoint of a node in a communication system. In an RPMA system, the node uses a random delay to give quasi-orthogonality to signals transmitted by other nodes. The node may select to begin transmission at any time within an RPMA slip delay block. Since a time period between transmission by a node and transmission time by an access point is kept short, open loop power control can compensate for recent variations in signal propagation characteristics. This power control may be performed by a node to avoid desensing a receiver at an access point to transmissions by other nodes.

Figure 4:
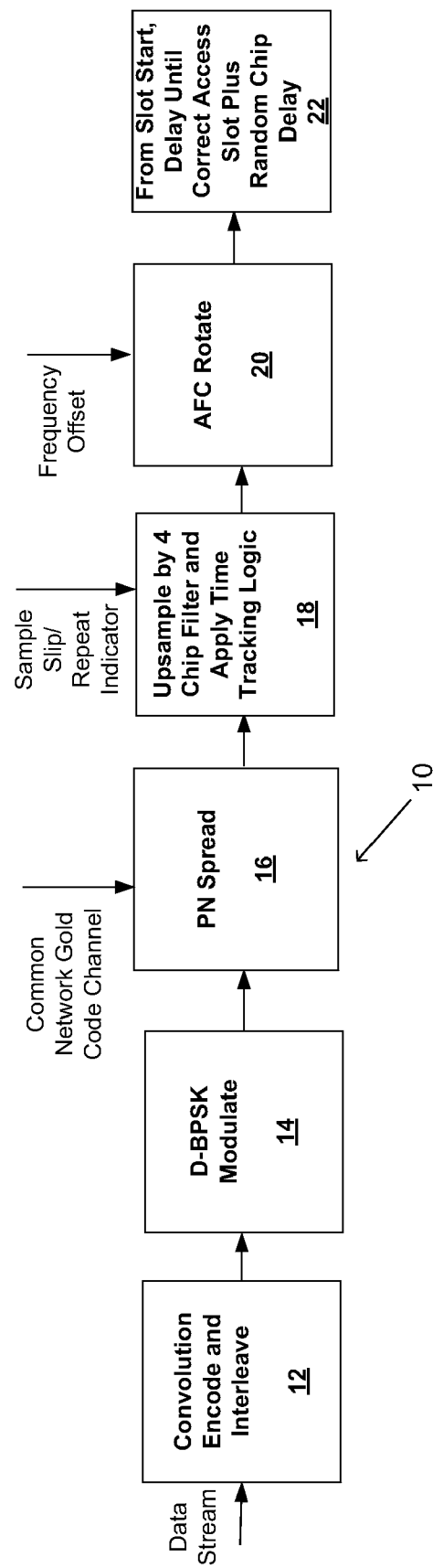
FIG. 4 is a diagram depicting an uplink transmitter according to a representative embodiment.

FIG. 4 illustrates an uplink transmitter 10 which includes structures such as a convolution encoder, an interleave module, a modulator, a pseudo-noise spreader, a filter, a bank of taps, an automatic frequency control (AFC) rotator, and other such structures. These structures perform operations depicted in blocks 12, 14, 16, 18, 20, and 22. The transmit path of uplink transmitter 10 is a coded and spread spectrum waveform. In a representative embodiment, the uplink transmitter 10 can be included in a tag that communicates with an access point along with other tags using demodulated communication channels. Additional, fewer, or different operations may be performed by the uplink transmitter 10 depending on the particular embodiment. The operations may also be performed in a different order than that shown and described. As used herein, a tag can refer to any communications device configured to receive signals from and/or send signals to an access point. The access point can refer to any communications device configured to simultaneously communicate with a plurality of tags. In a representative embodiment, the tags can be mobile, low power devices which run off a battery or other stored power, and the access point can be located in a central location and receive power from a power source such as a wall outlet or generator. Alternatively, the tags may plug into an outlet and/or the access point may run off of a battery or other stored power source.

In block 12, a data stream is received by a convolution encoder and interleave module. In one embodiment, the data stream is 128 Bits including the preamble. Alternatively, data streams of other sizes may be used. Once received, the data stream is encoded using the convolution encoder. In a representative embodiment, the data stream may be encoded at a rate of ½. Alternatively, other rates may be used. The data stream can also be interleaved using the interleave module. An encoded symbols stream is output to a block 14 in which a differential binary phase shift keying (D-BPSK) modulator is used to modulate the encoded symbols stream. In alternative embodiments, other modulation schemes may be used. At block 16, the modulated stream is applied to a PN spreader. In a representative embodiment, the PN spreader can use a common network gold code channel using a selected spreading factor. The spreading factor can be a member of the set {64, 128, 256, . . . , 8192}. Alternatively, any other code and/or spreading factor may be used. Each of the tags at a given spreading factor is spread by the same PN code with a randomly selected chip offset. The large range of possible randomly selected chip offsets increases the probability that a particular frame will not collide (or, in other words, have the same chip timing at the access point) with another frame from another transmitter. The probability of collision in the limit of approaching capacity may become non-negligible (~10% or less) and can be solved via retransmission of the same frame at a differently drawn random offset. The PN spreader is described in more detail below with reference to FIG. 9. In a representative embodiment, an output of block 18 can have a rate of 1 bit at 1 mega-chip per second (Mcps). Alternatively, other rates may be used.

At block 18, the data stream is upsampled by a 4×oversample filter and time tracking logic is used to ensure that all of the frames land at the same sample rate consistent with the frequency reference of the AP. Block 18 receives a sample slip/repeat indicator as an input. In one embodiment, an output of block 18 may have a real frequency of approximately 4 megahertz (MHz). At block 20, an automatic frequency control (AFC) rotation is done including a frequency offset to match the access point's timing offset, ensuring that all of the frames from all of the users lands near the same frequency hypothesis. In one embodiment, an output of block 20 may have a complex frequency of approximately 4 MHz. At block 22, a delay is imposed from the start slot until the correct access slot occurs. In addition, a random chip delay is imposed on the signal. In a representative embodiment, the random chip delay can be from 0 to the spreading factor minus 1. Alternatively, a different random chip delay may be used. The slot access can be described by A(i,j) where i is related to the spreading factor as $2^{(13-i)}$ and j is the sub-slot number corresponding to non-overlapping slots. Depending upon the selected spreading factor, there are generally multiple transmit opportunities in a given slot. For the uplink, the access slot can be randomly selected along with a chip offset from 0 to spreading factor minus 1. As such, the probability of collision between uplink users is minimized, while allowing for re-selection for cases where there are collisions. After the signal has been delayed, the signal can be transmitted to an access point.

Figure 5:
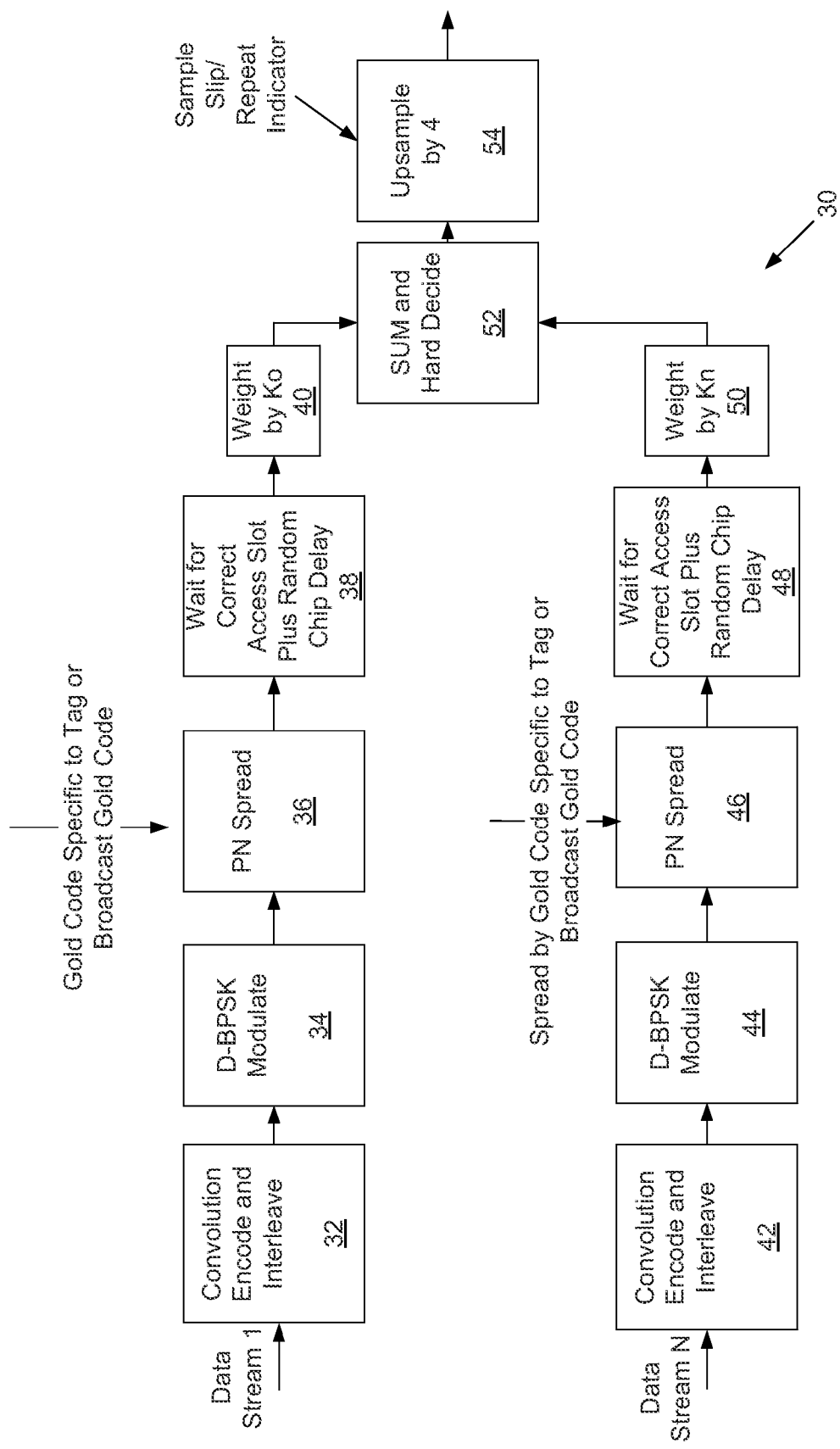
FIG. 5 is a diagram depicting a downlink transmitter according to a representative embodiment.

FIG. 5 illustrates a downlink transmitter 30 including structures such as a convolution encoder, an interleave module, a modulator, a pseudo-noise spreader, a filter, a bank of taps, and other such structures. Using transmitter 30, the access point (AP) transmits multiple channels each destined for a particular tag or user. These structures perform operations depicted in blocks 32 through 54. Blocks 32 to 40 and blocks 42 to 50 represent distinct data paths that can be replicated for additional data flows. In a representative embodiment, blocks 32-38 can perform operations similar to the operations described with reference to FIG. 4 on a first data stream. Similarly, blocks 42-48 can perform operations similar to the operations described with reference to FIG. 4 on an nth data stream, where n can be any value. The input to block 36 can be a gold code specific to the tag which is to receive the first data stream, and the input to block 46 can be a gold code specific to the tag which is receive the nth data stream. Alternatively, other codes such as a broadcast gold code, a non-gold code, or other may be used to spread the first data stream and/or the nth data stream. The output of block 38 and/or block 48 can be weighted in blocks 40 and 50 in case the data links corresponding to the first data stream and the nth data stream are of unequal power. Once weighted, the paths are summed in a block 52. A hard decision is also made in block 52 where all positive numbers are mapped to 0 and all negative numbers are mapped to 1. Alternatively, a different hard decision may be made. In one embodiment, an output of block 52 may have a rate of 1 bit at 10 Mcps. Alternatively, other rates may be used. The sum output from block 52 is upsampled using a 4×chip filter in block 54. In one embodiment, an output of block 54 can have a real frequency of 40 MHz. Alternatively, other frequencies may be used. Not shown is a transmission on an adjacent frequency that is a single set of broadcast frames at a maximum downlink spreading factor of 2048. Alternatively, a different maximum downlink spreading factor may be used.

Figure 6:
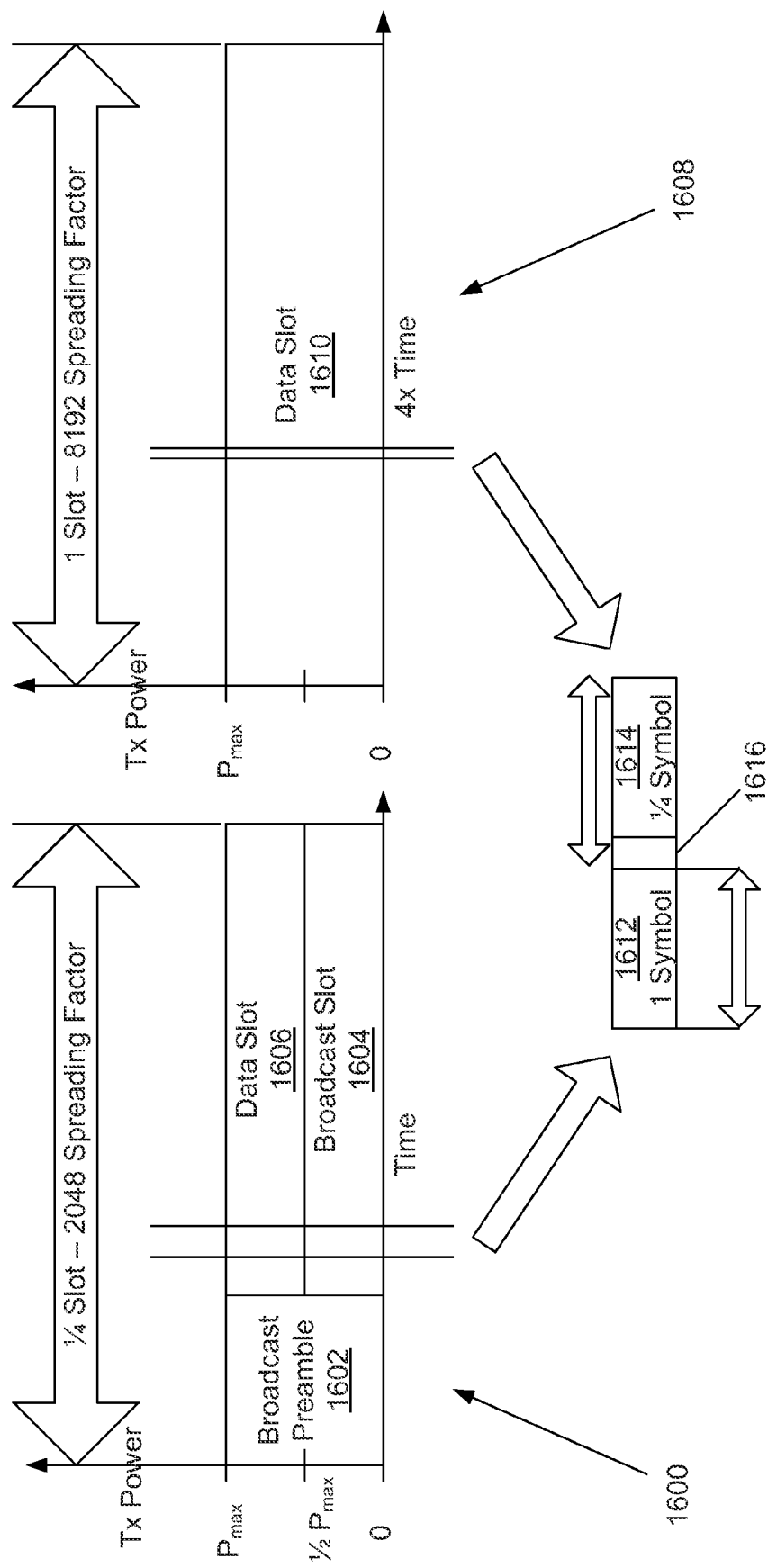
FIG. 6 is a diagram illustrating a representative structure of a downlink frame including broadcast preamble, broadcast slot, and data slot and an uplink frame including data slot in accordance with a representative embodiment.

FIG. 6 is a diagram illustrating the structure of a downlink frame 1600 including broadcast preamble 1602, broadcast channel 1604, and data channel 1606 and an uplink frame 1608 including data channel 1610 in accordance with a representative embodiment. The Y-axis shows a transmit power of a signal. The X-axis shows a time of transmission. Downlink frame 1600 and uplink frame 1608 are divided into downlink and uplink fast slots, with downlink slot 1612 and uplink slot 1614 shown. Additional downlink and uplink slots may also be present. Combined downlink slot 1612 and uplink slot 1614 produce a half-duplex communication system as described herein. In one illustrative embodiment, the number of individual slots may be 16 downlink slots for the broadcast preamble 1602 and 256 downlink slots for the broadcast channel 1604 and the data channel 1606. The number of individual fast slots that downlink frame 1600 and uplink frame 1608 are divided into depends on a particular implementation including factors such as a spreading factor and a frame size. Frame size may be held constant for all frames in a system. When a downlink spreading factor of 2048 and an uplink spreading factor of 8192 are chosen, in one slot, four downlink slots may be transmitted for every uplink slot. In that case, every downlink fast slot contains one symbol while every uplink fast slot contains one fourth of a symbol, or 2048 chips. In an illustrative embodiment, downlink fast slot 1612 takes 2.048 milliseconds (ms) to transmit. Uplink fast slot 1614 is paired with an RPMA delay block 1616. The RPMA delay block 1616 allows transmission of uplink fast slot 1614 to begin at any time within the RPMA delay block 1616. In the illustrative embodiment, uplink fast slot 1614 and RPMA delay block 1616 have a combined transmission time of 2.304 ms. In an illustrative embodiment, all uplink fast slots, downlink fast slots, and RPMA delay blocks are identically sized, even though corresponding uplink and downlink frames may be spread by different spreading factors. The different spreading factors of frames result in a variable duration for transmitting uplink and downlink frames. For example, in the previously described case of a downlink spreading factor of 2048 and an uplink spreading factor of 8192, it takes four times as long to transmit an uplink frame as it does to transmit a downlink frame.

In a representative embodiment, broadcast preamble 1602 can be boosted relative to other transmissions made using broadcast channel 1604 or data channel 1606. As an example, broadcast preamble 1602 can be transmitted at a maximum power ($P_{max}$), and other transmissions can be made at one half of the maximum power ($\frac{1}{2} P_{max}$). In one embodiment, broadcast preamble 1602 can be boosted by 3 decibels (dB) relative to other transmissions via broadcast channel 1604 and/or data channel 1606. A boosted preamble allows receivers at nodes to robustly estimate chip timing, perform auto-frequency control, and track time with reference to an access point. A payload of broadcast preamble 1602 can be programmable. In one embodiment, a broadcast channel frame can be identical in creation to a data channel frame with an exception that a broadcast channel gold code generator may reset every symbol whereas a data channel gold code generator may run until the end of the data channel frame before resetting. Resetting the broadcast channel gold code generator at every symbol makes the broadcast channel frame easier to acquire by a receiver. In one embodiment, no channel coding, interleaving, or cyclic redundancy check (CRC) may be applied to the payload of broadcast preamble 1602.

Figure 7:
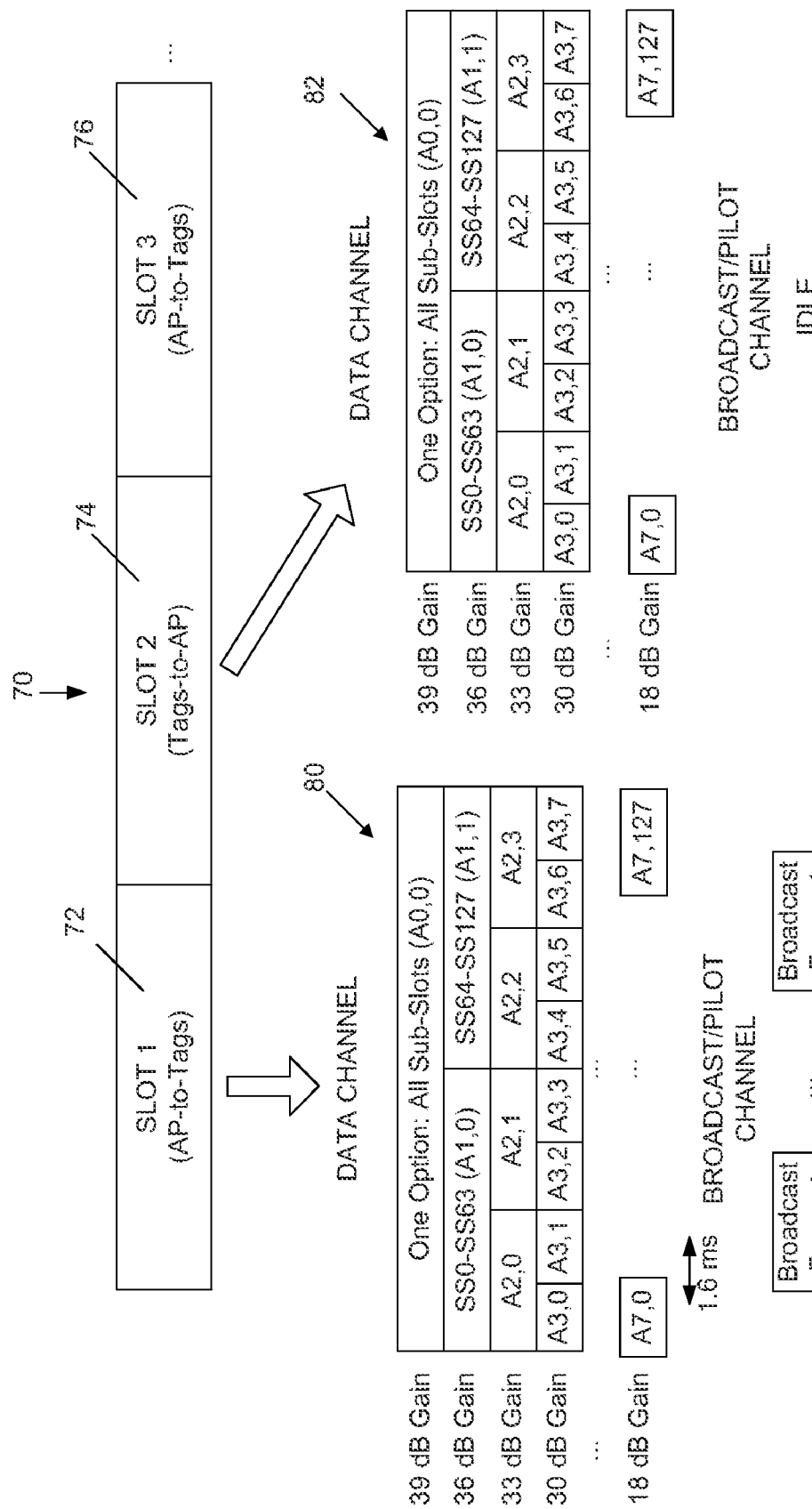
FIG. 7 is a diagram depicting slot structures and assignments in a representative embodiment.

FIG. 7 illustrates slot structures and assignments. In at least one embodiment, data stream 70 includes slot 72, slot 74, and slot 76. Slot 72 is an AP-to-tags communication, slot 74 is a tags-to-AP communication, and slot 76 is an AP-to-tags communication. In a representative embodiment, each of the slots can have a duration of 2.1 seconds. Alternatively, any other duration may be used and/or different slots may have different durations. The data stream 70 can be implemented in a half-duplex communication scheme such that at any given time, either the AP is transmitting and the tags are receiving, or the tags are transmitting and the AP is receiving. In alternative embodiments, other communication schemes may be used. As shown in FIG. 7, data channel 80 depicts processing gain options for data in slot 72. If a data link closes at a particular gain, the tag only needs to be ready to receive (in AP to tags mode) during the duration of the slot with the corresponding gain. In transmit mode, the slot selection governs the transmission from the tag to the access point such that the tag can minimize its on time in the power consuming transmit mode. For example, a gain of 18 dB only needs a 1.6 ms slot ($A_{7,0}$). Data channel 82 depicts processing gain options for data in slot 74. As can be seen, the power used by a tag can be selected such that each data link arrives at the AP at the same power.

There is a symmetry between processing a large number of simultaneous waveforms on the AP side, and the processing of the relative few waveforms on the tag side. Automatic frequency control (AFC), time-tracking drift, and frame timing are known on the AP side due to the fact that the AP is the master of these parameters. However, AFC, time-tracking drift, and frame timing may be determined at acquisition on the tag side. The PN array despreader performs the brute force operation associated with both, which is an efficient implementation for exploring acquisition hypothesis/demodulating. Another aspect of this is that this large power-consuming circuit (when active), though running continuously on the AP (which shouldn't matter because it can be plugged into the wall), is only running during a "cold" acquisition on the tag which should happen rarely. Cold acquisition and warm acquisition are described in more detail with reference to FIGS. 10 and 11, respectively.

Figure 8:
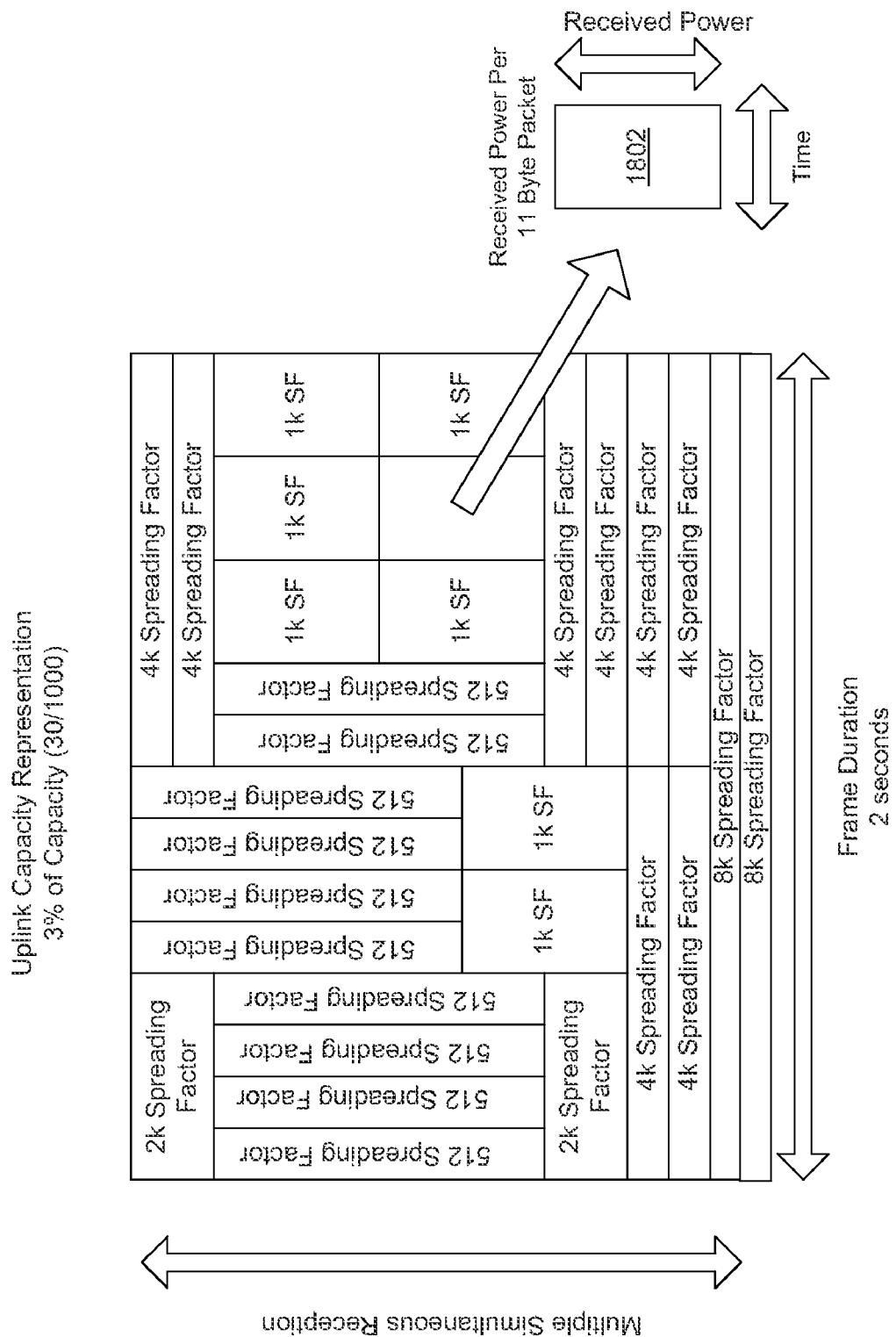
FIG. 8 is a diagram depicting frequency usage in a partially loaded RPMA system.

FIG. 8 is a diagram depicting frequency usage in a partially loaded RPMA system. The vertical axis in the diagram shows received power, as well as which packets are received simultaneously. The horizontal axis shows time and indicates a frame duration. Many individual packets are shown, each labeled with their spreading factor. The energy in the packet is just the power times time. In this example, an energy received at an access point of each individual packet, such as packet 1802, is equal to every other, and is represented by identical areas covered by other packets. This diagram shows uplink capacity at 3% usage, though other usages are possible. For example, the uplink capacity may be more lightly loaded at 1% usage or more heavily loaded at 75% usage. Packet 1802 shown is an example packet of 11 bytes, though other sizes are possible. Frame duration in this example is 2 seconds, though other durations are possible. Frame duration depends on spreading factor, so, for example, a frame duration of 1 second, 4 seconds, or many other durations are possible. Spreading factors listed are representative of many possible spreading factors that work with this system. Random time offsets are a relatively small part of each transmission and are not shown.

Figure 9:
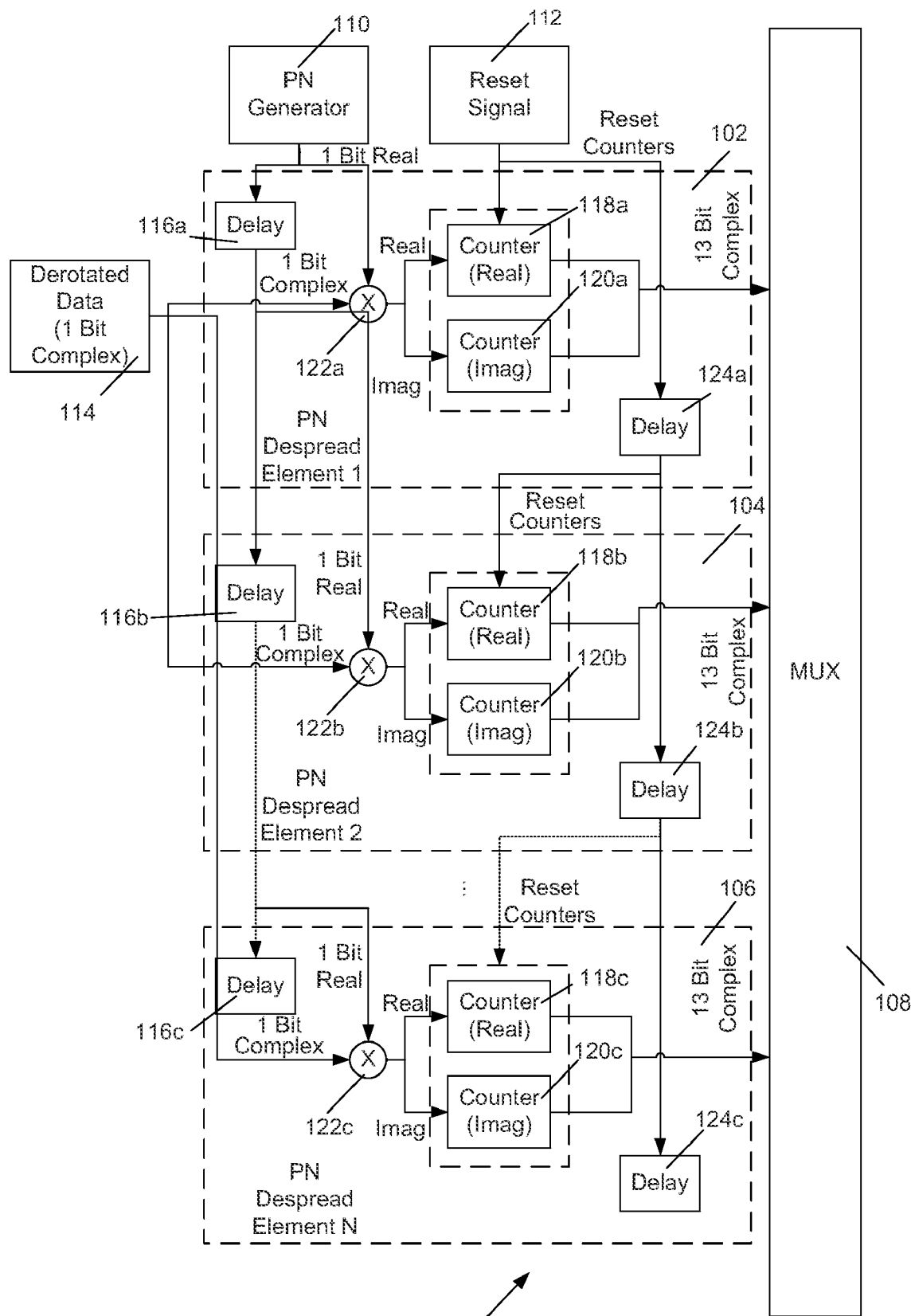
FIG. 9 is a diagram depicting a pseudo-noise (PN) despread array in a representative embodiment.

FIG. 9 illustrates a PN (pseudo-noise) despread array, which facilitates both the acquisition of a single waveform on the tag, and brute-force demodulation of multiple waveforms on the AP. In a representative embodiment, the PN despread array can perform a 1 bit dot product of many chip-spaced timing hypotheses simultaneously.

A PN despread core element can be a simple counter that is incremented or not incremented each clock depending on whether the input is a 0 or a 1. Since it is a complex data path, there are two counters: one for I (in-phase) and one for Q (quadrature-phase). Multiplication by a complex exponential is generally a set of 4 rather large scalar multipliers (4×1000 gates is typical) coupled to a complex exponential table. In contrast, a one bit complex multiplier is basically a simple truth table, such as the example table shown below, where the negative denotes the inverse (0→1 and 1→0). This truth table can be implemented using just a few gates.

| Phase | 0 | 1 | 2 | 3 |
|---|---|---|---|---|
| I' | I | −Q | −I | Q |
| Q' | Q | I | −Q | −I |

FIG. 9 depicts a PN despread array 100. There can be many instantiations (e.g., 256 or more in one embodiment) of pairs of counters for the complex despread operation. The PN despread array 100 can be fed at chip rate with adjacent instantiations of PN despread elements 102, 104, and 106 working on timing hypotheses that are a chip apart. The 1 bit complex data is sent from a block 114 to elements 102, 104, and 106 where it is combined with a PN signal from PN generator 110. PN signal generator 110 can be hardware that outputs the same sequence of 0s and 1s with which the AP is spreading the data. In the case of element 102, the derotated data is combined (more specifically, 1 bit complex multiplied) with the PN signal at a combiner 122a. Real and imaginary parts of this combination are separately input into counters 118a and 120a. The counters 118a and 120a shift the bit stream out upon receipt of a reset signal 112. More specifically, the data in the counters is valid just prior to the reset signal. The reset signal forces zeros into both counters. The multiplexer 108 allows for output of the currently valid counters for that finger that has uniquely finished its despreading operation at that particular clock. Other elements in the PN despread array 100 operate similarly. Element 104 receives derotated data from block 114 and combines it with a PN signal after a delay is imposed by delay block 116a in element 102. The combination is entered into counters 118b and 120b, which gets shifted out of the counters upon a signal from the reset signal 112 with an imposed delay from a delay block 124a. Likewise, element 106 receives derotated data from block 114 and combines it with a PN signal after a delay is imposed by delay block 116b in element 104. The combination is entered into counters 118c and 120c, which gets shifted out of the counters upon a signal from the reset signal 112 with an imposed delay from a delay block 124b.

After a number of clocks corresponding to the spreading factor, the PN despread element 102 has valid data which is selected for output by a multiplexer 108. Every clock thereafter, the adjacent despread element 104 or 106 is available until all data has been output which can occur during the number of clocks corresponding to the spreading factor plus a number of PN despread instantiations. The PN code that governs the operation of this mechanism can be a gold code parameterized by a value. In alternative embodiments, other PN codes may be used.

Figure 10:
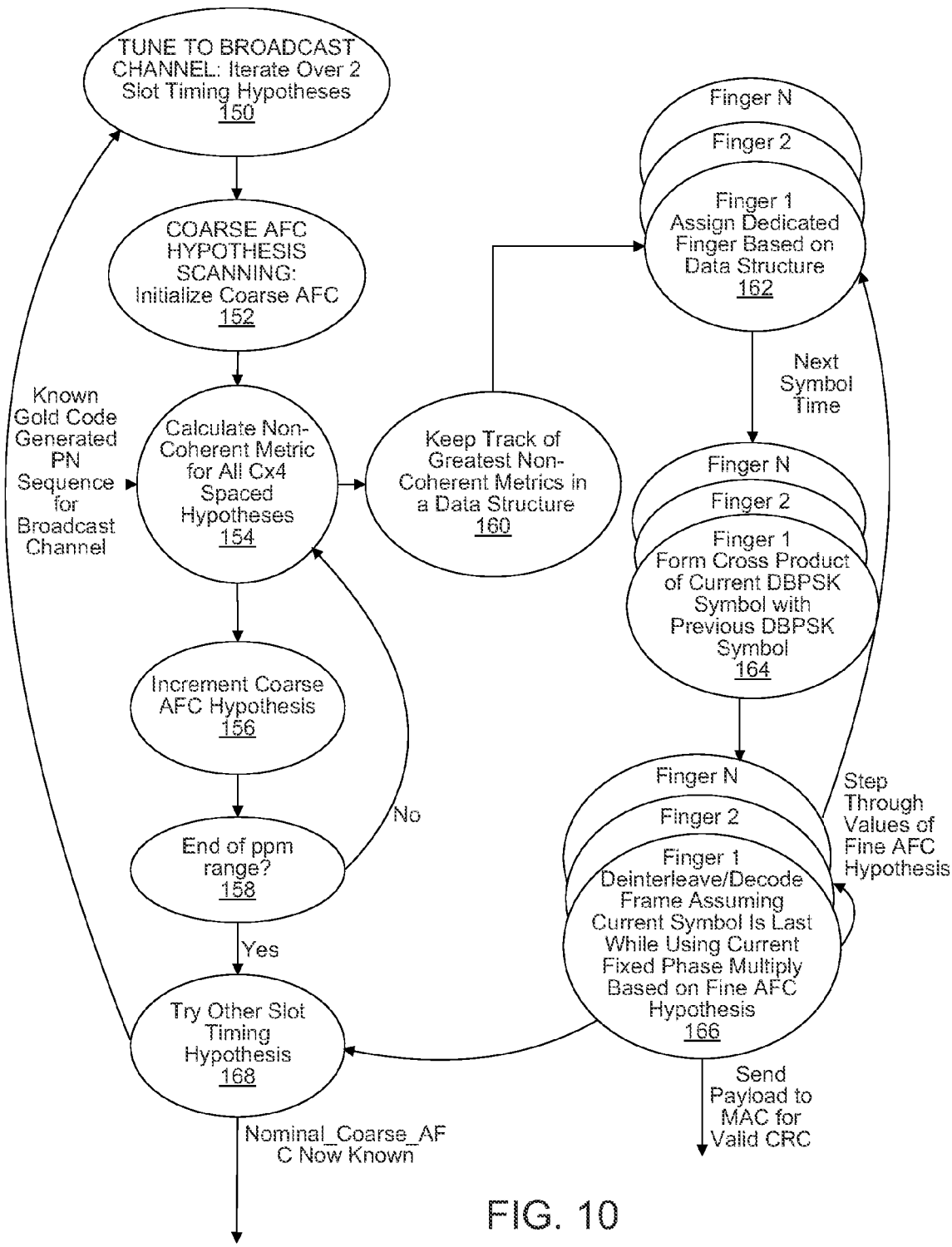
FIG. 10 is a flow diagram depicting operations performed in the tag processing of a broadcast channel from a cold start in a representative embodiment.

FIG. 10 illustrates operations performed in the tag modem processing of a broadcast channel to demodulate the access point's transmit waveform. Additional, fewer, or different operations may be performed depending on the particular embodiment. The operations may also be performed in a different sequence than that shown and described.

Upon the initial power-up of the tag, no parameters are known regarding the waveform except for the broadcast channel PN sequence (e.g., the particular gold code or other code parameter). Additionally, the tag may not know with sufficient precision what the relative frequency offset is between the AP and the tag due to oscillator variance between the AP and the tag. FIG. 10 depicts a scanning mode where the range of uncertainty of parts-per-million (ppm) drift between the AP and the tag are explored. In an operation 150, an iteration is made over two slots to enable the tag to tune to a broadcast channel. For example, processing can begin asynchronous to slot timing. During exploration of one half of the hypotheses, the broadcast channel can be active, and during exploration of the other half of the hypothesis the broadcast channel can be inactive. In a first iteration, all hypotheses can be explored using a first slot timing with an asynchronous starting point. If no energy is found in the first iteration, a second iteration is performed. In the second iteration, the asynchronous starting point can have a one slot offset from the asynchronous starting point used in the first iteration. As such, hypotheses that were explored while the broadcast channel was active can be explored while the broadcast channel is active. Once the energy is found, the tag can tune to the broadcast channel. In a representative embodiment, operation 150 can represent a starting point for 'cold acquisition.' In an operation 152, a coarse automatic frequency control (AFC) is initialized. In one embodiment, this initial value is set to a most negative value such as −10 ppm offset. Using a known gold code generated PN sequence for the broadcast channel, in an operation 154, non-coherent metrics for all C×4 spaced hypotheses for a given coarse AFC hypothesis are calculated. For example, if the spreading factor has a length of 2048, the non-coherent metric for 8192 hypotheses can be calculated.

In operations 156 and 158, the coarse AFC hypothesis is incremented until the end of the ppm range. For each coarse AFC hypothesis, the hardware depicted in FIG. 4 is used to undo the frequency offset represented by the current hypothesis. The PN despread array is used to generate the despread output of 8 successive symbols. Alternatively, other numbers of symbols may be used. A non-coherent sum of these 8 symbols is then calculated. A set of N (8 in the one embodiment) top metrics along with their associated parameters are maintained in a data structure. As the flowchart of FIG. 10 indicates, the entire range of oscillator ppm uncertainty along all the timing hypotheses at chip×4 resolution are explored with the expectation that the winning (i.e., valid) one will be represented in the data structure. Along with the most valid hypothesis there generally tends to be lesser multi-path reflections, adjacent AFC coarse frequency hypotheses where appreciable energy accumulation is still present, as well as entirely invalid hypotheses that have generated anomalously large metrics due to noise variance.

The non-coherent metrics for all chip×4 timing hypotheses for each coarse AFC can be communicated to a data structure. In an operation 160, the data structure keeps track of the greatest non-coherent metrics (e.g., coarse AFC value, chip×4 timing hypothesis, non-coherent metric value). The "finalists" are assigned to the N dedicated fingers in an operation 162. Each finger may be uniquely parameterized by a chip×4 timing value and a coarse AFC hypothesis which is independent of the current coarse AFC hypothesis governing the PN despread array. Since frame timing is initially unknown, each despread symbol that is output by the dedicated finger is hypothesized to be the last in the frame. Thus, the buffered 256 symbols undergo differential demodulation and an additional set of iterations based on multiplying by a constant complex value to perform fine AFC correction, as shown in operations 164 and 166. An output of operation 164 can be a complex cross product from each dedicated finger. In operation 166, a symbol-by-symbol multiplication by a constant complex rotation (as determined by the fine AFC hypothesis) can be iteratively applied to a postulated frame of information to determine which (if any) of the selection of complex rotation constant values uncovers a frame which passes a cyclic redundancy check (CRC). This can be a brute-force operation where a cyclic redundancy check (CRC) may be performed for each hypothesis. For any valid CRC, a payload from the signal can be sent to MAC, and network parameters can be considered to be known.

In an operation 168, other slot timing hypothesis are tried. In a representative embodiment, the coarse AFC hypotheses associated with the most successful CRCs can be nominal starting coarse AFC hypotheses. Once the entire range of coarse AFC hypothesis are explored, the tag notes a variable called Nominal_Coarse_AFC which is the relevant state information used in future transactions which greatly narrows the range of coarse AFC hypothesis searches because the part-to-part variation of oscillator ppm deviation is much larger than the oscillator drift over the coarse of a minute or so.

Figure 11:
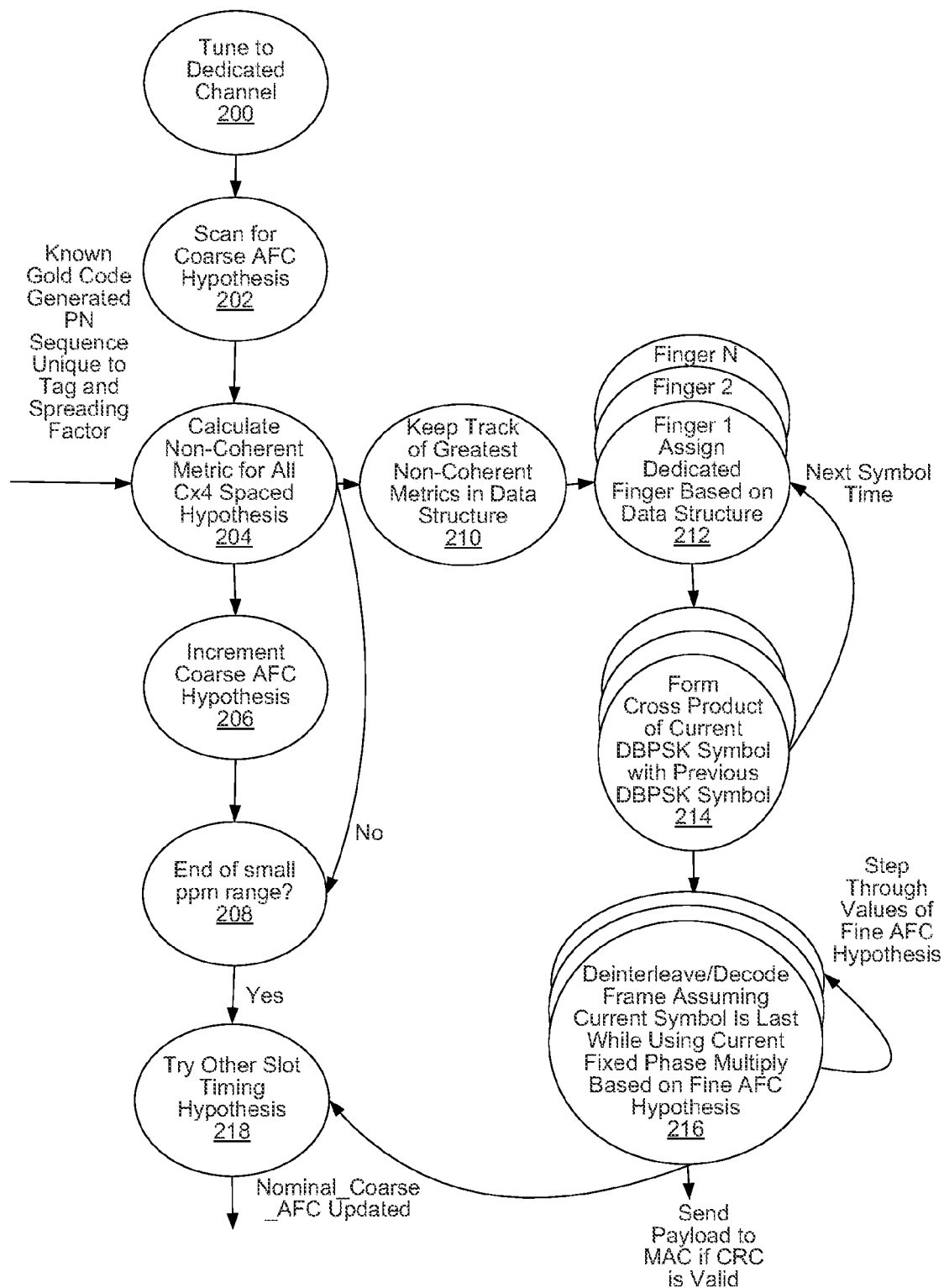
FIG. 11 is a flow diagram depicting operations performed in the tag processing of a dedicated channel from a warm start in a representative embodiment.

FIG. 11 illustrates operations performed in the tag processing of a dedicated channel from a warm start which is to say where relevant state information is known. For example, frame timing can be known and a much tighter range of coarse AFC hypothesis may be explored. The modem begins its processing sufficiently early so that valid finger assignments are made prior to the end of the 9 symbol preamble. Alternatively, any other number of symbols may be used.

In an operation 200, there is no need to iterate over a two slot timing hypothesis because the frame timing is known. Instead of using a broadcast channel, a dedicated channel is used. In an operation 202, a coarse AFC hypothesis is scanned. In a representative embodiment, the coarse AFC can be scanned over a small range to account for small frequency drift since the last time accessed. Using a known gold code generated PN sequence unique to the tag, in an operation 204, a non-coherent metric for all chip×4 spaced hypotheses is calculated. In operations 206 and 208, the coarse AFC hypothesis is incremented until the end of the small ppm range. In an operation 210, a data structure keeps track of the greatest non-coherent metrics (e.g., coarse AFC value, chip×4 timing hypothesis, non-coherent metric value, etc.) In an operation 212, dedicated fingers are assigned based on the data structure. In an operation 214, symbol cross products are created using current DBPSK and previous DBPSK. An output of operation 214 can be a complex cross product from each dedicated finger. In an operation 216, frames are interleaved and decoded. For any valid CRC, the payload can be sent to a medium access control (MAC) layer. In an operation 218, other slot timing hypothesis are tried. In a representative embodiment, coarse AFC hypotheses associated with the most successful CRCs can be nominal starting coarse AFC hypotheses.

Figure 12:
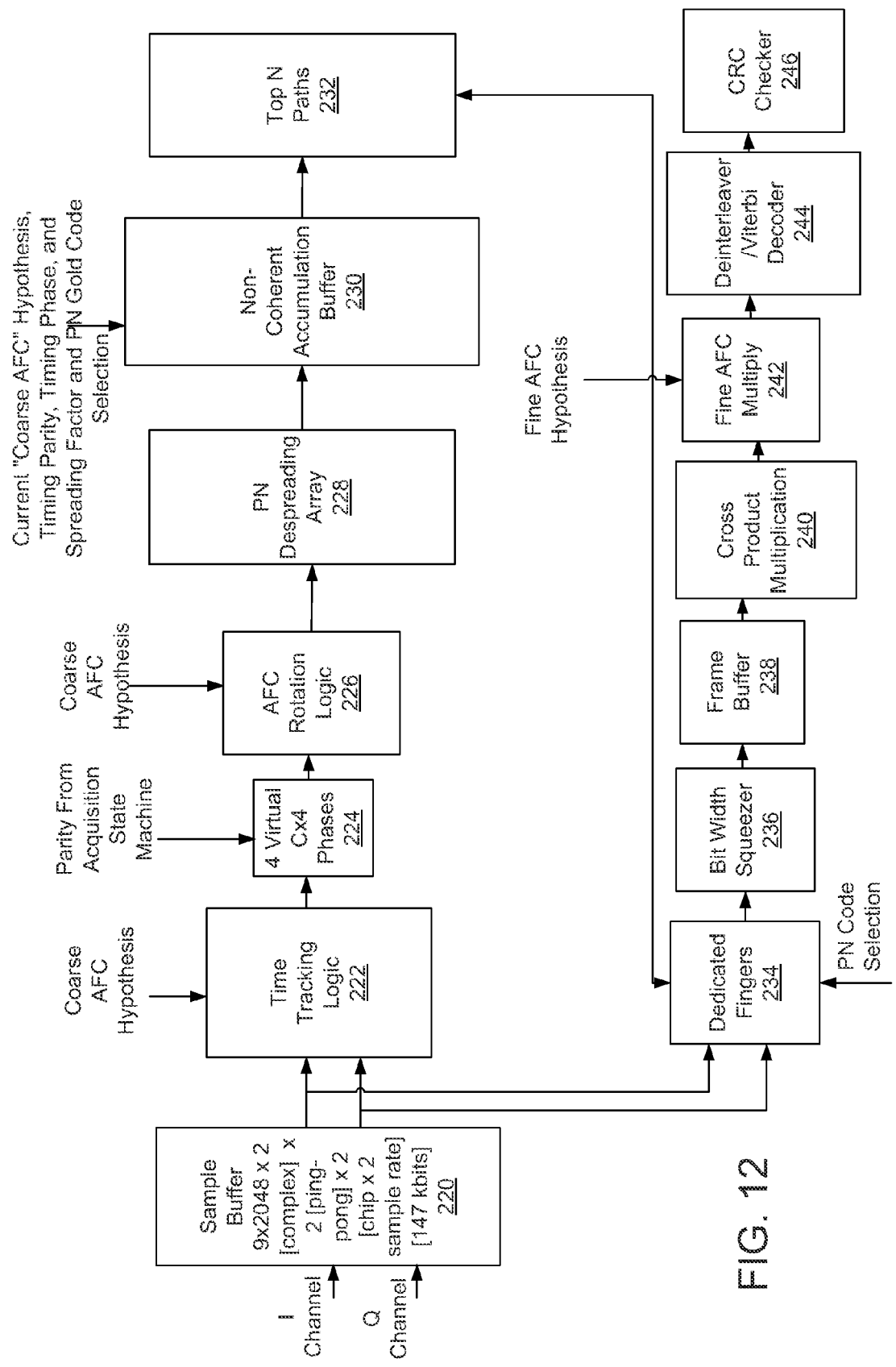
FIG. 12 is a diagram depicting a tag receive data path in a representative embodiment.

FIG. 12 illustrates a tag receive data path depicting the tag's demodulation processing in accordance with a representative embodiment. As shown, the one-bit complex samples are buffered in a sample buffer 220 such that enough data is present to make reliable detection of valid energy. Representative values are provided in the sample buffer block 220. For example, one embodiment buffers 9 symbols. In alternative embodiments, other values may be used. The samples may be input from the I channel and Q channel into this ping-pong buffer scheme at the synchronous sample rate of chip×2 or 2 MHz. Alternatively, other rates may be used. At the fast asynchronous clock, these samples are used to explore the various coarse AFC hypothesis. Based on the current coarse AFC hypothesis, time-tracking is performed at chip×4 resolution. Since the same timing reference is used to drive both the carrier frequency and the sample clocks on both the AP and the tag, a coarse AFC hypothesis with a known carrier frequency can uniquely map to a known rate of time tracking.

The sample buffer 220 receives communication signals over the I channel and the Q channel. These signals are sent to time tracking logic 222 and dedicated fingers 234. The time tracking logic 222 also receives a coarse AFC hypothesis and the logic 222 may reset to zero at chip×4 parity. The time tracking logic 222 can have two blocks, one with counters initialized to zero for even chip×4 parity, and one with counters initialized to midrange (i.e., 2^25) for odd chip×4 parity. The output of time tracking logic 222 is provided to a block 224 in which virtual chip×4 phases are applied. Block 224 also can receive parity from an acquisition state machine. Automatic frequency control (AFC) rotation logic 226 is applied to an output of block 224.

Figure 13:
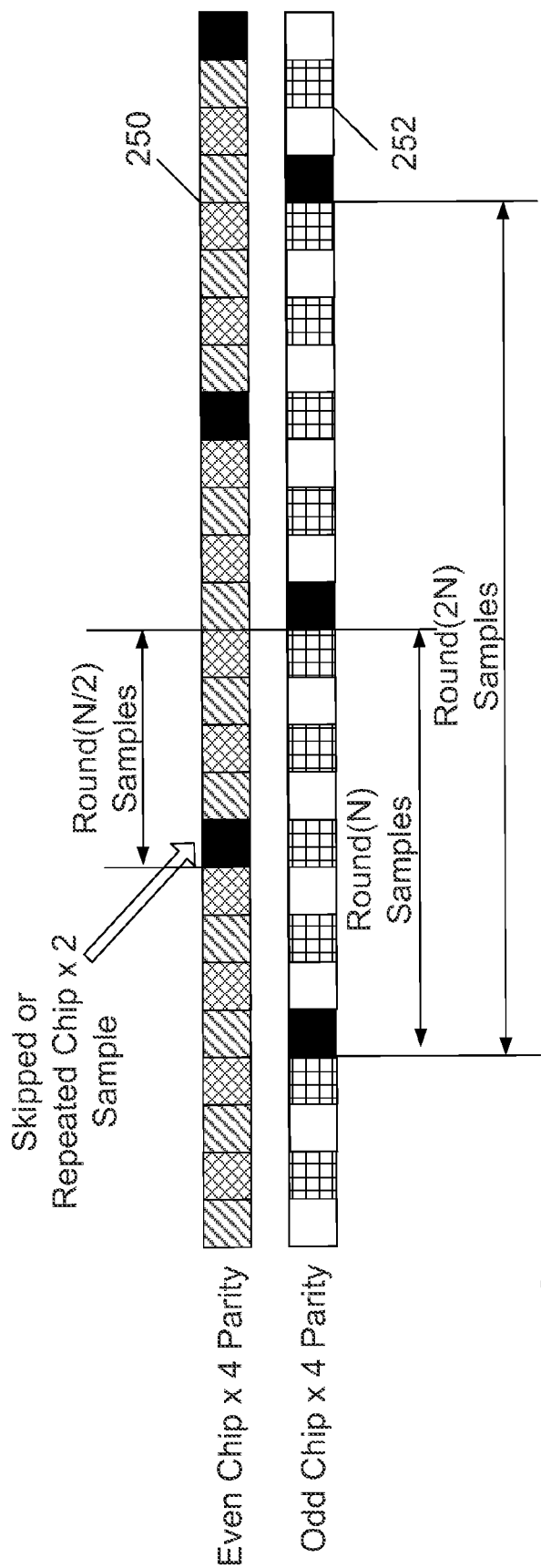
FIG. 13 is a diagram depicting time tracking in a representative embodiment.

FIG. 13 illustrates a representative embodiment of the two blocks of time tracking logic 222 described with reference to FIG. 12. Stream 250 is a communication stream with an even chip×4 parity. Stream 252 is a communication stream with an odd chip×4 parity. FIG. 13 depicts the time-tracking operation where each different shading represents a different chip×4 spaced sequence. Samples are either inserted or repeated at a rate directly depending on which current AFC hypothesis is being explored, multiplied by a known ratio between the sample rate and the carrier frequency. This can be used as a locked clock assumption to collapse a 2-dimensional space down to a single dimension. The value N depicted has a fractional component which is book-kept to allow for sufficient time-tracking precision. A particular parity of the 4 possible chip×4 phases is selected at a given time. The resultant chip rate sequence is then derotated in a 1-bit data path as shown in FIG. 14.

Figure 14:
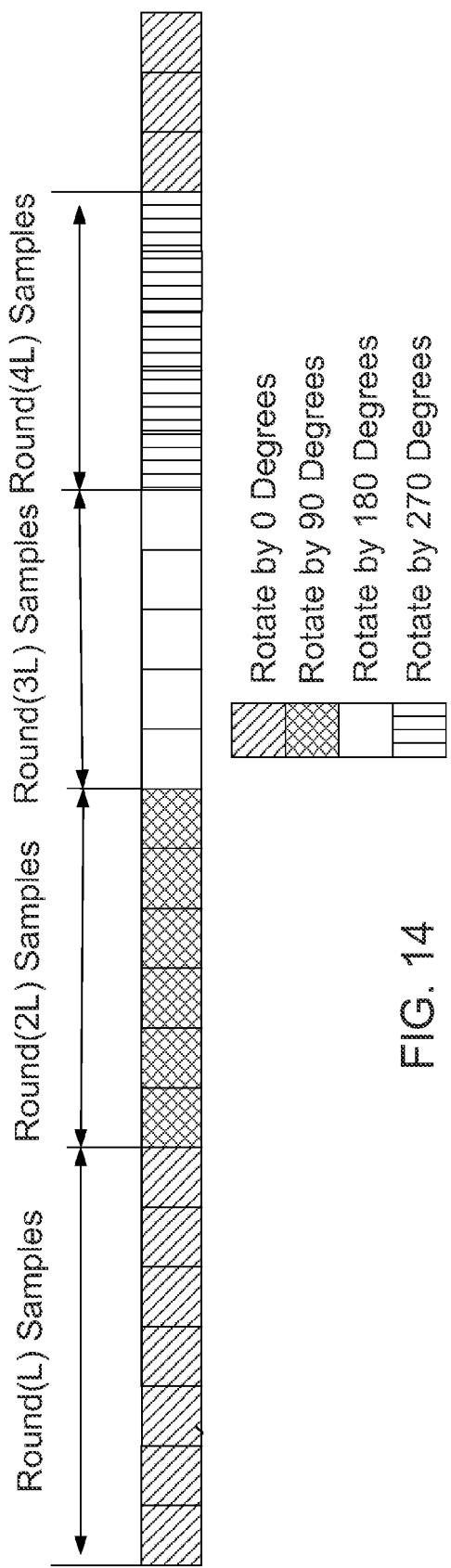
FIG. 14 is a diagram depicting an automatic frequency control (AFC) rotation in a representative embodiment.

FIG. 14 depicts the functionality of the AFC (automatic frequency control) rotation logic 226 of FIG. 12 which operates on one of the 4 virtual chip×4 phases 224 at a given time. FIG. 14 depicts a one-bit derotation mechanism. This derotation mechanism is designed to undo the AFC rotation due to the relative carrier drift between the receiver and transmitter for the postulated coarse AFC hypothesis. Since it's a one-bit transform (represented by the truth table illustrated above), the 90 degree resolution of the process is +/−45 degrees relative to the continuum of values of the phase due to the AFC drift from the relative oscillator offset.

The AFC rotation logic 226 can also receive coarse AFC hypotheses as an input. The PN despreading array 228 (FIG. 12) performs its despread operation for chip spaced hypothesis. The PN despreading array 228 may receive current coarse AFC hypotheses, timing parity, timing phase, spreading factor, and/or gold code selection as inputs. As the values are output for a given symbol, the sum is non-coherently accumulated for better metric reliability with the running sum stored in the non-coherent accumulation buffer 230. The size of the buffer is based on the number of despread elements. In a representative embodiment, the PN dispreading array 228 may have 256 despread elements such that a pass through the sample buffer completes the non-coherent metric for 256 hypotheses. Alternatively, other numbers of despread elements may be used, and the metric may be completed for other numbers of hypotheses. A signal-to-noise ratio (SNR) metric may be used in transmission power control of the tag and for power control feedback to the AP. The hypotheses with the largest metrics are stored in a top N path data structure 232 which is used to control the assignment of the dedicated fingers 234. The top N paths can be N records including timing hypotheses, timing parity, coarse AFC hypotheses, etc.

Figure 15:
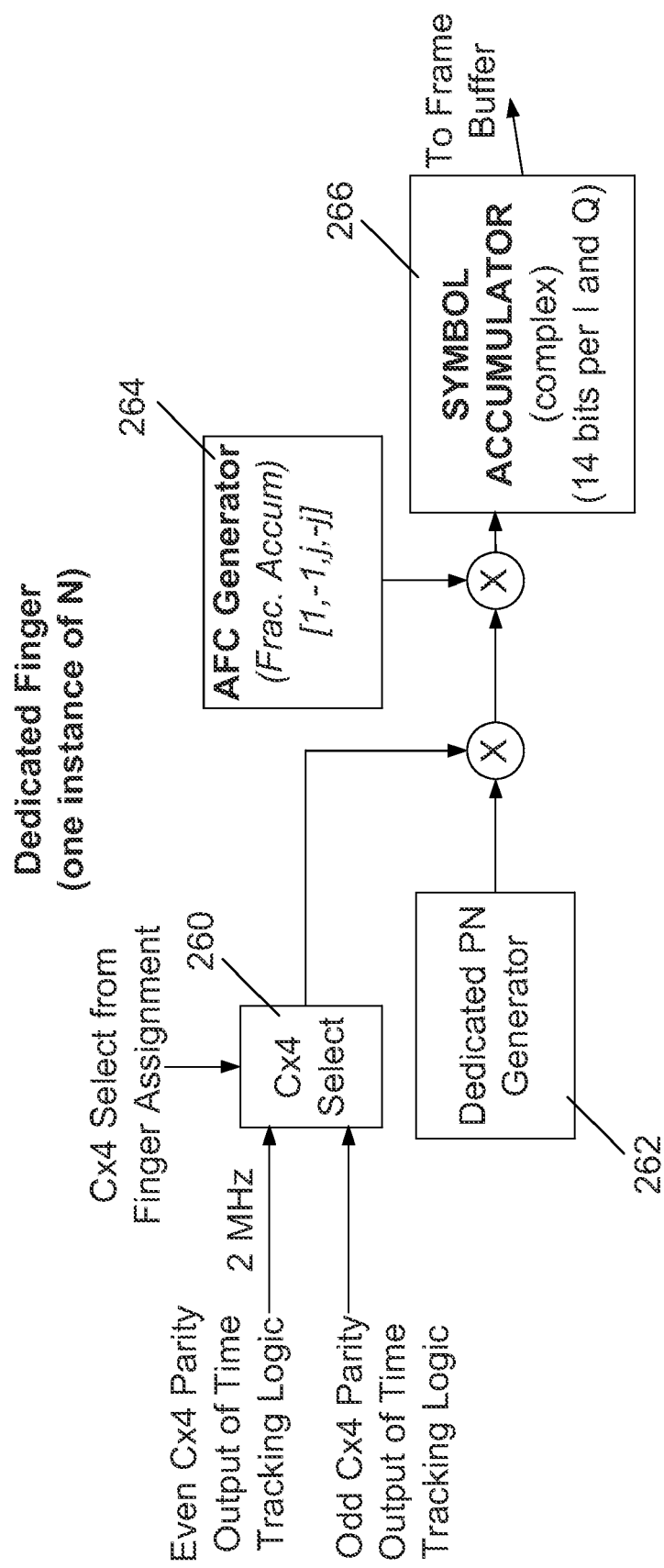
FIG. 15 is a diagram depicting a dedicated communication finger in a representative embodiment.

FIG. 15 illustrates a dedicated communication finger. Each dedicated finger has access to each of the 4 phases of chip×4 samples with a chip×4 selector 260 set as part of the parameters of the finger assignment. Each finger has its own dedicated PN generator 262 and AFC generator 264 which is used to despread. The dedicated finger accumulates into the symbol accumulator 266 based on the coarse AFC hypothesis, its chip×4 timing phase, the dependent variable of time-tracking rate, and then outputs a complex variable every spreading factor number of clocks. The dedicated fingers 234 illustrated with reference to FIG. 12 can also receive inputs from the sample buffer 220, and a PN code selection.

Referring again to FIG. 12, the output from the dedicated fingers 234 goes through a bit-width squeezer 236 that reduces the bit-widths for efficient storage in the frame buffer 238 without sacrificing performance. The output from the bit-width squeezer 236 is provided to the frame buffer 238, which may be a circular buffer mechanism which allows for the general case of processing a 256 symbol frame as if the current symbol is the last symbol of the frame. When frame timing is known, this memory structure can support the specific processing of a frame with the known last symbol.

Frame buffer 238 outputs the hypothesized frames to the rest of the receive chain. A cross product multiplication block 240 performs the multiplication of the current symbol with the complex conjugate of the previous symbol which is the conventional metric for D-BPSK demodulation. A residual frequency drift may cause the D-BPSK constellation to be rotated by a fixed phase. The role of the fine AFC multiply block 242 is to take a brute-force approach and try different possible phase rotations such that at least one fine AFC hypothesis yields a valid CRC as it passes through a de-interleaver and viterbi decoder 244. The fine AFC multiply block 242 can also receive fine AFC hypotheses as inputs. The output from the de-interleaver and Viterbi decoder 244 is provided to a CRC checker 246. If the CRC is valid, the payload is sent up to the MAC layer.

Figure 16:
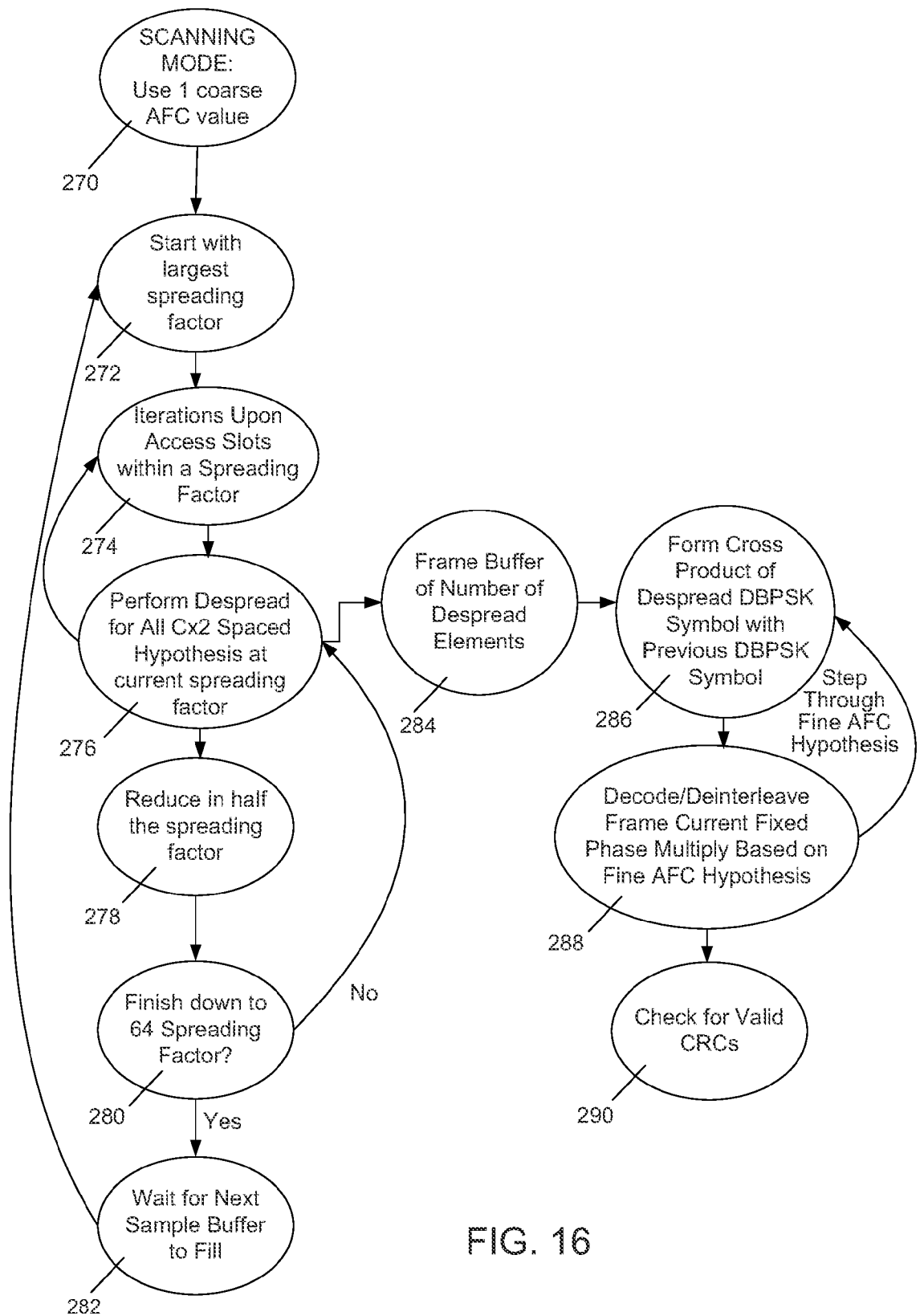
FIG. 16 is a flow diagram depicting operations performed during access point receive processing in a representative embodiment.

FIG. 16 depicts representative operations performed during access point receive processing. Additional, fewer, or different operations may be performed depending on the embodiment. Further, the operations can be performed in a different order than that which is described here. The AP performs a brute-force operation checking all possible chip×2 timing hypothesis, spreading factors, and access slots within spreading factors. This allows for uncoordinated access by the tag. Fortunately, since the AP is the master of frame-timing and AFC carrier reference (all tags can compensate both their carrier drift and sample clock to meet the AP's timing), the processing burden on the AP is drastically reduced since the AP need not explore the dimensionality of coarse AFC hypothesis or unknown frame timing.

The flowchart of FIG. 16 shows an example of the ordering of iterating upon all possible chip×2 timing offset, spreading factors from the set [8192, 4096, . . . , 64], and access slot numbers for spreading factors less than the maximum. The AP then performs the similar fine AFC search that the tag performs to allow for a small amount of frequency drift between the timing sources of the tag and the AP to occur since the last transaction. All valid CRCs are passed up to the MAC layer. The flowchart of FIG. 16 illustrates the searching of a multi-dimensional space. In an outermost loop, all possible spreading factors are searched. In a representative embodiment, there may be 8 spreading factors [64, 128, 256, 512, 1024, 2048, 4096, 8192]. Alternatively, other spreading factors and/or numbers of spreading factors may be used. In a second loop, all possible sub-slots for a given spreading factor are searched. For example, there may be 128 possible sub-slots for a 64 chip spreading factor and a single degenerate sub-slot for a 8192 chip spreading factor. In a third loop, all possible chip×2 timing phases within a given sub-slot are searched. As described in more detail below, the various loops are illustrated by the arrows in FIG. 16.

In an operation 270, one coarse AFC value is used. In a representative embodiment, the one coarse AFC value can be 0 since compensation is performed by the tags. In an operation 272, a largest spreading factor (e.g., 8192) is used as a starting point. In alternative embodiments, the largest spreading factor may be larger or smaller than 8192. In an operation 274, access slots are processed within a spreading factor. This process may be degenerate in the case in which there are 8192 spreading factors. In an operation 276, despreading is performed for all chip×2 spaced hypotheses at the current spreading factor. For example, 16,384 despread operations may be performed if the spreading factor has a length of 8192. Despread is performed for all elements unless the spreading factor is less than the frame buffer number (e.g., 256). In an operation 278, the spreading factor is reduced in half and processing continues. In an operation 280, a determination is made regarding whether the spread factor has been reduced to 64. In alternative embodiments, other predetermined values may be used. If the spread factor has not been reduced to 64 (or other predetermined value), processing continues at operation 276. If the spread factor has been reduced to 64, the system waits for a next sample buffer to fill in operation 282. Once the next sample buffer is filled in operation 282, control returns to operation 272. In an operation 284, a frame buffer of despread elements is obtained. In a representative embodiment, the frame buffer may be complete after 256 symbols are output from a single pass by the PN despread array. In one embodiment, for a 256 stage PN despread array, a pass through may produce 256 timing hypotheses each having 256 symbols. In alternative embodiments, the PN despread array may have more or fewer stages. A cross product of the current despread DBPSK symbol with the previous symbol is calculated in an operation 286. In one embodiment, the cross product may involve 256 symbols for up to 256 frames. Alternatively, other numbers of symbols and/or frames may be used. In an operation 288, the current frame is decoded and phase multiplied based on the AFC hypothesis. In an operation 290, CRCs are checked and for any valid CRC, the payload is sent out of the physical layer (PHY) and up to the medium access control (MAC). As an example, the CRCs may be checked for 256 times the number of fine AFC hypothesis for each pass of a 256 despread array. Upon completion of the process for a given slot, the process is performed for a subsequent slot as illustrated by the arrow from block 282 to block 272.

Figure 17:
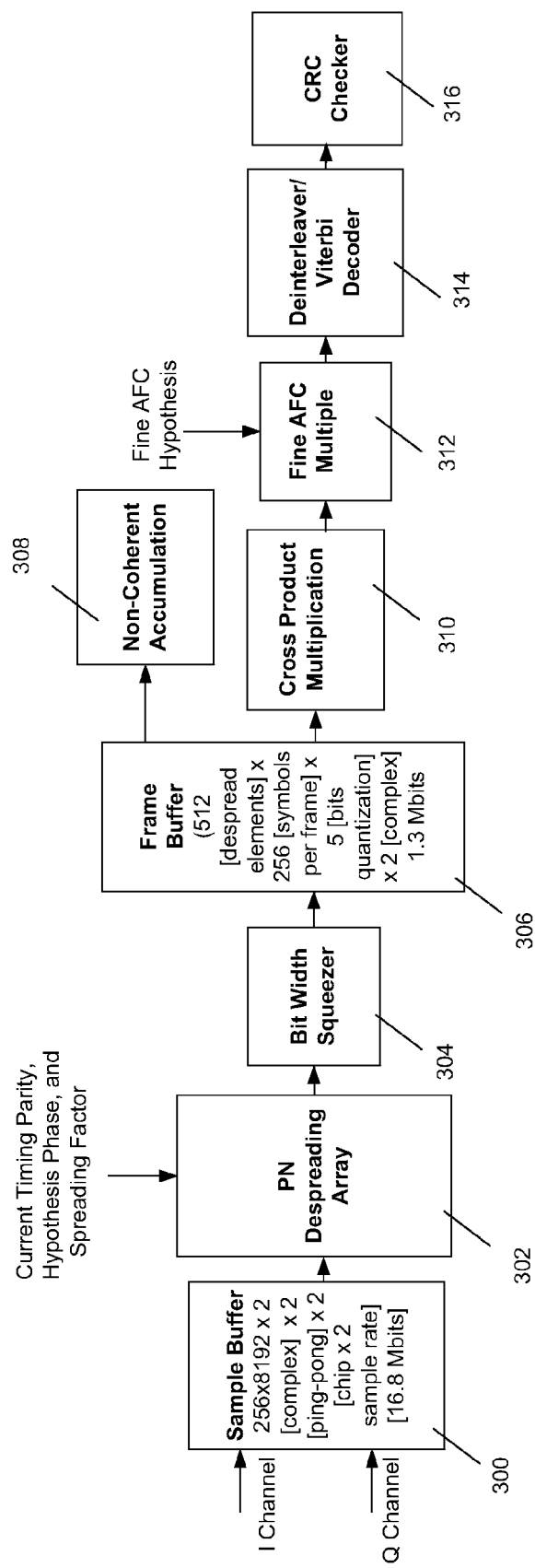
FIG. 17 is a diagram depicting an access point receive data path in a representative embodiment.

FIG. 17 depicts an access point (AP) receive data path. Unlike the tag, an entire frame at the largest spreading factor may be stored in a ping-pong buffer scheme in a sample buffer 300. This buffer scheme can be a substantial amount of memory (e.g., 16.8 Mbits) and in at least one embodiment, it may be stored in a dedicated off-chip memory device. The sample buffer block 300 includes representative values. In alternative embodiments, other values may be used. Unlike the tag, the time tracking logic and the AFC rotation logic may not be used since the AP is the master time reference. The sample buffer 300 passes frames to a PN despreading array 302, which can perform brute force testing as described previously herein. The PN despreading array 302 may include 256 despread elements. Alternatively, any other number of despread elements may be used. The PN despreading array 302 may also receive current timing parity (which may be chip×2 resolution only), hypothesis phase, and/or spreading factor as inputs. An output from the PN despreading array 302 is provided to a bit width squeezer 304. The bit width squeezer 304 reduces the size of the frames, which are then sent to a frame buffer 306. The frame buffer block 306 includes representative values. In alternative embodiments, other values may be used. Depending on the embodiment, the frame buffer 306 may also be stored in a dedicated off-chip memory device. The rest of the system is similar to the tag's receive processing where fine AFC hypothesis are iterated upon (operations 310 and 312) with all payloads with valid CRCs being passed up to the AP's MAC (operations 314 and 316). A non-coherent accumulation 308 is used to determine an SNR metric such as signal strength for use in transmission power-control feedback to the tag.

Figure 18:
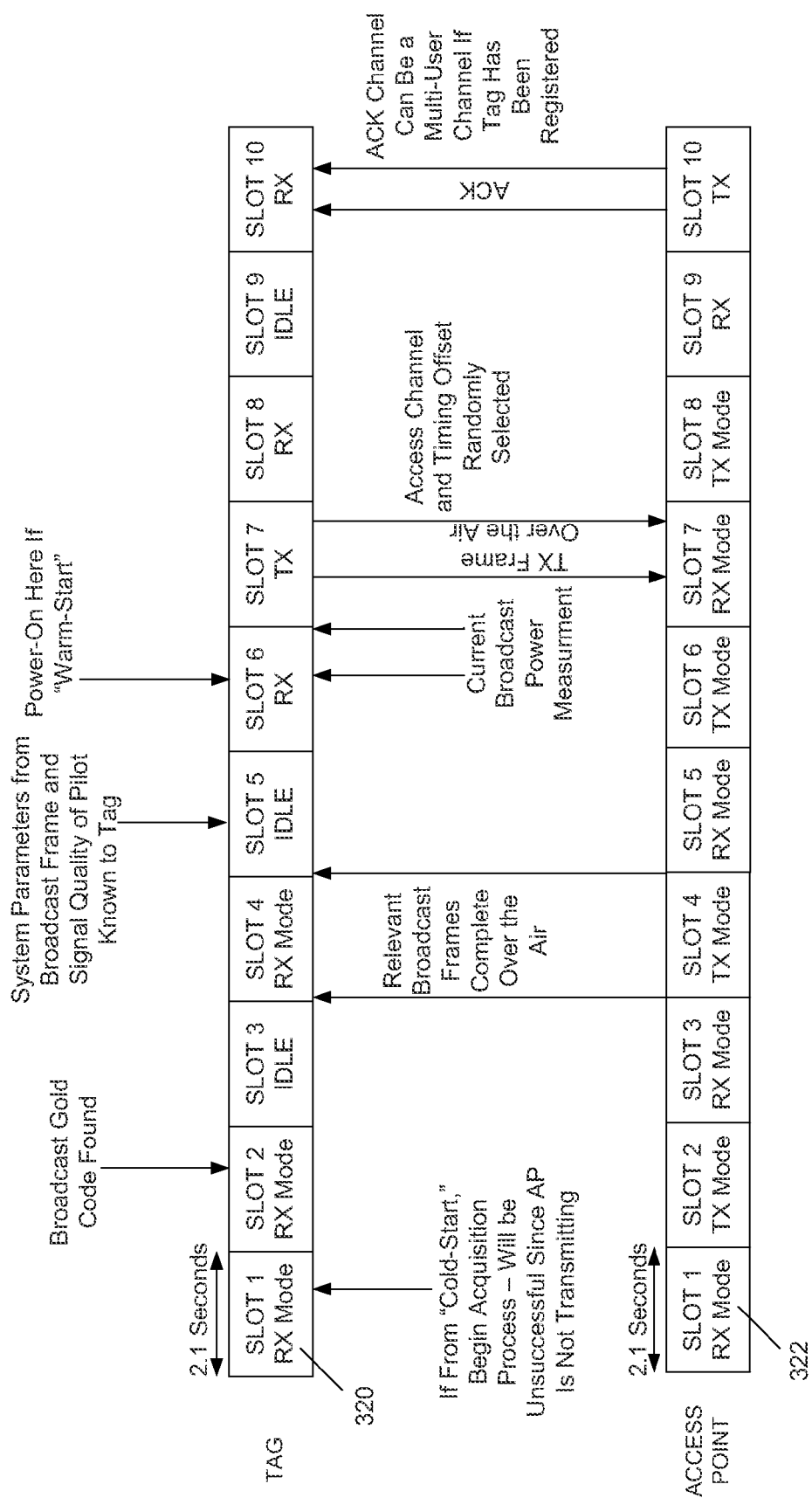
FIG. 18 is a diagram depicting asynchronous initial tag transmit operations in a representative embodiment.

FIG. 18 illustrates asynchronous initial tag transmit operations, including two types of interactions which result in data transfers from the tag to the AP. For purposes of illustration and discussion, slots 320 represent tag slots and slots 322 represent access point slots. "Cold Start" is where the tag is coming into the system without any relevant state information and "warm start" is where the tag is aware of the system information such as slot timing and a reduced range of coarse AFC hypothesis to explore.

In the "Cold Start" scenario, the tag begins seeking access at a slot-asynchronous point in time. FIG. 18 depicts a time where the tag begins attempting to acquire the broadcast channel when the AP isn't even transmitting it (slot 1). Eventually, the tag's processing explores the valid coarse AFC hypothesis during a period of time that the AP is transmitting the broadcast frame. FIG. 18 depicts this occurring during slot 2. At this point, the non-coherent energy metric causes a dedicated finger to explore the correct chip×4 timing and coarse AFC hypothesis. The finger with the correct hypothesis continually treats each new symbol as the last symbol of the frame and pushes these hypothesized frames through the receive chain where the CRC check indicates failure. At the end of slot 4, the valid frame timing is achieved as the CRC check indicates success. At this point, the tag has the same relevant state information that a tag entering at a "warm-start" would have and continues to complete the same processing that a "warm-start" tag would undergo.

A tag enters the interaction depicted in slot 6 ("Warm Start") either by a transition through a "Cold Start" procedure or directly upon tag wake-up if relevant state information is appropriately maintained. At this point, the tag makes a measurement of the received strength of the broadcast frame and uses this information to determine the transmit power and spreading factor that the tag subsequently transmits at in slot 7. The tag transmits it's message based on: 1) using the measured received broadcast channel signal strength and selecting the minimum spreading factor that can be used to close the link, which minimizes the tag's on time and is best for minimizing power consumption; 2) using the measured received broadcast channel signal strength and the formerly selected spreading factor, the tag transmits at the optimality condition of reception at the AP which is that all user's are received by the AP at very similar values of energy per bit to spectral noise density ratio (Eb/No); 3) for all but the maximum spreading factor, randomly selecting the slot access parameter j; and 4) randomly selecting the chip offset value from 0 to spreading factor −1 such that "collisions" at the AP are minimized and random selection at each transmission allows "collisions" to be resolved in subsequent transmission opportunities.

During slots 8 and 9, the AP processes all the signals received during slot 7 and sends a positive acknowledgement back during slot 10. The AP either aggregates several ACKs into a single channel characterized by a gold code, or sends a dedicated message to the tag using its dedicated gold code channel. Note that the former method requires some registration procedure (not shown) to assign the channel. In either case, the tag updates its chip×4 timing using the preamble of the message.

Figures 19, 20:
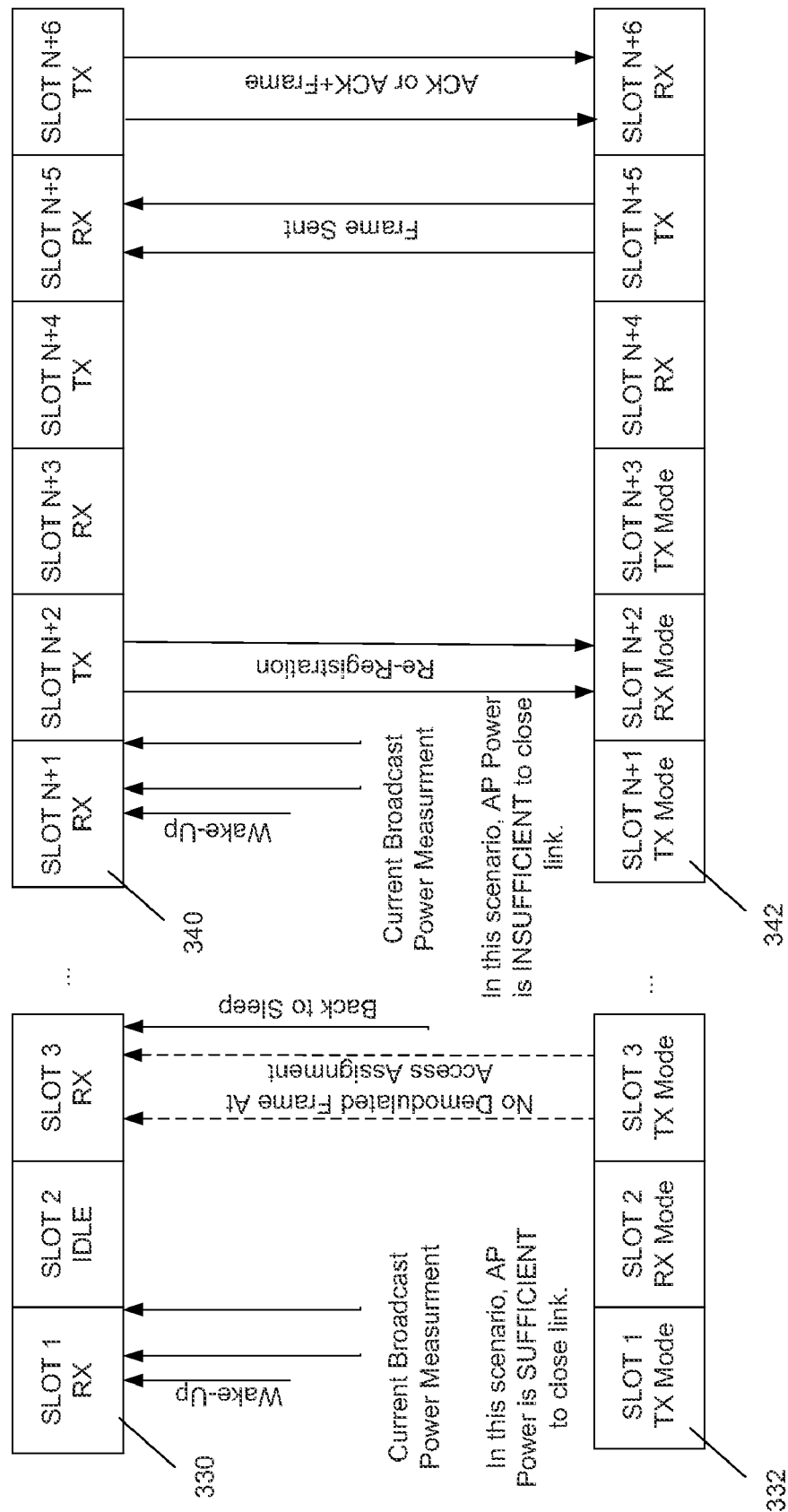
FIG. 19 is a diagram depicting interactions between an access point and a tag in a slotted mode according to a representative embodiment.
FIG. 20 is a diagram depicting data transfer between an access point and a tag according to a representative embodiment.

FIG. 19 illustrates a simple interaction between an access point and a tag in a slotted mode. In a representative embodiment, the simple interaction involves no data for the tag and a relatively static channel. For purposes of illustration and discussion, timeline 330 represents tag processing during the slots and timeline 332 represents access point processing during slots. The nature of the system is that the tag spends a maximum possible time in a low-power state—a state where system timing is maintained via a low-power, low-frequency crystal oscillator which is typically 32 kHz. To support this, a maximum tolerable latency upon AP initiated interaction is identified (i.e., this is the rate cycling in and out of the low power state for the tag to check if any AP action is pending). FIG. 19 shows the relatively simple interaction of a tag coming out of it's low power state to check if the AP is wanting to initiate a transaction. This occurs at a slot phase and rate agreed upon between the AP and the tag during registration.

The tag would typically enter a "warm start" where the frame timing and coarse AFC hypothesis are known to within a tight range. The tag makes a measurement of the received broadcast channel power. FIG. 19 shows the scenario where that power has not changed considerably since the last interaction with the AP. This means that the last transmit power/spreading factor that the AP transmitted at is sufficient to close the link. In slot 3, the tag attempts to acquire on the preamble and then demodulate the frame using its dedicated gold code. A typical scenario is the AP not having sent information and the tag immediately goes back to sleep.

FIG. 20 depicts a more detailed view of an interaction which involves data transfer and dynamically changing propagation between an access point and a tag according to a representative embodiment. For purposes of illustration and discussion, timeline 340 represents tag processing during the slots and timeline 342 represents access point (AP) processing during the slots. Here, the AP has information to send and the propagation of the channel has changed considerably since the last AP transaction. The current broadcast channel power measurement has changed such that the tag knows that the subsequent transmission would not be appropriate if it transmits at the same transmit power/spreading factor as last time. Thus, the tag will send a re-registration message using the protocol explained in FIG. 18 to alert the AP to use a new transmit power/spreading factor appropriate to the current channel conditions. The new information governs the transmission and reception of the frame occurring in slot N+5. The tag generates an acknowledgement (ACK) message governed by the protocol of FIG. 18 to indicate a successful transmission. If the ACK is successfully received, the transaction is considered complete. Otherwise, the tag attempts a retransmission.

In a communication system, gateways, access points, and nodes (also known as tags) can implement a Reed Solomon (RS) system as a forward error correction (FEC) system in a media access control (MAC) layer. In the RS system, a transmitter creates encoded data from a signal that includes N bytes, where K of the bytes are systematic data bytes and a remainder (N−K) of the bytes are parity bytes. Systematic data bytes are identical to the signal that is encoded. Parity bytes are encoded from the systematic data bytes. Specific values of the N and K parameters are implementation specific and may be tuned based on signal conditions. In one example, K is 71 bytes and N is 255 bytes, but other combinations are possible depending on how the system is tuned. For example, in a noisier environment, a system may be designed where K is 20 bytes and N is 255 bytes. In a less noisy environment, a system may be designed where K is 200 bytes and N is 255 bytes. Tuning may be done during system configuration or may be performed dynamically while the system is operating.

An erasure based system of the RS system may be used to improve a total number of bytes that may be corrected with a given number of encoded bytes as known to those of skill in the art. In the erasure based system, a receiver corrects bytes which are erasures within a particular RS codeword. An erasure is a byte that was not received. A byte may not be received either due to an error during reception or because the byte was not transmitted. Using the erasure based system, the receiver may correct (N−K) bytes for every N bytes that have been received. Without the erasure based system, the receiver may correct ((N−K)/2) bytes.

Figure 21:
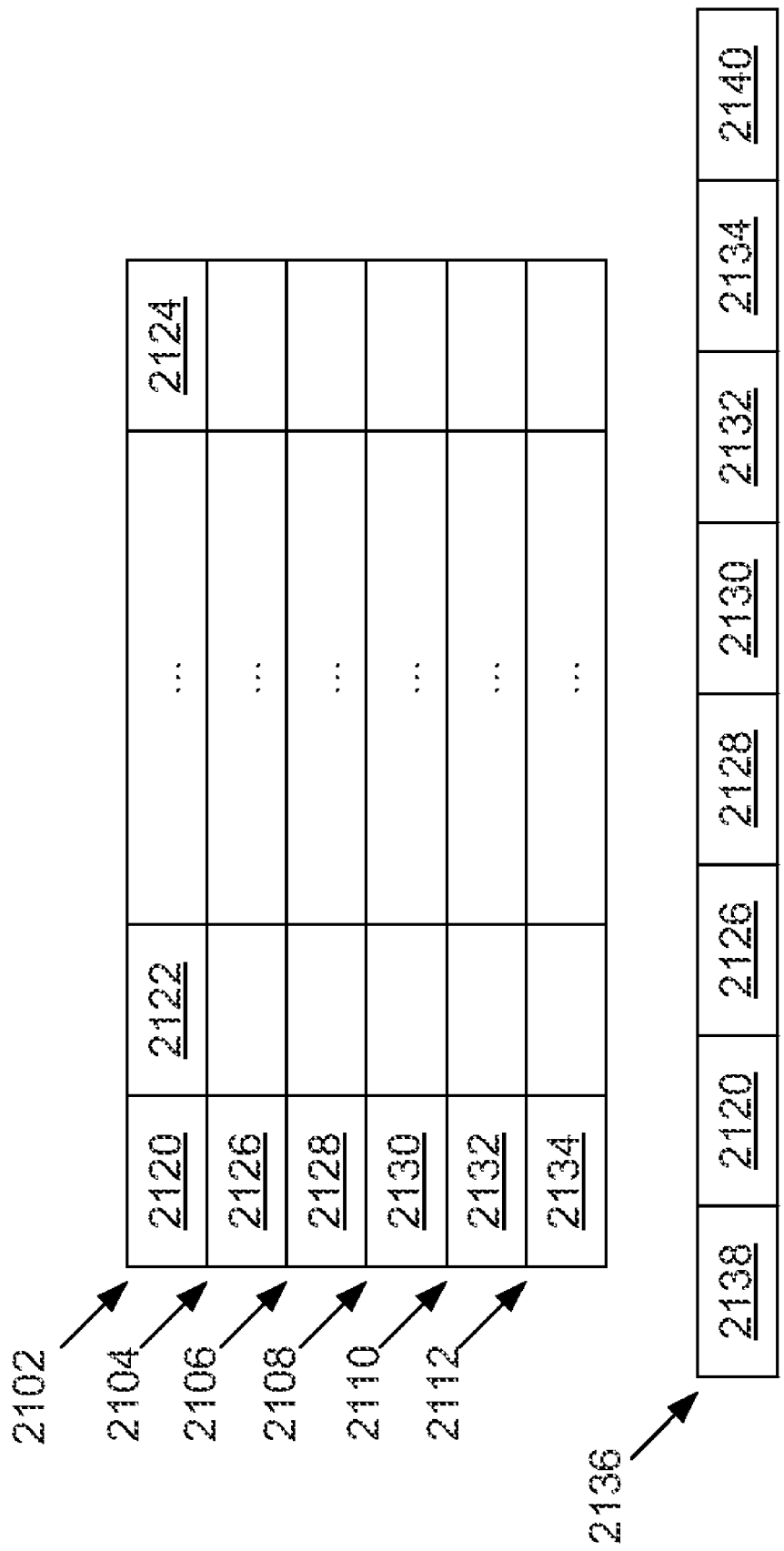
FIG. 21 is a diagram depicting a data structure of a forward error correction (FEC) system.

FIG. 21 is a diagram depicting a data structure of an example FEC system. In the data structure, six RS code words 2102, 2104, 2106, 2108, 2110 and 2112 are grouped together into a table. Each row of the table represents a single RS code word. The RS code words are filled with data to be transmitted to a receiver. Representative bytes 2120, 2122, and 2124 of RS code word 2102 are labeled. Each column of the table includes 1 byte from each of the RS code words. Representative bytes 2120, 2126, 2128, 2130, 2132 and 2134 are filled in sequence with message bytes from a transmitted message. Subsequent message bytes fill subsequent columns of the table. Bytes 2120, 2126, 2128, 2130, 2132 and 2134 are transmitted as part of a protocol data unit (PDU) 2136. Each subsequent column of the table fills a subsequent PDU. The PDU also contains a sequence number 2138 and a total number of PDUs 2140. The sequence number 2138 indicates which column of the table a particular PDU belongs to. The total number of PDUs 2140 indicates the number of PDUs that are sufficient to reassemble the signal. In addition, the PDU may be transmitted with a cyclic redundancy check (CRC) that indicates a successfully transmitted packet. PDUs that arrive with CRCs that are incorrect are discarded before being passed up a protocol stack to a media access control (MAC) layer and ultimately do not contribute to filling in RS code words. The CRC is not shown in the figure because the CRC can be added at a physical layer.

In an illustrative embodiment, when a MAC layer receives a protocol data unit from a transmission, the physical layer has checked the CRC to determine if the PDU is valid. The receiver may also gauge whether a PDU is valid based upon a predetermined threshold signal-to-noise ratio. This technique keeps errors from one PDU from affecting multiple bytes of a code word and allows for simplified identification of bytes that are not received. If the PDU is valid, the receiver uses the sequence number to assemble the six bytes of the RS code words into a buffer. The receiver also updates an erasure mask. The erasure mask is a data structure which indicates which bytes of the RS code words arrived. The erasure mask also indicates which bytes of the RS code word are erasures and have not been successfully received. The receiver counts the PDUs that are received and compares this number to the total number of PDUs that are sufficient for the transmission to complete. When the number of PDUs received is equal to the total number of PDUs that are sufficient for the transmission to complete, the receiver processes the code words with the erasure mask using a Reed Solomon decoder as known to those of skill in the art. The output of the Reed Solomon decoder is the bytes that were encoded.

A transmitter implementing the FEC system generally does not send all N bytes. The FEC system allows for any set of K bytes of the N bytes to be used to reconstruct the original K bytes. The transmitter sends an initial set of bytes where the initial set is at least K bytes large. The transmitter also determines whether to send more bytes based on the system described below. The transmitter may continue to send bytes until a receiver indicates that all K bytes have been decoded. The receiver may indicate that all K bytes have been decoded by either sending a short message indicating the K bytes have been decoded or by ending a continuous notification that the K bytes have not been decoded. Alternatively, the transmitter may cease transmitting bytes after a first set of bytes until the receiver indicates that more bytes are to be sent. The receiver may indicate that more bytes are to be sent by sending a short message. The short message may include of a single bit returned to the transmitter.

Messages indicating that more PDUs should be transmitted or that no further PDUs are needed may be scheduled rather than be sent in response to an incoming FEC encoded message. In a transmission of a scheduled message, the receiver of the PDUs initially sends an indicator of a time when the transmitter will receive a response. The transmitter determines a time length indicating how long the transmission will take to send an initial amount of PDUs. The transmitter creates a transmission time by subtracting the time length from the time when the transmitter will receive a response. The transmitter may also subtract an amount of time corresponding to a length of time for processing the initial amount of PDUs. The transmitter begins its transmission just in time to receive the scheduled response. The transmitter may either continue transmitting more PDUs or end transmissions based on the response.

The receiver may schedule more than one response to any particular message. For example, the receiver may schedule an initial response and a secondary response. However, for efficiency, after the scheduled responses, the receiver can create and transmit a stop list. The stop list may be broadcast to all nodes. The stop list indicates which nodes have successfully completed a transmission. On receipt, a node that is identified on the stop list may stop transmitting PDUs.

Figure 22:
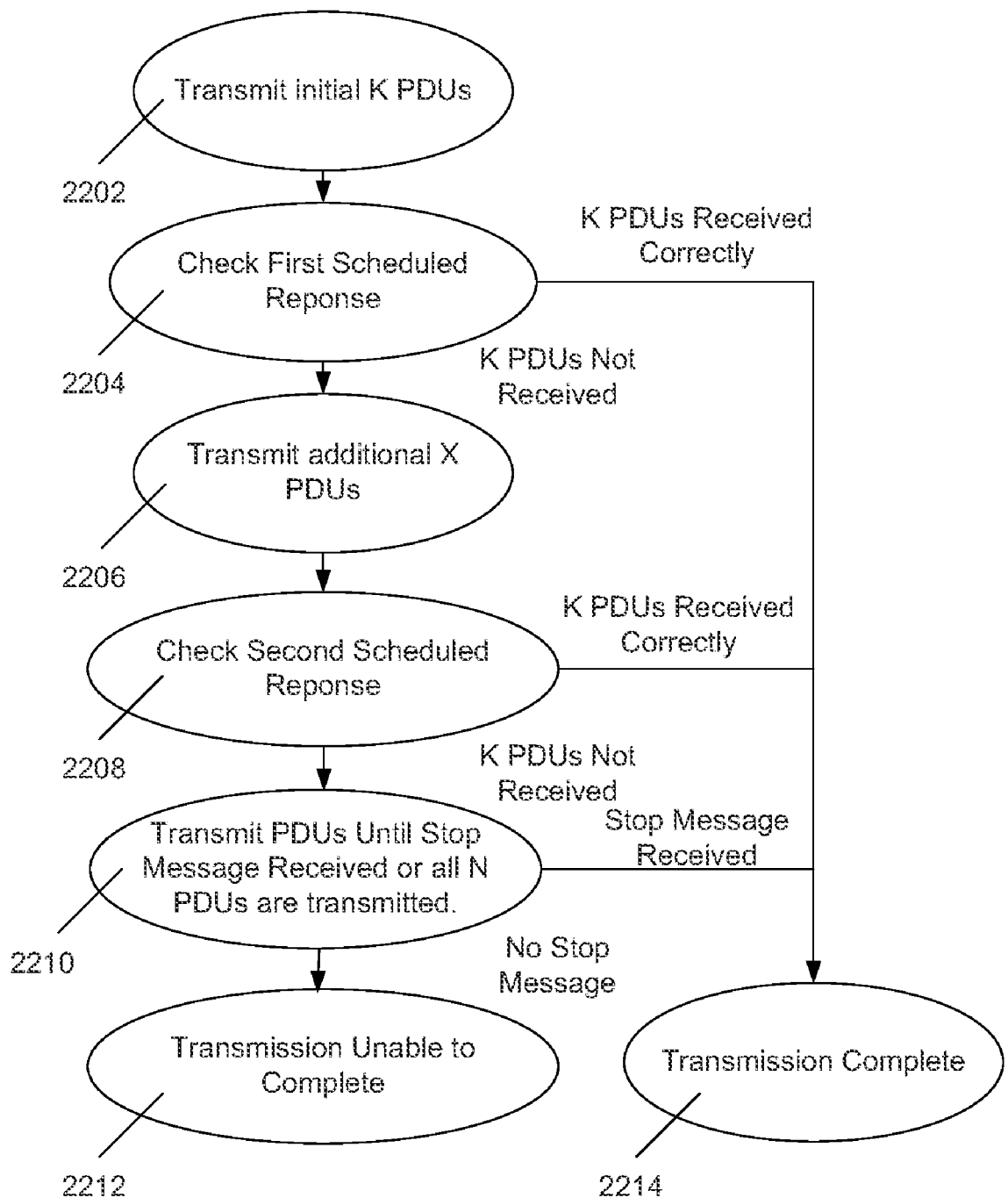
FIG. 22 is a flow diagram illustrating operations that implement an example of a system to transmit a message with a forward error correction system.

FIG. 22 is a flow diagram illustrating operations that implement an example of a system to transmit a message as described above with respect to FIG. 21. Additional, fewer, or different operations may be performed, depending on the embodiment. An exact order of the operations may be adjusted to fit a particular application. At an operation 2202, a node transmits an initial K PDUs. Transmission may begin after the node has scheduled the transmission. Alternatively, transmission may begin at a time that the node calculates allows an access point sufficient time to respond to reception of the initial K PDUs. At an operation 2204, the node checks a scheduled response to determine if more PDUs should be transmitted. The response may include an acknowledgement (ACK) indicating a complete message has been received. Alternatively, the response may include a negative acknowledgement (NACK) indicating more PDUs should be transmitted. If more PDUs should be transmitted, the node moves to an operation 2206 where an additional X PDUs are transmitted. An exact number of PDUs that are transmitted depends on both a total number of PDUs available and a time until a second scheduled response is to occur. After transmission of the X PDUs, in an operation 2208, the node checks the second scheduled response. Similar to operation 2204, if more PDUs should be transmitted, the node moves to an operation 2210. In operation 2210, the node transmits any remaining PDUs until either a stop message is received or until all N PDUs are transmitted. If a stop message is received, possibly after all N PDUs are transmitted, or if any of the scheduled responses indicates K PDUs have been received, then transmission is complete. If no message is received but all N PDUs have been transmitted, then the transmission failed to complete.

If, after receiving all N PDUs, there are not at least K unerrored PDUs and the transmission failed to complete, the node can retransmit PDUs until K PDUs are successfully received. However, the node does not have an indication of which PDUs were received successfully, so some repetition may occur. The node may just retransmit all of the PDUs that compose the code words. Alternatively, the node may receive an indication of which code words are errored. The node may then transmit only those code words which are errored.

Figure 23:
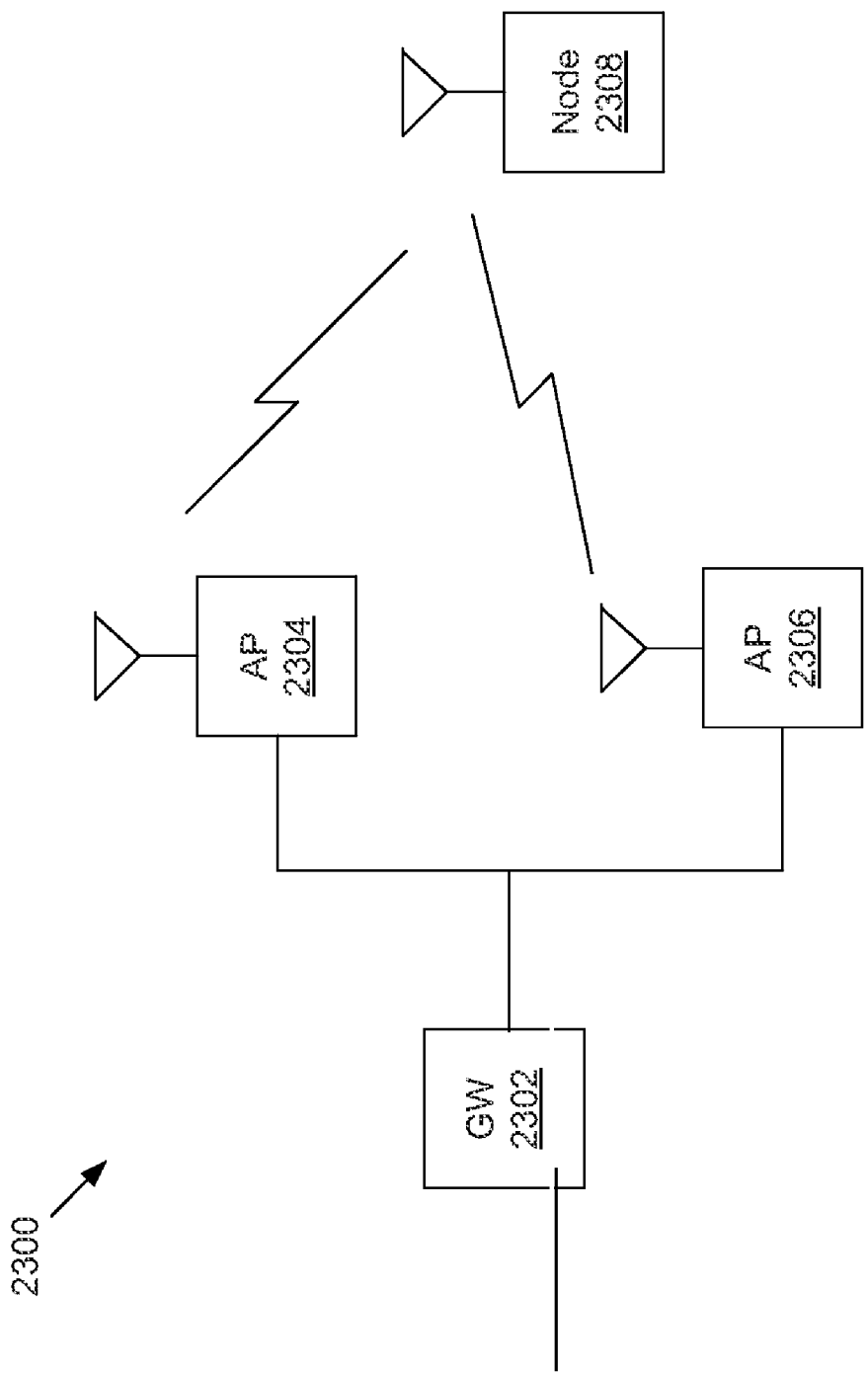
FIG. 23 is a diagram depicting a system with a gateway, access points, and a node.

The FEC system can be implemented at a gateway or other source of data to be sent to a node rather than necessarily at the access point. The FEC system is particularly useful any time large packets of data must be sent to all devices in a network such as to distribute a code load. FIG. 23 is a diagram depicting a system 2300 with gateway 2302, access points 2304 and 2306, and node 2308. In FIG. 23, gateway 2302, which is in communication with each transmitting access point 2304 and 2306, implements the FEC system described above on a service data unit (SDU). Payload data units (PDUs) composed of portions of the encoded SDU are sent to access points 2304 and 2306 where the PDUs are then sent on to node 2308. Since PDUs are sent through multiple pathways, node 2308 is free to receive the PDUs on whichever signal is better. Node 2308 sends control information, such as requests for more encoded data, through either access point 2304 or access point 2306. Messages from node 2308 are forwarded to gateway 2302. Possible messages sent to gateway 2302 can include completion messages or requests for more encoded data. Gateway 2302 responds to requests for more encoded data from node 2308 by sending more portions of the encoded SDU. Gateway 2302 may send the requested portions either (i) as a broadcast to all access points for further forwarding or (ii) as a direct message to node 2308 through the best route possible. Implementing the FEC system allows for a centralized distribution system which helps to ensure that nodes can listen to whichever access point has the best link at a given time. The node need not repeat a partially downloaded SDU because a link to an active access point becomes unusable.

In some instances, gateway 2302 may transmit enough forward error correction data of a source signal to get to a predetermined reliability level and then stop further transmission. In an FEC system, a source signal is encoded into an encoded signal containing forward error correction data. Reliability at a particular noise condition can be achieved by transmission of a portion of the encoded signal by sending a predetermined number of PDUs where each PDU contains a unit of the encoded signal. At the predetermined reliability level, there is a predetermined probability that each node, including node 2308, successfully decodes the source signal from the encoded signal as received by each node. A total power budget is a function of the particular noise condition as is explained further below. The predetermined number of PDUs is a function of the predetermined reliability level required and the total power budget. The predetermined number of PDUs can be determined empirically on a system level or during calibration of a particular system. Gateway 2302 transmits the predetermined number of PDUs to access points 2304 and 2306 which retransmit the predetermined number of PDUs to nodes, including node 2308. Once gateway 2302 has transmitted enough forward error correction data to get to the predetermined reliability level, gateway 2302 can prevent transmission of further encoded signal. Gateway 2302 can determine which nodes, including node 2308, did not successfully decode the encoded signal. Gateway 2302 can transmit more data to these nodes to completely transmit the source signal. Gateway 2302 can determine whether to broadcast or unicast additional data based on system factors such as which nodes failed to receive all of the PDUs.

Node 2308 may also use a similar system to communicate with gateway 2302. Node 2308 may create an encoded signal from a source signal using a forward error correction technique. Node 2308 splits the encoded signal into a predetermined number of PDUs where each PDU contains a unit of the encoded signal. Node 2308 transmits the units to an access point, for example, either access point 2304 or 2306, which retransmits the units to gateway 2302. Node 2308 transmits enough of the units to reach a predetermined reliability level in the same manner as described above. Node 2308 selects the access point, either access point 2304 or 2308, through the processes explained below. After node 2308 has transmitted enough of the units to reach a predetermined reliability level, node 2308 may transmit more units if node 2308 determines gateway 2302 did not successfully decode the encoded signal. With a transmission scheme such as that presented, node 2308 is free to select a new access point at any time during transmission of the encoded signal. Node 2308 can to adapt to changing signal propagation characteristics and complete a transmission with gateway 2302.

A transmitter may broadcast a data packet in a spread spectrum system to many receivers. For example, an access point or a gateway may distribute a code load, which should be the same for all receivers, on a broadcast channel that is received by multiple nodes. However, the receivers may each experience different errors based on individual signal conditions at the receiver. In order to use the available bandwidth as efficiently as possible, the transmitter may send more bytes of a FEC encoded signal when requested by individual receivers. Alternatively, the transmitter may be set to continue sending bytes of a FEC encoded signal until each receiver reports the data packet is complete.

Figure 24:
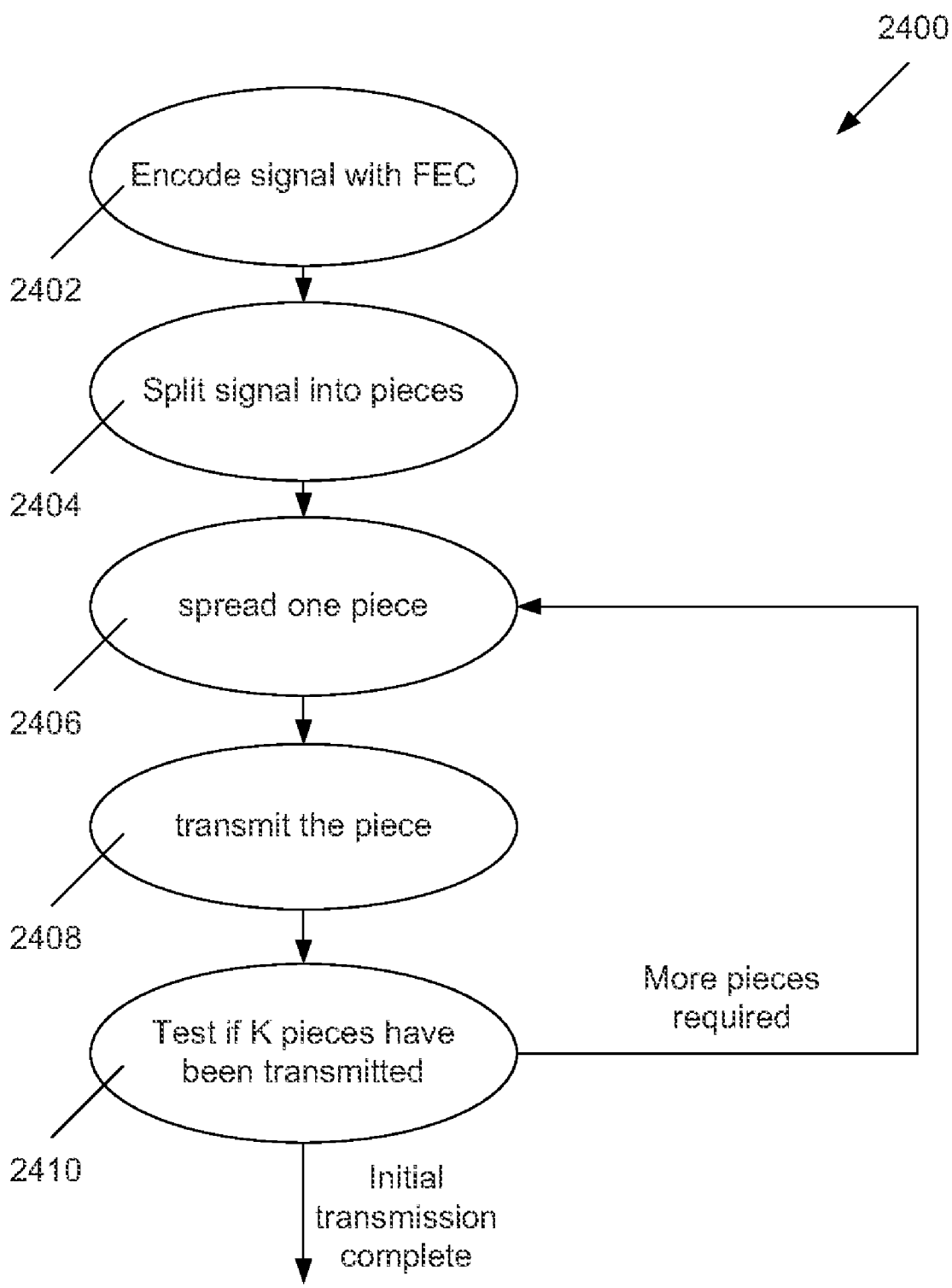
FIG. 24 is a flow diagram illustrating operations that allow a transmitter to broadcast a data packet in a spread spectrum system to many receivers.

FIG. 24 is a flow diagram 2400 illustrating operations that allow a transmitter to broadcast a data packet in a spread spectrum system to many receivers. Additional, fewer, or different operations may be performed, depending on the embodiment. An exact order of the operations may be adjusted to fit a particular application. In an operation 2402, a source signal is encoded into an encoded signal using a forward error correction technique. A Reed Solomon encoding technique is one example of a forward error correction technique, however other techniques are possible. For example, hamming, Golay, multidimensional parity codes, or other codes known to those of skill in the art could be used as forward error correction techniques. In an operation 2404, the encoded signal is split into a plurality of units. In an operation 2406, a unit of the plurality of units is spread using a spreading code. The unit is spread to a spreading factor. In an operation 2408, the unit that has been spread is transmitted to multiple receivers. In an operation 2410, the transmitter tests whether a predetermined number of units have been transmitted and, if not, the transmitter loops back to transmit more units. The predetermined number in a Reed Solomon system may be as low as K, the minimum number of units needed to decode the source signal. However, the system may be designed with a higher predetermined number if errored packets are expected. For example, for transmission on a noisy spectrum, where K is 71 and N is 255, the predetermined number may be chosen to be 90 in order to ensure that every receiver has more than the minimum number of units needed to reassemble the complete packet. In general, the transmitter transmits a worst-case number of packets to service a worst-case link. This basic mechanism may be refined through feedback from the receivers.

An access point and a node may see different interference from outside sources due to configuration differences between the access point and the node. This asymmetrical interference means that a minimum power that can be used to complete communication from an access point to a node may be different from a minimum power that can be used to complete communication from the node to the access point. For example, an access point will generally be placed such that it has line of sight view of many transmitters, such as at the top of a hill. There may be interfering transmitters in addition to nodes visible to the access point. However, the nodes may not see the interfering transmitters and yet must transmit such that the access point receives the nodes' signal even in the presence of the interference. This is especially true for equipment that broadcasts and receives in the Industrial, Scientific and Medical (ISM) bands.

Figure 25:
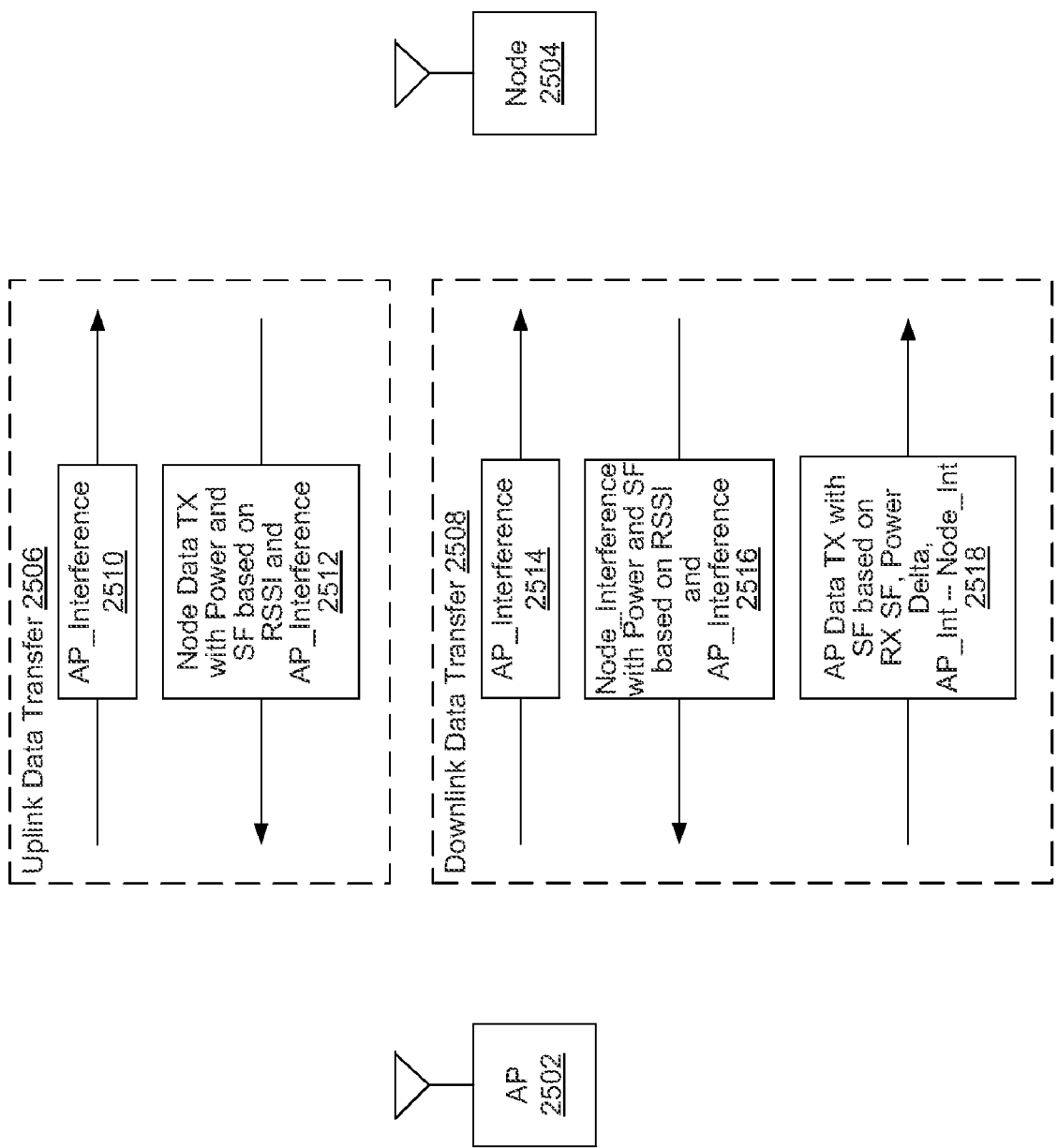
FIG. 25 is a diagram depicting communication between access point 2502 and node 2504 including uplink data transfer 2506 and downlink data transfer 2508.

FIG. 25 is a diagram depicting communication between access point 2502 and node 2504 including uplink data transfer 2506 and downlink data transfer 2508. Uplink data transfer 2506 begins with access point 2502 transmitting a measured access point interference signal (AP_INTERFERENCE) to node 2504 via a broadcast channel. Node 2504 transmits uplink data transfer 2506 with a transmit power and spreading factor based on a measured receive signal strength indicator that is normalized by AP_INTERFERENCE. Downlink data transfer 2508 is adjusted by information returned by node 2504. Access point 2502 transmits AP_INTERFERENCE to node 2504 via a broadcast channel. Node 2504 transmits a measured node interference signal (NODE_INTERFERENCE) to access point 2502 with a transmit power and spreading factor based on a measured receive signal strength indicator (RSSI) that is normalized by AP_INTERFERENCE. Access point 2502 transmits downlink data transfer 2508 with a spreading factor determined as described below based on the node transmit power and spreading factor, an access point and node power delta (for example, 7 dB), and AP_INTERFERENCE-NODE_INTERFERENCE. Details of these operations are considered below.

Figure 26:
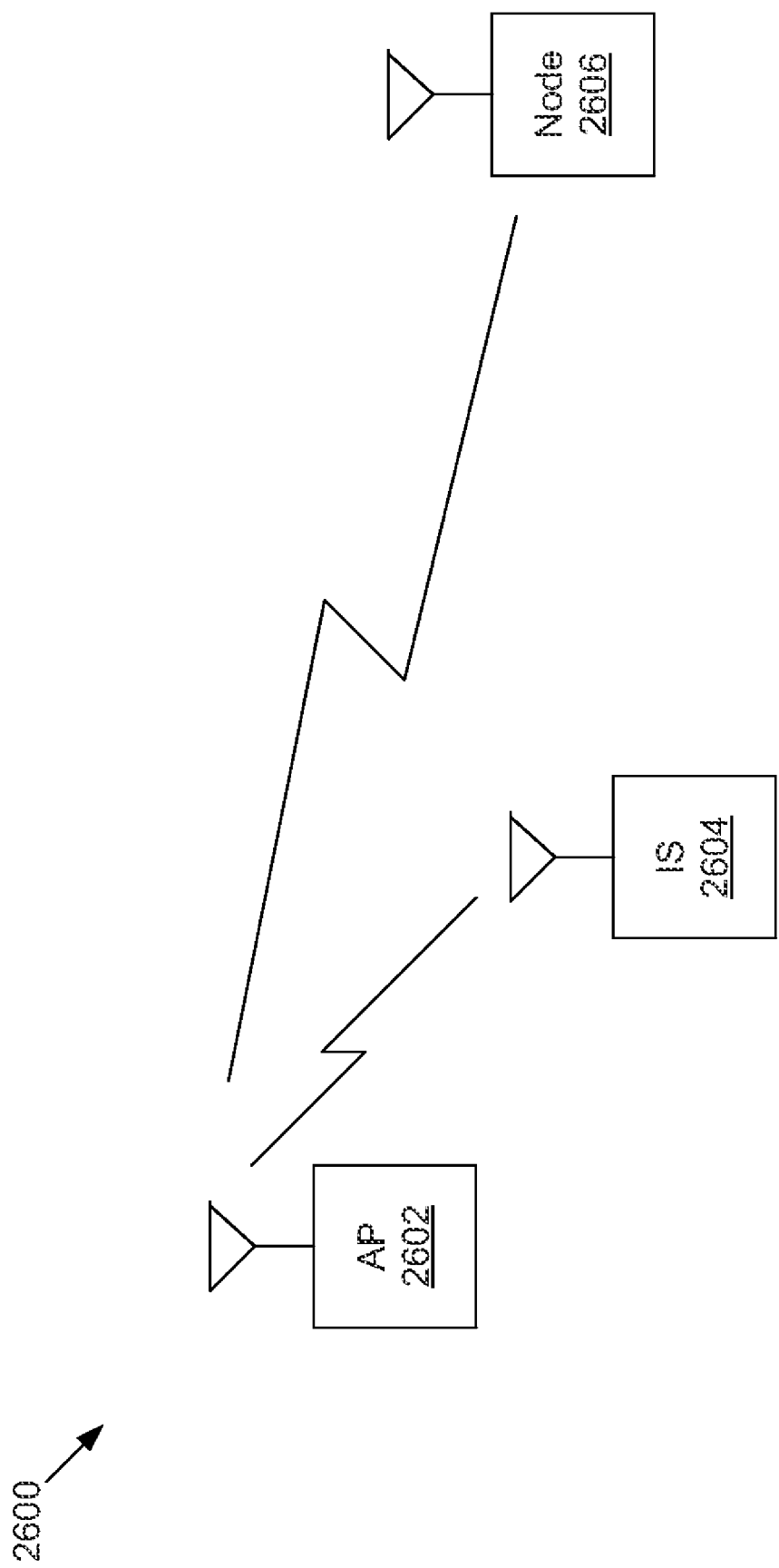
FIG. 26 is a diagram depicting a simplified system with an access point, an interference signal that interferes with reception at the access point, and a node.

FIG. 26 is a diagram depicting a simplified system 2600 with an access point 2602, an interference signal 2604 that interferes with reception at the access point, and a node 2606. The access point 2602 can measure signal degradation due to interference signal 2604 (AP_INTERFERENCE). Access point 2602 can broadcast the AP_INTERFERENCE to all listening nodes, including node 2606. All nodes, including node 2606, may then transmit with more power to overcome the signal degradation by increasing a transmit spreading factor or increasing a transmit power directly.

A node may also select which access point with which to communicate based on the AP_INTERFERENCE reported by multiple access points. The node has a certain power budget to complete communications with a given access point. The power budget is a function of both the power to reach the access point and also the power to overcome the interference reported by the access point. The threshold power that overcomes the interference measured by the access point is an uplink power margin. The access point reports the power to overcome the interference by transmitting AP_INTERFERENCE to the node. A node selects the access point with the lowest total energy budget, including the required uplink power margin. When the node communicates with an access point with the lowest total power budget, the node can use a smaller spreading factor and/or lower transmit power to complete the communication. A smaller spreading factor can be used because the smaller spreading factor lowers the energy transmitted by the node. The smaller spreading factor correlates to increased energy savings since the node transmits for less time.

Figure 27:
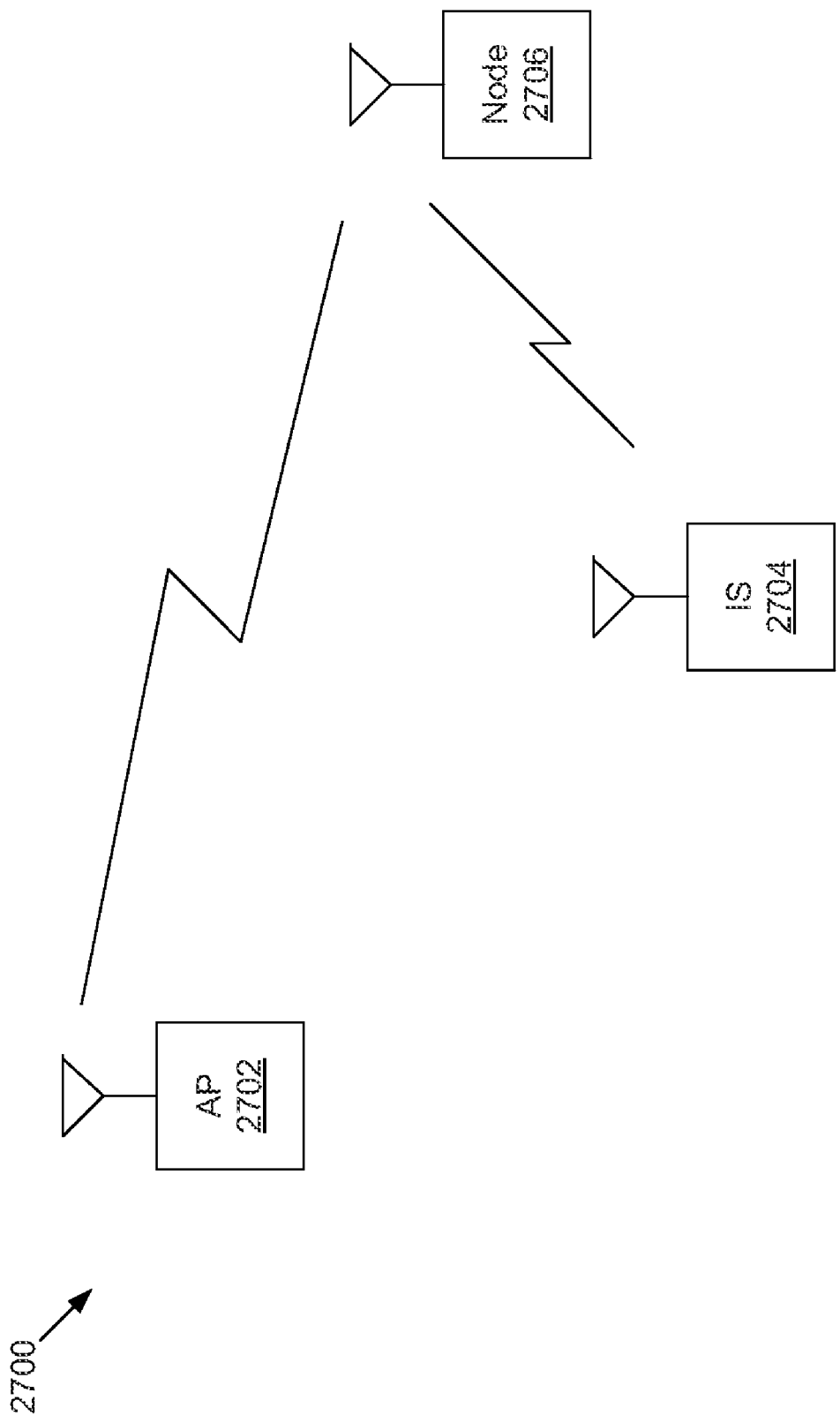
FIG. 27 is a diagram depicting a simplified system with an access point, a node, and an interference signal that interferes with reception at the node.

As described above, a node transmits data to an access point with a transmit power and spreading factor based on a measured receive signal strength indicator (RSSI) that is normalized by AP_INTERFERENCE. However a difficulty arises in measuring RSSI in the presence of interfering jamming signals since a simple power measurement will include the jamming signals. This problem is illustrated with reference to FIG. 27. FIG. 27 is a diagram depicting a simplified system 2700 with an access point 2702, an interference signal 2704 and a node 2706. Power received from access point 2702 and interference signal 2704 ordinarily combine in a power measurement at node 2706. However, the combined power measurement interferes with power control of transmission by node 2706 to access point 2702. A method for determining a signal power received from the access point is described below.

Figure 28:
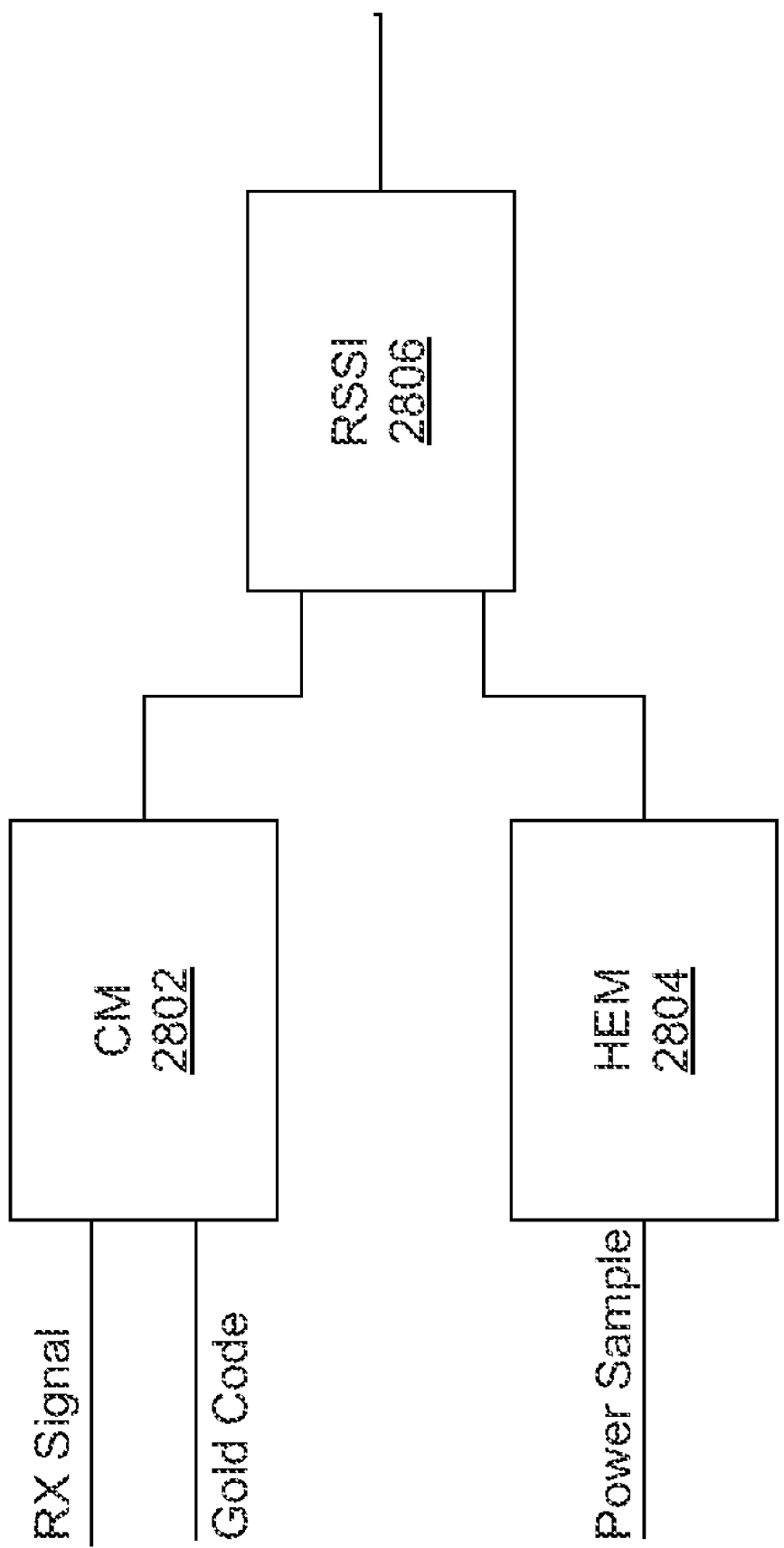
FIG. 28 is a block diagram depicting components for measuring signal power.

A node is able to measure a signal power received from an access point even when there is a time-varying jammer that is co-channel or adjacent-channel and interfering with transmissions from the access point. FIG. 28 is a block diagram depicting components for measuring signal power. In block 2802, the node determines a correlation metric (CM) from the received signal and a known sequence such as a gold code, as described further below. In block 2804, the node determines a high energy metric (HEM) from samples of a total power on frequency, as described further below. In block 2806, the signal power can be determined as the correlation metric times the high energy metric.

The node determines the correlation metric during signal reception. First, mathematically in linear terms, CM=mean [sqrt(S_LIN/P_TOT_LIN)]^2. S_LIN is a signal power and P_TOT_LIN is the total power, both in the linear domain. The node correlates a received digital sequence against an apriori known transmitted sequence and sums over a symbol duration, thus creating a despread symbol. The node also noncoherently averages together a number of these despread symbols to create a result. In one example, sixteen of these despread symbols are averaged together. The result is mathematically related to the correlation metric, and the result can be empirically mapped to an exact correlation metric.

The node also determines the high energy metric during signal reception. The node measures samples of the total power prior to the despread process at regularly spaced intervals. This process captures even pulsed noise sources that may come in and out throughout the course of the sampled measurements. The node also calculates the high energy metric (HEM). HEM=[1/AVG(1/sqrt($P_i$))]^2. Where $P_i$ is each sampled power measurement which is sampled over a period of time. The period of time where power is measured overlaps with the period of time in which the received digital sequence used in computing the correlation metric arrives. Signal power can be calculated as per the relationship described above, S=CM*HEM. In the logarithmic domain, this is S_dB=HEM_dB+CM_dB.

The node can determine node interference signal (NODE_INTERFERENCE), as described above, by determining a signal power of interfering jammers. The node can transmit NODE_INTERFERENCE to an access point. The access point can then choose a total energy for transmissions, including unicast transmissions, based in part on NODE_INTERFERENCE, as described further herein. NODE_INTERFERENCE corresponds to the amount of power required to overcome the signal power of interfering jammers and still maintain acceptable performance. NODE_INTERFERENCE can be computed in log scale as the effective noise (N_EFF) minus the background noise with no interference (N_NO_INTERFERENCE).
NODE_INTERFERENCE=N_EFF−N_NO_INTERFERENCE. N_EFF is the signal power (as determined above) minus the effective signal to noise ratio. The effective signal-to-noise ratio can be determined from the output of the non-coherent addition of multiple despread outputs through calibration. N_NO_INTERFERENCE can be determined during calibration of a node and programmed into the node. Channel variation causes NODE_INTERFERENCE to fluctuate on a frame by frame basis. Thus, the node averages NODE_INTERFERENCE from multiple readings. The node may also include into the averaged NODE_INTERFERENCE a power margin for channel fading, inaccuracies in measurement values, and inaccuracies in transmit power control. This additional margin can be determined empirically, for example, through field testing in a particular environment.

In general, an access point broadcasts at a particular power setting with a particular spreading factor. However, the access point may conserve downlink data channel bandwidth by using a smaller spreading factor that just completes a connection with a node. An access point can choose a downlink spreading factor based on access point interference signal (AP_INTERFERENCE), an uplink spreading factor, and NODE_INTERFERENCE. The access point determines AP_INTERFERENCE in part from an energy used to overcome interference as described below. The access point determines the uplink spreading factor chosen by a node during signal demodulation. The access point receives NODE_INTERFERENCE from a node as a result of its RSSI measurement as described above. The access point uses the chosen downlink spreading factor for communication directed at a particular node.

Figure 29:
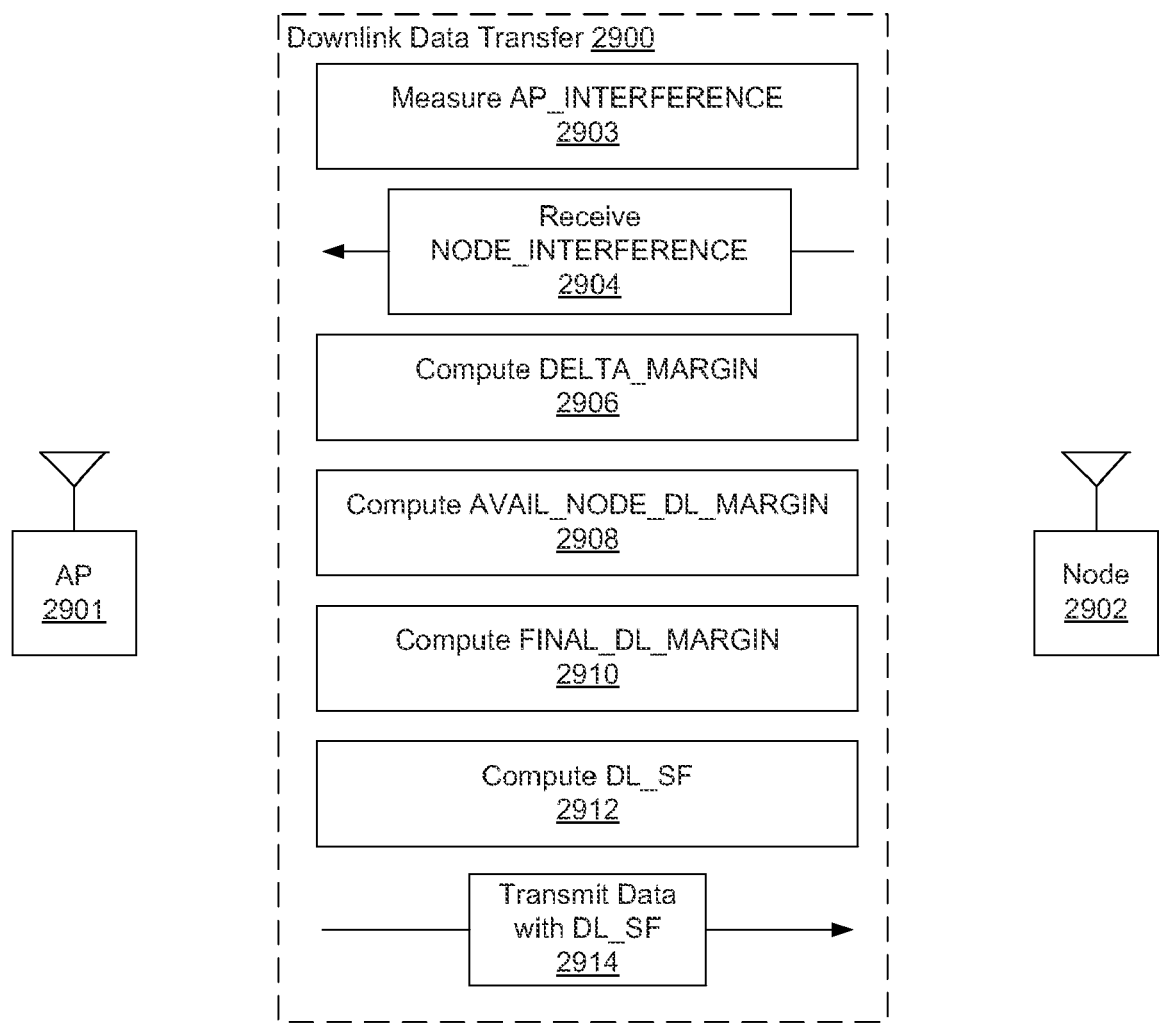
FIG. 29 is a flow diagram illustrating operations that allow an access point to determine a downlink spreading factor based in part on an uplink spreading factor.

The access point can use an algorithm to determine a downlink spreading factor. All calculations are done on logarithmic scale except where otherwise noted. FIG. 29 is a block diagram 2900 illustrating operations that allow an access point 2901 in communication with node 2902 to determine a downlink spreading factor based in part on an uplink spreading factor. Additional, fewer, or different operations may be performed, depending on the embodiment. An exact order of the operations may be adjusted to fit a particular application. The block diagram 2900 shows a dependence of variables on previously calculated variables, however the exact order of the operations may be adjusted to fit a particular application. In an operation 2903, an access point 2901 interference signal (AP_INTERFERENCE) is measured from an effective noise minus a background noise as described in further detail below. AP_INTERFERENCE is also a component of an uplink power margin calculation used by transmissions from a node in order to overcome interfering signals. In an operation 2904, a node interference signal (NODE_INTERFERENCE) and an uplink spreading factor are determined from packets received from a particular node. These three values are used to compute a delta power margin in an operation 2906, as described below. The delta power margin is used in part to compute the available node downlink margin in power at an operation 2908. A final downlink power margin is computed in an operation 2910. At an operation 2912, a downlink spreading factor is computed from the final downlink power margin. This downlink spreading factor is used in an operation 2914 to transmit data from the access point to the node. This algorithm is described further below.

The access point computes a delta power margin from the formula: DELTA_MARGIN=AP_INTERFERENCE−NODE_INTERFERENCE. AP_INTERFERENCE is an amount of power needed for nodes to overcome on-frequency interference at the access point and is further described below. NODE_INTERFERENCE is an average of NODE_INTERFERENCE calculations that are computed by a node and is further described herein. Similar to AP_INTERFERENCE, NODE_INTERFERENCE is an amount of power transmitted by the access point to overcome on-frequency interference at the node. NODE_INTERFERENCE used by the access point is transmitted to the access point by the node.

AP_INTERFERENCE is derived as a result of the access point's calculation of an effective noise (N_EFF). In log scale, AP_INTERFERENCE is an effective noise (N_EFF) minus a background noise with no interference (N_NO_INTERFERENCE). AP_INTERFERENCE=N_EFF−N_NO_INTERFERENCE. An N_EFF calculation at an access point is somewhat different than the calculation used at a node. At an access point, N_EFF may be measured during a period when no transmissions from nodes are received. Since no transmissions are received, a power measurement for a sampling period at each sample ($N_i$) is an instantaneous average of an interference power from external systems, such as other devices transmitting on the same frequency being used by the access point and the nodes. Alternatively, N_EFF may be measured while many nodes are transmitting. This alternative approach captures an elevation in a noise floor due to self-interference. N_EFF is calculated as, N_EFF=$[1/\text{avg}(1/\text{sqrt}(N_i))]^2$. N_NO_INTERFERENCE can be determined during calibration of the access point and programmed into the access point. Channel variation causes AP_INTERFERENCE to fluctuate on a frame by frame basis. Thus, the access point averages AP_INTERFERENCE from multiple readings. The access point may also include into the averaged AP_INTERFERENCE a margin for channel fading, inaccuracies in measurement values, and inaccuracies in transmit power control. This additional margin can be determined empirically, for example, through field testing in a particular environment.

The access point also computes a delta power measurement (DELTA_POWER). DELTA_POWER=AP_TX_POWER−MAX_NODE_TX_POWER−DATA_CHAN_CONSTANT. The access point transmits at AP_TX_POWER power. AP_TX_POWER can be a constant throughout an entire system. One possible value for AP_TX_POWER is 29.5 dBm, but other values are possible since different systems can be set to different transmit powers. MAX_NODE_TX_POWER is a maximum any particular node in a system can ever transmit at. MAX_NODE_TX_POWER can be empirically determined during a calibration procedure. In one common configuration, this is 21 dBm. Other values depend on a particular calibration and could be 25 dBm or 15 dBm. DATA_CHAN_CONSTANT is a constant introduced to account for particular configurations of the access point transmitter. In one configuration, the access point transmits a data channel at half a total transmit power because the data channel is transmitted on one channel of a two channel modulator. Thus, in logarithmic scale, DATA_CHAN_CONSTANT is 3 dB since 3 dB must be subtracted from AP_TX_POWER to account for a split of the transmit power.

The access point also computes UL_NODE_DELTA_SNR which is a difference between a received signal-to-noise ratio from the node and a minimum signal-to-noise ratio for reception. UL_NODE_DELTA_SNR=NODE_SNR−MIN_DECODE_SNR. NODE_SNR is a reading of the signal-to-noise ratio of a transmission by the node. MIN_DECODE_SNR is the minimum signal-to-noise ratio on an uplink for a particular spreading factor that the node transmitted at. UL_NODE_DELTA_SNR corresponds to an amount by which the node exceeded the minimum signal-to-noise ratio.

The access point further computes an available downlink margin to the node (AVAIL_NODE_DL_MARGIN). AVAIL_NODE_DL_MARGIN=DELTA_MARGIN+DELTA_POWER+UL_NODE_DELTA_SNR. AVAIL_NODE_DL_MARGIN is the total power margin available on downlink assuming that both the uplink and the downlink are using identical spreading factors. However, using different spreading factors is advantageous since smaller spreading factors use less of a total downlink bandwidth, take less power for a node to receive, and can be transmitted faster.

From the AVAIL_NODE_DL_MARGIN, the access point can calculate the final downlink margin (FINAL_DL_MARGIN) and the downlink spreading factor. FINAL_DL_MARGIN is an estimated power difference that the access point transmits to the node above a minimum signal-to-noise ratio for reception by the node. The access point calculates a spreading factor delta (SF_DELTA) between the uplink spreading factor (UL_SF) and the downlink spreading factor (DL_SF). SF_DELTA=log 2(UL_SF)−log 2(DL_SF). For instance, if the UL_SF is 8192 and the DL_SF is 2048, then the SF_DELTA is 2. FINAL_DL_MARGIN can be computed.
FINAL_DL_MARGIN=AVAIL_NODE_DL_MARGIN−3*SF_DELTA. The factor of 3 multiplier to the SF_DELTA variable is introduced because every power of two decrease in spreading factor corresponds to 3 dB less signal power received at a node. The goal is for FINAL_DL_MARGIN to be positive, but as small as possible. A negative FINAL_DL_MARGIN corresponds to sending out a packet with less than enough energy to obtain the minimum signal-to-noise ratio for reception. Hence, SF_DELTA=floor(AVAIL_NODE_DL_MARGIN/3). The downlink spreading factor can now be calculated. DL_SF=2^(log 2(UL_SF)−floor(AVAIL_NODE_DL_MARGIN/3)). The algorithm allows the access point to choose a spreading factor with the minimum amount of power and the shortest transmission time to reach a node on a data channel by meeting the relationship for DL_SF described above.

Figure 30:
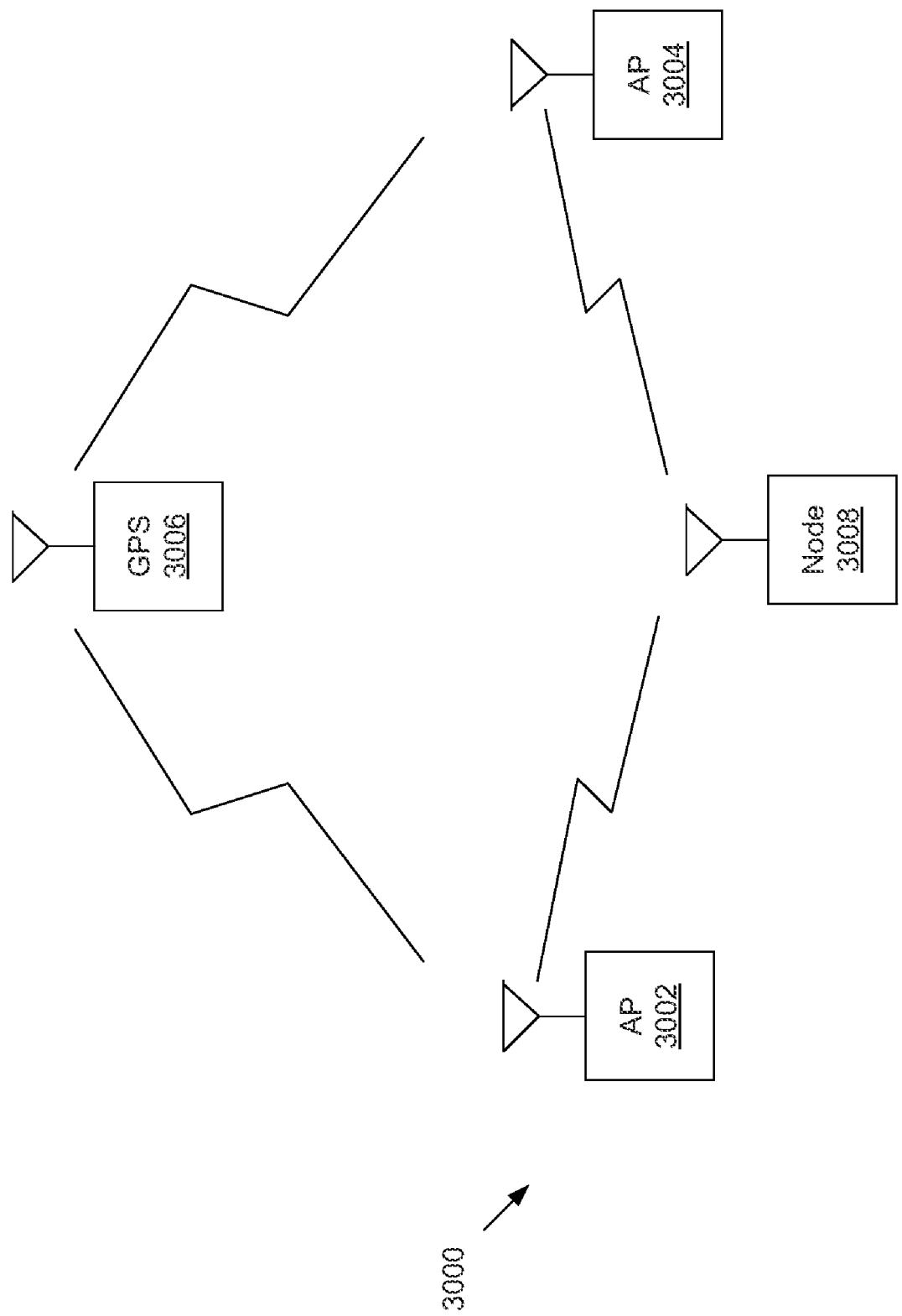
FIG. 30 is a diagram depicting a system with access points which are synchronized by an outside time source and are in communication with a node.

A node can simultaneously measure power received from multiple access points. FIG. 30 is a diagram depicting a system 3000 with access points 3002 and 3004 which are synchronized by an outside time source 3006 and are in communication with node 3008. Access point 3002 and access point 3004 transmit with different broadcast channel spreading codes, such as gold codes. Node 3008 measures power received from access points 3002 and 3004 transmitting on a frequency by processing one set of incoming data through multiple passes of a despreader of node 3008. Node 3008 can despread incoming data with gold codes selected from a set of possible gold codes.

Figure 31:
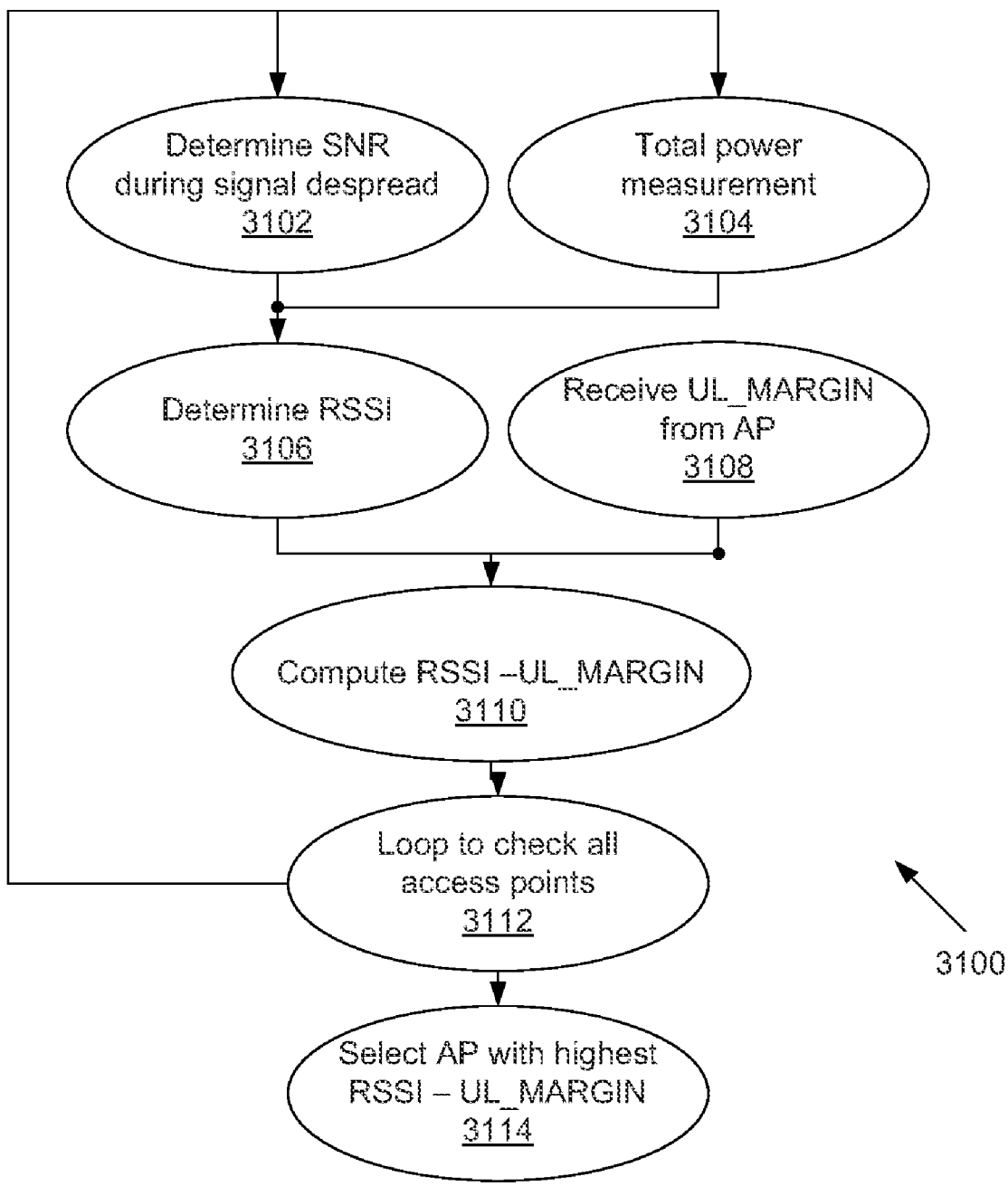
FIG. 31 is a flow diagram illustrating operations that allow a node to select an access point in a communication system.

FIG. 31 is a flow diagram 3100 illustrating operations that allow a node to select an access point for communication from a list of possible access points. Additional, fewer, or different operations may be performed, depending on the embodiment. An exact order of the operations may be adjusted to fit a particular application. In general, a despreading process produces a signal-to-noise ratio for a particular access point from the list of possible access points that may be transmitting on frequency with a gold code. A spread signal from the access point is received and placed into a frame buffer. In an operation 1302, the spread signal is despread with a spreading code, such as a gold code, creating a frame of data. In an operation 3104, a total power measurement is performed. The total power measurement is measured over a period of time where the spread signal is received from the access point. The node can use each signal-to-noise ratio and a total power measurement to determine an absolute signal power measurement, or receive signal strength indicator (RSSI) as described herein, as in an operation 3106. In an operation 3108, the node receives an access point interference signal (AP_INTERFERENCE) from each access point. AP_INTERFERENCE corresponds to an amount of power needed for nodes to overcome on-frequency interference at the access point, as described above. Each access point can broadcast an AP_INTERFERENCE which the access point can determine as described above. In an operation 3110, the node calculates a value of RSSI−AP_INTERFERENCE for each access point. This value is maximized for the access point that uses a least amount of transmission power from the node for communication. In an operation 3112, the node tests to determine if every access point on the list of possible access points has been measured. If access points remain to be tested, the node continues testing at operations 3102 and 3104. Alternatively, the node may stop testing access points on the list of possible access points if an access point meets a certain threshold value of RSSI−AP_INTERFERENCE. For example, the node may stop testing if it finds an RSSI−AP_INTERFERENCE of 100 dBm. In an operation 3114, the node determines which access point with which to communicate by looking for the access point with the greatest value of RSSI−AP_INTERFERENCE.

The node can receive signals broadcast simultaneously by multiple access points because the access points are synchronized together. With the access points synchronized by an outside time source such as GPS, variations in chip timing between the access points will be due to differences in receive path. These variations are generally not large enough to prevent reception by a node. However, these differences can be compensated for by despreading incoming data at multiple chip offsets from a synchronized timing.

In larger systems, multiple access points may communicate with nodes. The access points may be synchronized by an outside time source. One possible outside time source is a global positioning satellite receiver (GPS). Synchronized timing can improve characteristics of a system by making acquisition by nodes faster, by improving a handoff process, and by minimizing power consumption on nodes, for example. Acquisition times and power consumption are improved because a node that has previously acquired timing may not be forced to reacquire timing on subsequent transmissions. The handoff process is improved because the node is already synchronized to some degree with the new access point as long as both access points are synchronized with each other.

Figure 32:
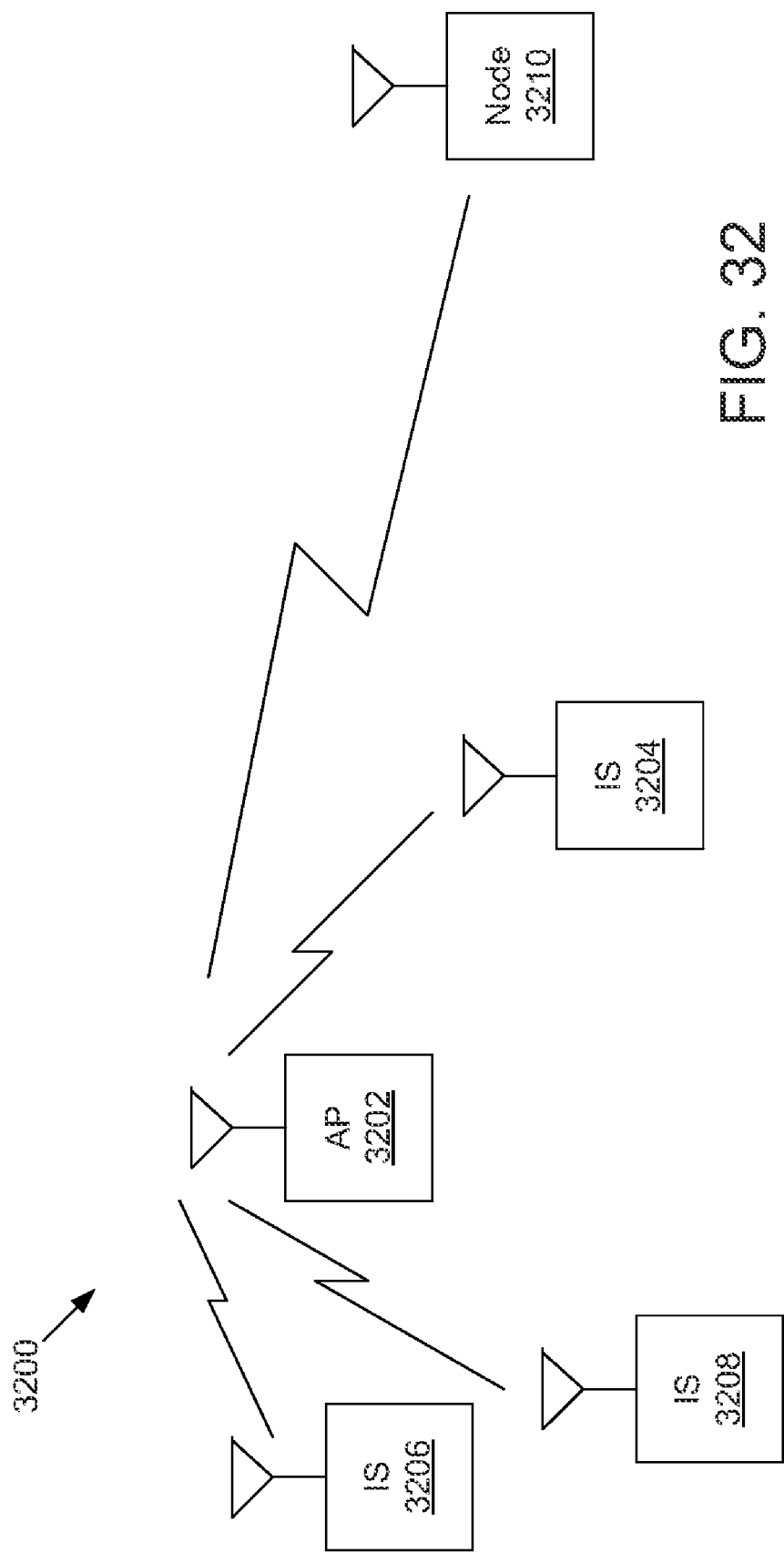
FIG. 32 is a diagram depicting a simplified system with an access point, interference signals, and a node.

FIG. 32 is a diagram depicting a simplified system 3200 with an access point 3202, interference signals 3204, 3206, and 3208, and a node 3210. Interference signals 3204, 3206, and 3208 broadcast on frequencies that are possible for the access point 3202 to use. However, use of the frequencies increases a power budget used by node 3210 for transmission to access point 3202 due to on-frequency interference by interference signals 3204, 3206 and 3208. Instead, access point 3202 implements a site survey for finding a best frequency for communication. In a site survey, an access point in a system measures a noise signal on a particular frequency. The access point also iterates through a sequence of frequencies measuring a noise signal on each frequency. When a favorable frequency is found where the noise signal is low, the access point's transmitter frequency is chosen to be the favorable frequency. The access point sets a broadcast channel spreading code, such as a gold code, based on a configuration that specifies a particular spreading code derived in part based on the particular frequency chosen. The access point then broadcasts a signal spread with the spreading code at the chosen frequency that allows nodes to acquire and register with the system.

An automatic site survey can be performed to find an ideal frequency during network deployment. Interference noise and signal propagation characteristics can be measured with an automated system which gives an ideal frequency for communication at a particular site. This process can be repeated by an access point when a particular frequency becomes unfavorable. The access point can return to the unfavorable frequency to transmit a message to all nodes it is communicating with that indicates a change in frequency.

GPS synchronization makes it possible for nodes to be unaware of network outages. When a network component is reset, generally timing is lost. When the network component is restored, nodes reacquire timing in order to communicate with the network component. However, with GPS synchronization a network component may reacquire the same timing the network component had before being was reset. Nodes that were tracking the network component's timing do not have to go through the process of reacquiring timing. When nodes do not have to reacquire timing, the nodes save network bandwidth and lower overall power consumption.

A node can determine which access point to communicate with through a process of handover processing and searching. A node can make this determination when the node selects an initial access point for communication and when the node determines to abandon an access point and join a different access point. A node can be provisioned with a list of communication parameters called a roaming list in a configuration memory. Entries in the roaming list are a parameter set and can include a broadcast spreading code, such as a gold code, a center frequency and a spreading factor. In alternate embodiments, the roaming list may include additional, different and/or fewer entries. The node may also be configured with a system selection sleep timer.

When a node begins to search for known systems for communication, the node scans each parameter set in a roaming list. FIG. 33 is a flow diagram 3300 illustrating operations that allow a node to scan each parameter set in the roaming list. Additional, fewer, or different operations may be performed, depending on the embodiment. An exact order of the operations may be adjusted to fit a particular application. In an operation 3302, the node sets a receiver with each entry of the roaming list including a broadcast spreading code, such as a gold code, a center frequency and a spreading factor. In an operation 3304, the node measures a receive signal strength indicator (RSSI) metric for each parameter set. The RSSI metric of a system is a downlink RSSI minus AP_INTERFERENCE. The downlink RSSI is described further herein. AP_INTERFERENCE is obtained by a successful demodulation of a broadcast channel of a candidate system and is further described herein. In an operation 3306, the node iterates through the rest of the entries on the roaming list. In an operation 3308, after all entries in the roaming list have been scanned and either measured or failed to be measured, the node attempts to join the system with a highest RSSI metric.

Alternative approaches to searching are possible as well. A roaming list may include a gold code list and other parameters may be determined by searching an available frequency space and possible spreading factors. Alternatively, the roaming list may be transmitted by a known system. Alternatively, a prioritized search may scan known systems in a priority list. The priority list is a roaming list in a particular order such as in order of a previously best known RSSI metric. If any system on the priority list meets an ideal threshold RSSI metric, the node may attempt to join with the system immediately without scanning any remaining systems. If no system is found that meets an ideal threshold RSSI metric, then the node may attempt to join with the system with a next best RSSI metric.

A node may select a new system in a process called reselection. Reselection may occur when there is a loss of network synchronization at a physical layer, when there are failures in a MAC layer, or when a current system has a measured RSSI metric drop below a threshold value for a period of time. For example, the RSSI metric might drop below −132 dBm for five consecutive frames and a reselection may occur. One method of reselection is to perform a prioritized search with the current system last in the priority list. In a prioritized search, the node iterates through the priority list until a new system is found with a measured RSSI metric above a threshold value.

Search processing can be optimized by tracking frequency estimates and timing estimates from previous searches. Frequency estimates and timing estimates are recorded after successful demodulation of a broadcast channel occurs. A physical layer can be seeded with these estimates to help subsequent scans of a roaming list to complete faster. Frequency estimates may be discarded on certain acquisition failures. For example, a frequency estimate may be discarded if the physical layer failed to acquire the system on two consecutive cold acquisition attempts. A count of consecutive cold acquisition failures can be reset when there is an interruption to searches such as after waking from a deep sleep period. Similarly, timing estimates may be discarded as well. Timing estimates may be discarded by the node during network entry from an idle state, after waking from a sleep period, or after a number of consecutive failed searches.

A handover is the act of a node leaving one access point with which the node is communicating and joining another access point for further communication. A handover may occur when an access point requests the node to exit and enter the network and a different access point is selected during a subsequent search of the roaming list. A handover may also occur when one of the reasons for reselection occurs as previously listed.

Handover processing and searching is accomplished by adding an outer loop search to the acquisition process that searches over multiple gold codes. A roaming list is used to determine which gold code and frequency combinations are searched. Data from a single frequency search can be searched across multiple gold codes at once. Multiple searches are performed by leaving the data in the frame buffer and despreading the data with a different gold code from the roaming list. Once timing has been determined for the system, the same timing is searched on other frequencies potentially shortening the time used for acquisition.

A node searches across all gold code and frequency combinations listed in the roaming list. As the node searches, the node records which combinations have best signal power minus AP_INTERFERENCE value. The node uses the best combination for communication but keeps track of the other combinations that produced a signal for later use when a new search is performed.

If a search of a roaming list does not result in a join attempt, the node can attempt to search again. After a certain number of searches, for example 2, 3, or 4 searches, the node can enter a deep sleep for the duration of a system selection sleep timer. After waking, the node can restart the search. Alternatively, the node can continue to search for access points with which to communicate.

A handover may be generally identical to a process of an initial joining to an access point as previously described. However, uplink and downlink communications may be in process when a handover occurs. Uplink communications that were in progress may be aborted and notification to a node's host may be made. Downlink communications that were in progress may be aborted after a successful join on a new access point.

A node can store multiple registrations at once. When a node wakes up to send a transmission, the node saves time by not registering with any access points with which the node was previously communicating.

In a multiple access point installation, it may be desirable to broadcast gold code and frequency information to nodes. One method to broadcast the gold code and frequency information is to have all access points tune to a prearranged gold code and frequency combination at a prearranged time of day. Access points then broadcast updated information. Communication by the access points is one-way, so any noise at the access points is largely irrelevant to whether reception by the nodes is possible.

A remote timing device, such as a GPS, can be used to provide precise timing to nodes. FIG. 34 is a diagram depicting a system 3400 with access points 3402 and 3404 which are synchronized by an outside time source 3406 and are in communication with nodes 3408 and 3410. A remote device transmits the time to the node. For example, access points 3402 and 3404 can provide timing to nodes 3408 and 3410 through the system frame number (SFN). Nodes 3408 and 3410 use the transmitted time to adjust an internal clock. In general, with nodes synchronized between each other, time synchronized data may be provided by collection of measurements from the nodes. This can be used, for example, to provide acoustic triangulation data that can be used to pin point a source of a noise.

Long term changes in a temperature controlled crystal oscillator (TCXO) can be tracked and accounted for. The TCXO may be adjusted based on an output of a remote timing source such as a GPS timing signal provided by an access point. This can be used to improve frequency characteristics used by transmitters and receivers. A device can measure actual performance of a TCXO at a particular temperature and voltage setting. These values can be compared with historic data to track changes over time. On subsequent initialization events, the device can restore TCXO parameters known to produce certain results. For example, the device may measure a TCXO to be 45 degrees Centigrade (C) at a control voltage of 4 Volts (V) and the output frequency may correspond to a remote timing source. On re-initialization, when the device does not have a remote timing source available for calibration, the device may measure the TCXO to be 45 degrees C. and may set the control voltage to 4 Volts. Over time, the device may measure the control voltage required to synchronize the TCXO with the remote timing source increases to 4.01 V while the TCXO is at 45 degrees C. The device may adjust a configuration memory to specify subsequent initializations begin at 4.01 Volts when the TCXO is at 45 degrees C.

FIG. 35 is a flow diagram 3500 illustrating operations that allow a system to determine a relationship between two timed events. Additional, fewer, or different operations may be performed, depending on the embodiment. An exact order of the operations may be adjusted to fit a particular application. In an operation 3502, the system receives a first value and a first time stamp from a first node. The first time stamp is based on a timing signal provided to the first node from a remote timing source. In an operation 3504, the system receives a second value and a second time stamp from a second node. The second time stamp is based on a time signal provided to the second node from the remote timing source. In an operation 3506, the system determines a relationship between the first value and the second value based on the first time stamp and the second time stamp. This relationship can be used to determine the relative time between the two values. When the two values corresponds to a single event, then the relationship corresponds to a time delay between time stamping the first value and time stamping the second value. In some systems, this time delay may correspond to a difference in distance the first node and the second node are away from an event that led to the first value and the second value. Such a system can be applied to a triangulation technique for determination of a location where an event occurred.

For example, two nodes may exist on opposite ends of a gas pipeline. The nodes may have a transducer capable of registering a sound produced from an event that occurs on the gas pipeline, such as a leak. The sound wave propagates along the length of the pipeline at a known speed. The two nodes can create time stamps from a measurement of the sound. The nodes can transmit the time stamps to a remote system. Knowing the speed with which the sound wave propagated, the remote system can calculate how far away and in which direction on the pipeline the event occurred. The remote system, given a map of the pipeline, could pinpoint an exact location of where the event, such as a leak, occurred. One advantage of this system is that it minimizes the cost of components used to implement the triangulation technique.

In a spread spectrum system that is transmitting with many gold codes, the gold codes have some cross-correlation properties. Cross-correlation occurs during despreading when one gold code correlates with another gold code. Cross-correlation properties can lead to false reception of a signal. In particular, an access point transmits a broadcast channel using a gold code that resets on every symbol. Since the broadcast channel gold code repeats every symbol, this effect will remain constant for a duration of a frame. Hence, if an access point is using a gold code with significant cross correlation to another access point's broadcast channel gold code, then a node may possibly decode the access point that the node is not communicating with on a regular basis.

To prevent these frames from being used by the node, a transmitter can initialize a hash function, such as a cyclic redundancy check (CRC), with a value based on the transmitter's identification. A CRC is a hash function designed to detect errors in a signal. The transmitter creates a computed CRC from the signal through methods known to those of skill in the art. However, the transmitter can initialize the hash function to a value based on the transmitter's identification. For example, when the hash function chosen is a CRC, the transmitter transmits a signal to the node composed of the computed CRC and data bound for the node. When the node decodes an expected signal from a particular transmitter, the node recomputes the CRC on a frame of the incoming data. Like the transmitter, the node initializes its CRC calculation to a value based on the transmitter's identification. The node checks the recomputed CRC against the received CRC. If there is a mismatch, then the CRC fails and the frame is not passed on to the node's media access control layer.

FIG. 36 is a flow diagram 3600 illustrating operations that allow a system to determine if a signal was transmitted by a particular transmitter. Additional, fewer, or different operations may be performed, depending on the embodiment. An exact order of the operations may be adjusted to fit a particular application. In an operation 3602, the system receives a signal from a transmitter with data and a CRC. The signal is spread with a gold code that is specific to the transmitter. The CRC has been encoded with the transmitter's identification code. In an operation 3604, the system initializes a test value with the transmitter's identification code and computes the CRC into the test value. If the computed test value matches the transmitted CRC, then the CRC passes. In an operation 3606, the system discards the signal if the CRC does not pass. This technique allows a node to determine if a transmission actually originated from an expected transmitter.

An access point continuously despreads and decodes incoming received signals looking for a valid payload. Normally, a CRC calculation provides reliable indication of whether decoded data are from a valid payload of a signal. However, given a 32 bit CRC and billions of possible decodes throughout a period of time, false valid CRC messages may be generated. An access point needs a method of distinguishing these false valid CRC messages from truly valid CRC messages.

One technique to distinguish false valid CRC messages from truly valid CRC messages is to measure a noncoherent energy metric of a signal during reception. Similar to the correlation metric presented herein, the noncoherent energy metric is generated during despreading. The node correlates a received digital sequence against an apriori known transmitted sequence and sums over a symbol duration, thus creating a despread symbol. The node also noncoherently averages together a number of these despread symbols to create a noncoherent energy metric. The false valid CRC messages may be detected by measuring a noncoherent energy of the signal as described above. A signal with no valid payload but with a randomly good CRC will nevertheless have a low noncoherent energy metric. The receiver may throw out communications where the noncoherent energy metric is below a certain threshold value.

FIG. 37 is a flow diagram 3700 illustrating operations that allow an access point to determine if a signal was transmitted by a node. Additional, fewer, or different operations may be performed, depending on the embodiment. An exact order of the operations may be adjusted to fit a particular application. In an operation 3702, the access point receives a signal that has a data portion and a CRC that is encoded for the data portion. The CRC is calculated to be correct by the access point. In an operation 3704, the access point measures a noncoherent energy metric during despreading of the signal. In an operation 3706, the access point discards the signal if its noncoherent energy metric is below a threshold value. This technique detects invalid data signals without adding complexity or overhead to the data signals.

There are multiple topologies that make sense for access point deployment. The topologies differ in a reuse pattern. A reuse pattern defines how frequencies and spreading codes, such as gold codes, are reused.

In a multi-frequency network, the reuse pattern is based solely on frequency selection. Each access point uses a different frequency. A multi-frequency network has the advantage that no node desenses an access point when the node is not tuned to the frequency of the access point.

In a single-frequency/multiple gold code network, the reuse pattern is based solely on gold code selection. A single-frequency/multiple gold code network has the advantage of enabling many uncoordinated overlapping networks.

In a generalized multi-frequency and multiple gold code network, the reuse pattern is based on both a frequency selection and a gold code selection. A generalized multi-frequency and multiple gold code network has an advantage of enabling many uncoordinated overlapping networks.

In a single frequency/single gold code network, all access points transmit using the same frequency and the same gold code. In a node, all of the access points look like a single access point. Handover between access points is seamless when the access points are synchronized. Acquisition is simple because there is only one frequency and gold code for a node to search. Nodes receive and measure RSSI from the access point with the strongest signal.

In a multiple frequency/multiple gold code system topology, downlink broadcast channel gold codes and frequency assignments are reused throughout a system in order to minimize a number of gold codes and frequencies a node searches during acquisition. Access points that are in close proximity to each other use different downlink broadcast channel gold codes and frequencies. Access points that are further away from each other may use identical downlink broadcast channel gold codes and frequencies. If a node acquires on a Gold Code that is shared by a nearby and distant access point, the node may lock on the nearby (stronger signal level) access point. While the example systems use a gold code as a spreading code, other spreading codes are possible.

FIG. 38 is a diagram depicting a multiple frequency/multiple gold code system topology with access points 3802, 3804, 3806, 3808, 3810, 3812, and 3814. Access point 3802 may use a particular frequency and gold code to communicate with nearby nodes. Access points 3804, 3814, and 3812 do not use the same frequency and gold code as access point 3802. In some reuse patterns, access points 3806, 3808, and 3810 are free to reuse the frequency and gold code of access point 3802. Whether access points may reuse a particular frequency and gold code depends on a particular reuse protocol and signal propagation characteristics.

An access point is uniquely identified by a System ID, an Access Point ID (AP ID), a Reuse Code and a Frequency. The Access Point ID is broadcast in a message and decoded by the node. The node uses the Access Point ID of its target access point to select the node's uplink gold code.

Different systems may operate in overlapping coverage areas broadcasting on identical frequencies. To avoid system-to-system interference, a unique System ID can be used to generate a unique set of gold codes for a given system.

Figure 39:
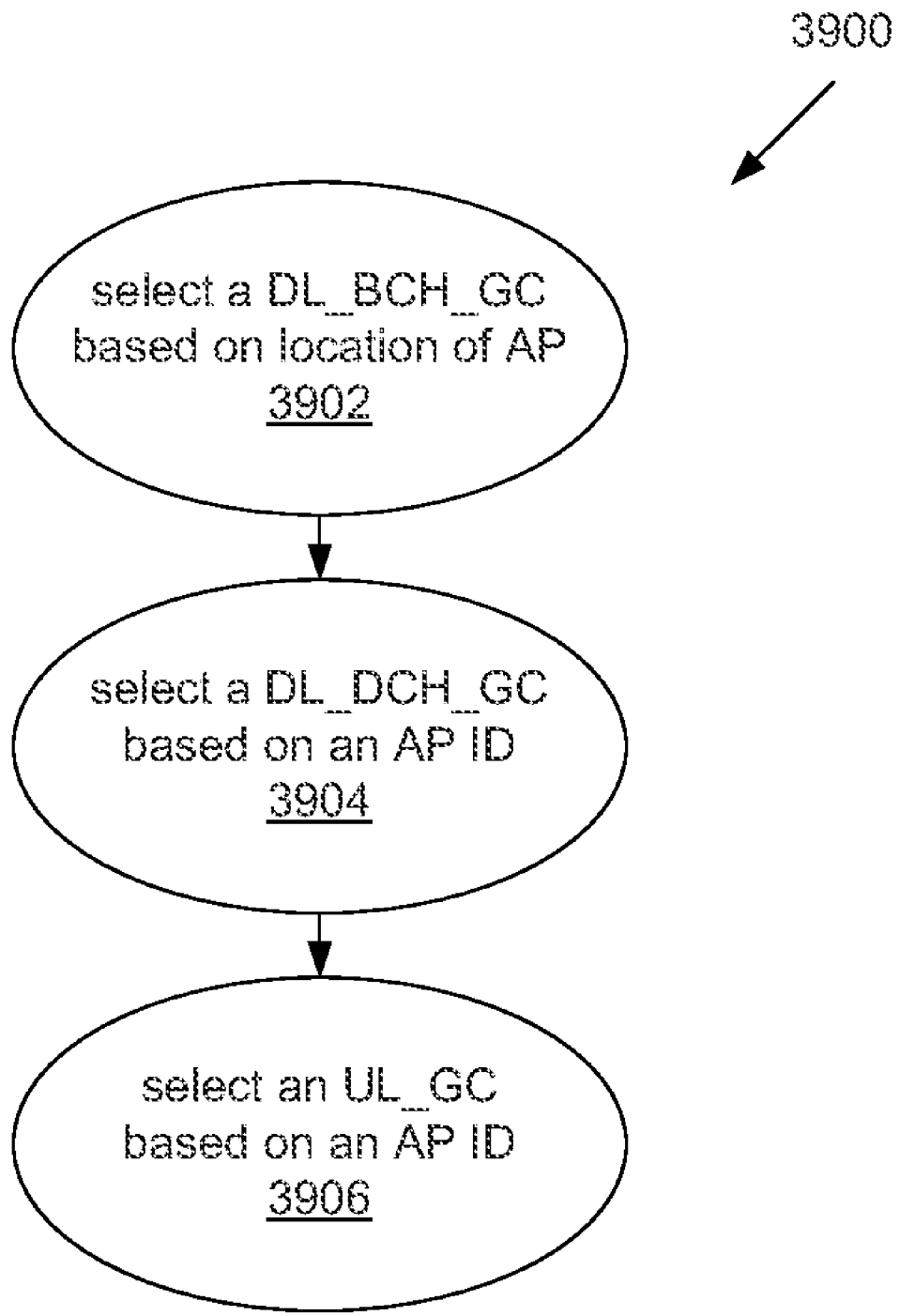
FIG. 39 is a flow diagram illustrating operations that allow an access point to configure a transmitter and a receiver.

FIG. 39 is a flow diagram 3900 illustrating operations that allow an access point to configure a transmitter and a receiver. Additional, fewer, or different operations may be performed, depending on the embodiment. An exact order of the operations may be adjusted to fit a particular application. In an operation 3902, the access point selects a downlink broadcast channel gold code based on a location of the access point. In an operation 3904, the access point selects a downlink data channel gold code based on an access point identification. The transmitter of the access point is configured to broadcast transmissions with the downlink broadcast channel gold code. The transmitter of the access point is further configured to transmit data to a node with the downlink data channel gold code. In an operation 3906, the access point selects an uplink gold code based on the access point identification. The receiver of the access point is configured to receive packets transmitted with the uplink cold code.

Generally, an access point transmits a preamble signal at 3 dB higher power than the broadcast channel or data channel as described above. However the preamble signal can be scaled in order to cause receiving nodes to operate differently. If the preamble signal is decreased, a receiving node may increase a transmit spreading factor, thus improving the probability of the receiving node may be able to communicate with the access point. Alternatively, the receiving node may perform a new search to find a different access point, as described above, thus lowering traffic congestion on a frequency that the access point observes.

Figure 40:
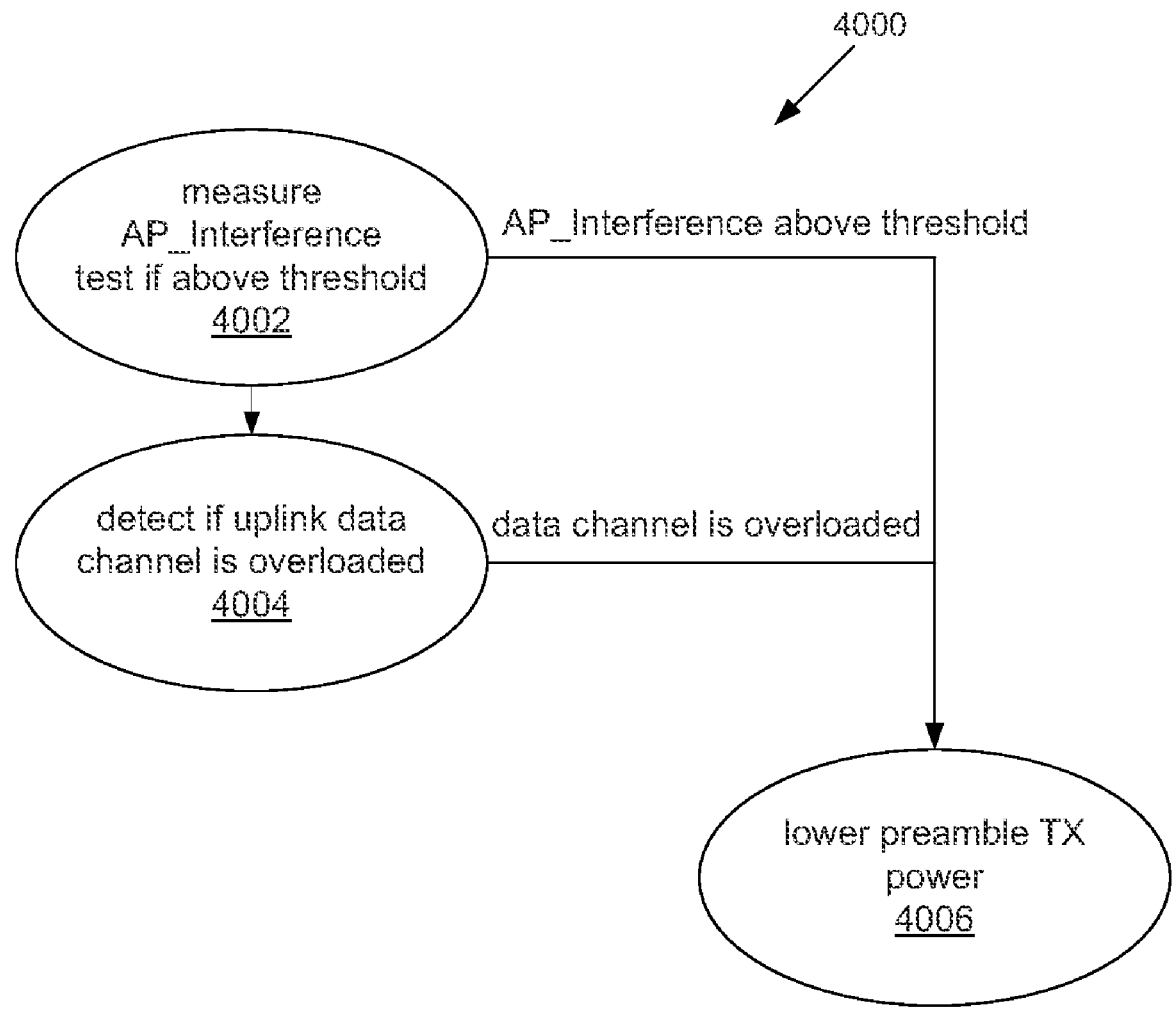
FIG. 40 is a flow diagram illustrating operations an access point performs to set a dynamic preamble transmit power.

FIG. 40 is a flow diagram 4000 illustrating operations an access point performs to set a dynamic preamble transmit power. In an operation 4002, the access point measures an access point interference signal as describe above. If the access point interference signal is below a threshold, the access point moves to an operation 4004. One possible threshold value would be measuring the access point interference signal to be above 40 dBm. If the access point interference signal is greater than or equal to the threshold, the access point moves to an operation 4006. In operation 4004, the access point detects traffic overload. The access point may detect traffic overload by measure a total utilization of an uplink data channel and determining the access point is overloaded if the total utilization is above a threshold. A possible overload threshold can be 80 percent of the uplink data channel being used for uplink traffic. If the access point detects traffic overload, the access point moves to an operation 4006. In operation 4006, the access point lowers transmission power while transmitting the preamble signal. For example, the access point may lower its transmission power by 10 dB while transmitting the preamble signal.

The access point may adapt to noisier environments that have a higher uplink margin. For example, the access point may adapt when an uplink margin is 10 dB. The access point may adapt by reducing preamble transmit power when the uplink margin is above a threshold. For example, the preamble transmit power may be reduced only when the uplink margin is above 10 dB. The threshold could be determined dynamically and adjusted at a regular period, for example, at midnight every day.

The methods described above may be implemented in a spread spectrum communication system. The methods described may be implemented on all devices of a system, including nodes, access points and any other device communicating in the system even though examples given may specify a particular device in the system. Each device of the system, including nodes, access points and any other device communicating in the system, may contain a processor, a receiver, and a transmitter. The processor may be composed of a general purpose processor or implementation specific logic circuits designed to implement methods described above. The receiver may be configured to receive spread spectrum communication that may include a random timing offset. The corresponding transmitter on communicating devices may transmit the spread spectrum communication, also possibly including the random timing offset. The processor or other controlling logic on the receiving device may then perform the operations described herein to improve reception and to improve transmission methods and power control. The processor may be directed based on software instructions stored on a computer readable medium.

The foregoing description of representative embodiments has been presented for purposes of illustration and description. It is not intended to be exhaustive or to limit the present invention to the precise form disclosed, and modifications and variations are possible in light of the above teachings or may be acquired from practice of the present invention. The embodiments were chosen and described in order to explain the principles of the present invention and its practical application to enable one skilled in the art to utilize the present invention in various embodiments and with various modifications as are suited to the particular use contemplated. The processes used in the uplink are not constrained to the uplink and may also be applied to the downlink. Similarly, the processes used in the downlink are not constrained to the downlink and may also be applied to the uplink. In addition, one or more flow diagrams were used herein. The use of flow diagrams is not intended to be limiting with respect to the order in which operations are performed.

By way of example, the following are illustrative examples of the techniques presented.

An illustrative method of compensating for information not received in a communication system is disclosed. An encoded signal is created from a source signal using a forward error correction technique. The encoded signal is split into a plurality of units. A first unit of the plurality of units is transmitted at a transmitter to a receiver through a first route. A second unit of the plurality of units is transmitted at the transmitter to the receiver through a second route.

In alternative embodiments of the method, the first route includes transmitting from a gateway to an access point with a designation to transmit the first unit to a first node.

In alternative embodiments of the method, the gateway selects the access point based on a message from the first node. In alternative embodiments of the method, the message from the first node is received at a time based on a slot start time and a random timing offset. The message from the first node is received while at least a portion of a second signal is received from a second node.

In alternative embodiments of the method, the first route includes transmitting from a node to an access point with a designation to transmit the first unit to a gateway. In alternative embodiments of the method, the node selects the access point based on a characteristic of a downlink signal received from the access point. In alternative embodiments of the method, the forward error correction technique comprises a Reed Solomon encoding technique.

In alternative embodiments of the method, which nodes of one or more nodes did not successfully decode the encoded signal is determined. A third unit of the plurality of units to the nodes of the one or more nodes that did not decode the encoded signal is transmitted.

In alternative embodiments of the method, transmission of the second unit of the plurality of units is prevented if transmission of the first unit of the plurality of units ensures decoding of the signal to a predetermined reliability level. In alternative embodiments of the method, a first unit of the plurality of units comprises a cyclic redundancy check.

An illustrative method of compensating for information not received in a communication system is disclosed. An encoded signal is created at a transmitter from a source signal using a forward error correction technique. The encoded signal is split into a plurality of units. A first unit of the plurality of units is spread. The first unit of the plurality of units is transmitted to a first receiver and a second receiver.

In alternative embodiments of the method, whether the first unit of the plurality of units should be transmitted based in part on a predetermined number of units that should be transmitted is determined. In alternative embodiments of the method, the predetermined number of units that should be transmitted is the minimum number of units needed to decode the source signal. In alternative embodiments of the method, the forward error correction technique uses a plurality of systematic symbols and a plurality of parity symbols.

In alternative embodiments of the method, whether the first unit of the plurality of units should be transmitted is determined based in part on a first received acknowledgement message from the first receiver and a second received acknowledgement message from the second receiver.

In alternative embodiments of the method, the first received acknowledgement message is received at a time based on a slot start time and a random timing offset, and further wherein the first received acknowledgement message is received while at least a portion of a second signal is received from a second node. In alternative embodiments of the method, the forward error correction technique comprises a Reed Solomon encoding technique. In alternative embodiments of the method, the source signal is a component of a code load.

An illustrative method of determining transmit power in a communication system is disclosed. A signal power of a first signal received at a node from a transmitter is determined. An access point interference signal is received from the transmitter. A transmit power is determined based in part on the access point interference signal. A second signal is transmitted from the node at the transmit power.

In alternative embodiments of the method, the first signal is spread and received with an interfering signal. In alternative embodiments of the method, the access point interference signal is based in part on an effective noise measurement and a background noise measurement.

In alternative embodiments of the method, the effective noise measurement is based on a plurality of average power measurements that are measured while no transmission is received. In alternative embodiments of the method, the effective noise measurement is based on a signal-to-noise ratio and a plurality of average power measurements that are measured while a transmission is received. In alternative embodiments of the method, the background noise measurement is determined during calibration. In alternative embodiments of the method, the access point interference signal is based in part on a margin for channel fading.

In alternative embodiments of the method, the transmit power is determined in part from the signal power. In alternative embodiments of the method, the second signal is transmitted to an access point chosen based in part on the signal power of the first signal received at the node from the transmitter and the access point interference signal. In alternative embodiments of the method, the second signal is transmitted at a time based on a slot start time and a random timing offset, and further wherein the second signal is transmitted while at least a portion of a third signal is transmitted from a second node such that both the second signal and the third signal are received.

An illustrative method of controlling power in a communication system is disclosed. A downlink signal at a receiver is correlated with a known sequence to determine a correlation metric. A power level of the downlink signal is sampled to determine a high energy metric. The correlation metric is multiplied by the high energy metric to determine a signal power. An uplink signal is transmitted at a transmit power at a transmitter wherein the transmit power is based in part on the signal power.

In alternative embodiments of the method, the correlation metric is determined in part from computing an average of a plurality of despread symbols. Each despread symbol of the plurality of despread symbols is computed in part from correlating the downlink signal with a known sequence.

In alternative embodiments of the method, the known sequence is a gold code. In alternative embodiments of the method, a first period of time where the sample of a power level overlaps with a second period of time where the downlink signal arrives at the receiver.

In alternative embodiments of the method, the downlink signal is received on a broadcast channel. In alternative embodiments of the method, the uplink signal is transmitted at a time based on a slot start time and a random timing offset. The uplink signal is transmitted while at least a portion of a second signal is transmitted from a second node such that both the uplink signal and the second signal are received.

An illustrative method of controlling power in a communication system is disclosed. A transmit spreading factor is determined based in part on a received spreading factor at a receiver. A signal spread is transmitted with the transmit spreading factor.

In alternative embodiments of the method, the transmit spreading factor is based in part on an access point interference signal wherein the access point interference signal is determined in part from an amount of power needed for an external transmitter to overcome an on-frequency interfering signal at the receiver.

In alternative embodiments of the method, the transmit spreading factor is based in part on a node interference signal.

An illustrative method of selecting an access point in a communication system is disclosed. A frame buffer is received from a first transmitter and a second transmitter at a receiver. The frame buffer contains a spread signal that is a combined signal from the first transmitter and the second transmitter. The frame buffer is despread with a first spreading code into a first frame. A first receive signal strength indicator is determined from the first frame. The frame buffer is despread with a second spreading code into a second frame. A second receive signal strength indicator is determined from the second frame.

In alternative embodiments of the method, an access point is selected based in part on the first receive signal strength indicator and the second receive signal strength indicator. The access point is selected based in part on a first received access point interference signal and a second received access point interference signal.

In alternative embodiments of the method, the first spreading code is a first gold code and the second spreading code is a second gold code. In alternative embodiments of the method, the first receive signal strength indicator is based on a signal-to-noise ratio determined while despreading the frame buffer with the first spreading code and a total power measurement measured over a period of time where the frame buffer is received.

In alternative embodiments of the method, the first transmitter and the second transmitter are synchronized by an outside time source. Variations in timing of the first transmitter and the second transmitter are compensated for by despreading the frame buffer with the first spreading code at a plurality of chip offsets.

An illustrative method of adapting to system changes in a communication system is disclosed. A noise signal is measured on a receive frequency. A spreading code and a transmit frequency is selected based in part on the measured noise signal. A signal spread with the selected spreading code is transmitted at the transmit frequency.

In alternative embodiments of the method, a second noise signal is measured on a second frequency. In alternative embodiments of the method, the spreading code is a gold code.

An illustrative method of handover processing is disclosed. A roaming list is configured with a plurality of receive parameters. A measurement operation on a current entry of the roaming list is performed. The measurement operation sets a receiver based on the current entry, measures an RSSI metric at the receiver, and records the RSSI metric. The measurement operation is repeated for each entry of the roaming list. An entry of the roaming list is selected based in part on a greatest RSSI metric. The receiver is set based on the selected entry of the roaming list.

In alternative embodiments of the method, an entry of the roaming list includes a center frequency and a gold code. In alternative embodiments of the method, the roaming list is received by the receiver during a prior transmission. In alternative embodiments of the method, the roaming list is received by the receiver at a particular prearranged time. In alternative embodiments of the method, the roaming list is received by the receiver at a particular prearranged frequency and at a particular prearranged gold code.

In alternative embodiments of the method, the RSSI metric is based in part on a downlink RSSI measurement minus an access point interference signal.

In alternative embodiments of the method, the measurement operation further includes recording a frequency estimate and a timing estimate into the roaming list based on a successful demodulation of a broadcast channel. The receiver is set based on a recorded frequency estimate and a recorded timing estimate. The selected entry is moved to the end of the priority list. The measurement operation is repeated for each entry in the priority list. A second entry of the priority list is selected based in part on a greatest RSSI metric. The receiver is set based on the selected second entry of the roaming list.

In alternative embodiments of the method, the roaming list is ordered into a priority list based on previously iterations of the measurement operation. In alternative embodiments of the method, repeating the measurement operation for each entry of the roaming list is interrupted when a threshold RSSI metric is detected.

An illustrative method of providing synchronization in a communication system is disclosed. A first value and a first time stamp is received at a device from a first node. The first time stamp is based on a transmission from a remote timing source. A second value and a second time stamp is received at a device from a second node. The second time stamp is based on the transmission from the remote timing source. A relationship between the first value and the second value is determined based on the first time stamp and the second time stamp. In alternative embodiments of the method, the remote timing source is a GPS. In alternative embodiments of the method, a TXCO is synchronized with the remote timing source.

In alternative embodiments of the method, the first value and the first time stamp are received at a time based on a slot start time and a random timing offset. The first value and the first time stamp are received while at least a portion of a signal is received from a third node.

An illustrative method of improving error detection in a communication system is disclosed. A signal is received from a transmitter at a receiver. The received signal contains a data portion and a cyclic redundancy check (CRC). The CRC is computed in part from a transmitter identification code. It is determined if the CRC matches both the data portion and the transmitter identification code of the transmitter. The received signal is discarded if the CRC does not match both the data portion and the transmitter identification code of the transmitter.

In alternative embodiments of the method, the received signal is spread with a gold code that is specific to the transmitter. The CRC is computed in part from the gold code. The received signal is discarded if the CRC received at the receiver does not match the gold code.

An illustrative method of improving error detection in a communication system is disclosed. A signal is received from a transmitter at a receiver wherein the signal contains a data portion and a cyclic redundancy check (CRC). A noncoherent energy metric is measured for the signal. The signal is discarded if the CRC matches the data portion but the noncoherent energy metric is below a threshold value.

An illustrative method of configuring an access point in a communication system is disclosed. A downlink broadcast channel gold code based on a location of an access point is selected. A downlink data channel gold code based on an access point identification is selected. An uplink gold code based on the access point identification is selected.

An illustrative method of configuring a node in a communication system is disclosed. An access point identification on a broadcast channel is received. A downlink data channel gold code based on the access point identification is selected. An uplink gold code based on the access point identification is selected.

In alternative embodiments of the method of configuring a node in a communication system, a data message is transmitted and spread with the uplink gold code. In alternative embodiments of the method, a data message is received and spread with the downlink data channel gold code.

In alternative embodiments of the method, that a data message corresponds to the access point identification is verified by computing a cyclic redundancy check on the data message using the access point identification as a seed to the cyclic redundancy check.

In alternative embodiments of the method, the access point identification is received in a message spread with a downlink broadcast gold code. The downlink broadcast gold code is selected based on a frequency to which a receiver is tuned.

What is claimed is:

1. A method of determining transmit power in a communication system, the method comprising:

receiving an access point interference signal from a transmitter wherein the access point interference signal is based in part on an interference from an external system;

determining a transmit power based in part on the access point interference signal; and transmitting an uplink signal from a node at the transmit power, wherein the uplink signal is transmitted at a first time based on a slot start time and a first random timing offset, wherein the uplink signal is transmitted while at least a portion of a second signal is transmitted from a second node such that both the uplink signal and the second signal are received, and wherein the second signal is transmitted at a second time based on the slot time and a second random timing offset.

2. The method of claim 1, wherein the access point interference signal is based in part on an effective noise measurement and a background noise measurement.

3. The method of claim 2, wherein the effective noise measurement is based on a plurality of average power measurements that are measured while no transmission is received.

4. The method of claim 2, wherein the effective noise measurement is based on a signal-to-noise ratio and a plurality of average power measurements that are measured while a transmission is received.

5. The method of claim 2, wherein the background noise measurement is determined during calibration.

6. The method of claim 2, wherein the access point interference signal is based in part on a margin for channel fading.

7. The method of claim 1, further comprising measuring a signal power of a downlink signal received at the node from the transmitter, wherein the transmit power is determined in part from the signal power.

8. The method of claim 7, wherein the downlink signal is spread and wherein the downlink signal is received with an interfering signal.

9. The method of claim 1, further comprising measuring a signal power of a downlink signal received at the node from the transmitter, wherein the uplink signal is transmitted to an access point chosen based in part on the signal power and the access point interference signal.

10. A node comprising:

a processor;

a receiver operatively coupled to the processor and configured to:

receive an access point interference signal from a downlink transmitter wherein the access point interference signal is based in part on an interference from an external system; and a transmitter operatively coupled to the processor and configured to:

transmit an uplink signal from the node at a transmit power based in part on the access point interference signal, wherein the uplink signal is transmitted at a first time based on a slot start time and a first random timing offset, wherein the uplink signal is transmitted while at least a portion of a second signal is transmitted from a second node such that both the uplink signal and the second signal are received, and wherein the second signal is transmitted at a second time based on the slot time and a second random timing offset.

11. The node of claim 10, wherein the access point interference signal is based in part on an effective noise measurement and a background noise measurement.

12. The node of claim 10, wherein the receiver is further configured to measure a signal power of a downlink signal received from the downlink transmitter, and wherein the transmit power is determined in part from the signal power.

13. The node of claim 12, wherein the downlink signal is spread and wherein the downlink signal is received with an interfering signal.

14. The node of claim 10, wherein the uplink signal is transmitted to an access point chosen based in part on a signal power of a downlink signal received at the node from the downlink transmitter and the access point interference signal.

15. A system comprising:

an access point comprising a downlink transmitter; and a node comprising:

a processor;

a receiver operatively coupled to the processor and configured to:

receive an access point interference signal from the downlink transmitter wherein the access point interference signal is based in part on an interference from an external system; and a transmitter operatively coupled to the processor and configured to:

transmit an uplink signal from the node to the access point at a transmit power based in part on the access point interference signal, wherein the uplink signal is transmitted at a first time based on a slot start time and a first random timing offset, wherein the uplink signal is transmitted while at least a portion of a second signal is transmitted from a second node such that both the uplink signal and the second signal are received, and wherein the second signal is transmitted at a second time based on the slot time and a second random timing offset.

16. The system of claim 15, wherein the access point interference signal is based in part on an effective noise measurement and a background noise measurement.

17. The system of claim 15, wherein the receiver is further configured to measure a signal power of a downlink signal received from the downlink transmitter, and wherein the transmit power is determined in part from the signal power.

18. The system of claim 17, wherein the downlink signal is spread and wherein the downlink signal is received with an interfering signal.

19. The system of claim 15, wherein the uplink signal is transmitted to the access point chosen based in part on a signal power of a downlink signal received at the node from the downlink transmitter and the access point interference signal.

20. The system of claim 16, wherein the access point interference signal is based in part on a margin for channel fading.

* * * * *